(12) United States Patent
Tanaka et al.

(10) Patent No.: US 10,043,872 B2
(45) Date of Patent: Aug. 7, 2018

(54) SEMICONDUCTOR DEVICE

(71) Applicant: FUJI ELECTRIC CO., LTD., Kawasaki (JP)

(72) Inventors: Takahide Tanaka, Matsumoto (JP); Masaharu Yamaji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/065,206

(22) Filed: Mar. 9, 2016

(65) Prior Publication Data
US 2016/0300912 A1    Oct. 13, 2016

(30) Foreign Application Priority Data
Apr. 8, 2015  (JP) .................................. 2015-079213

(51) Int. Cl.
| H01L 29/40 | (2006.01) |
| H01L 29/10 | (2006.01) |
| H01L 29/417 | (2006.01) |
| H01L 29/78 | (2006.01) |
| H01L 29/739 | (2006.01) |
| H01L 29/772 | (2006.01) |
| H01L 29/06 | (2006.01) |
| H01L 23/522 | (2006.01) |
| H01L 27/08 | (2006.01) |
| H01L 49/02 | (2006.01) |
| H01L 23/532 | (2006.01) |

(52) U.S. Cl.
CPC ........ *H01L 29/405* (2013.01); *H01L 23/5228* (2013.01); *H01L 27/0802* (2013.01); *H01L 28/20* (2013.01); *H01L 29/0649* (2013.01); *H01L 29/0692* (2013.01); *H01L 29/1079* (2013.01); *H01L 29/1095* (2013.01); *H01L 29/404* (2013.01); *H01L 29/41758* (2013.01); *H01L 29/7393* (2013.01); *H01L 29/7722* (2013.01); *H01L 29/7823* (2013.01); *H01L 23/53219* (2013.01)

(58) Field of Classification Search
CPC ......................... H01L 29/405; H01L 23/5228; H01L 27/0802
See application file for complete search history.

(56) References Cited

U.S. PATENT DOCUMENTS

| 7,709,925 B2* | 5/2010 | Takahashi | ........... H01L 29/7397 257/370 |
| 2003/0052329 A1* | 3/2003 | Kobayashi | .......... H01L 29/0619 257/135 |
| 2007/0013022 A1* | 1/2007 | Shimizu | .................. H01L 21/84 257/500 |
| 2008/0203496 A1* | 8/2008 | Takahashi | ............. H01L 29/404 257/409 |

FOREIGN PATENT DOCUMENTS

| JP | 4-332173 | 11/1992 |
| JP | 2003-8009 | 1/2003 |
| JP | 2013-187240 | 9/2013 |

* cited by examiner

Primary Examiner — Errol Fernandes

(57) ABSTRACT

A semiconductor device includes a resistive element wherein a diffusion resistance region provided in an upper portion of a semiconductor base and a thin film resistance layer isolated and distanced from the semiconductor base and diffusion resistance region across an insulating film are alternately connected in series and alternately disposed in parallel.

21 Claims, 39 Drawing Sheets

SEMICONDUCTOR DEVICE

CROSS-REFERENCE TO RELATED APPLICATIONS

This application claims benefit of foreign priority to Japanese Application 2015-079213 filed on Apr. 8, 2015, in the Japanese Patent Office, the disclosure of which is incorporated herein by reference.

BACKGROUND

1. Field

The present disclosure relates to a semiconductor device, and in particular, relates to technology effective when applied to a semiconductor device including a high-resistance resistive element.

2. Related Art

A power device such as an insulated gate bipolar transistor (IGBT) or power MOSFET is utilized in many fields, such as a motor controlling inverter, a power supply application of a flat panel display (FPD) such as a large capacity plasma display (PDP) or liquid crystal panel, or an inverter for a household electrical appliance such as an air conditioner or lighting.

A high voltage integrated circuit is used in the drive and control of this kind of power device. In recent years, owing to the advances in large scale integrated circuit (LSI) technology, high voltage integrated circuits of breakdown voltage classes from 100V to 1,200V, used in power supplies from consumer power supplies of 100V and 200V AC to commercial power supplies of 400V AC and the like, have been put to practical use.

A resistive element formed of a highly resistive polysilicon film is often included as a multiple floating field plate (MFFP) or resistive field plate (RFP) in a voltage withstanding structure portion of a place bearing breakdown voltage in a high voltage integrated circuit. As the capacitive field plate or resistive field plate has a function of relaxing electrical field concentration in a depletion layer of a semiconductor surface, high breakdown voltage can be stably secured.

Various structures of this kind of field plate have been reported. For example, a field plate structure wherein a resistive field plate is formed utilizing a diffusion region of a semiconductor layer surface, rather than the resistive field plate being formed of a thin film resistance layer, is disclosed in Patent Literature ("PTL") 1 (J-PA-2013-187240). Also, a field plate structure wherein a spiral groove is provided in a semiconductor layer, and a resistive field plate formed of a thin film resistance layer is embedded across an insulating film in the spiral groove, is disclosed in PTL 2 (J-PA-1992-332173). Also, a two-layer field plate structure, wherein a resistive field plate is formed of metal layers of concentric circle form and a thin film resistance layer connecting the metal layers, is disclosed in PTL 3 (J-PA-2003-008009).

Herein, when providing a resistive field plate in the voltage withstanding structure portion of a high voltage integrated circuit, the coercive force of the potential with respect to the depletion layer of the semiconductor layer surface is strong, and reliability is high compared with that of a capacitive field plate, but the leakage current when a high voltage is applied is from several microamps to several tens of microamps, which is large compared with that of a capacitive field plate. The leakage current being large means that the leakage current from a high voltage terminal to a ground terminal in the high voltage integrated circuit is large, and the power consumption of the integrated circuit increases. Therefore, a reduction in leakage current is demanded when using a resistive field plate in the high voltage withstanding structure portion.

In order to reduce the leakage current, it is sufficient to increase the total resistance value by simply increasing the number of turns of the resistive field plate, thus increasing the effective length. However, an existing resistive field plate is such that the planar size increases in accordance with the number of turns, together with which the semiconductor chip, that is, the high voltage integrated circuit, also increases in size, because of which the chip acquisition rate obtainable from one semiconductor wafer decreases, and cost increases.

Therefore, the inventors have contrived the disclosure focusing on an existing resistive field plate being configured of only a thin film resistance layer or a diffusion resistance region.

SUMMARY

An object of the disclosure is to provide technology such that an increase in the resistance of a resistive element can be achieved while restricting an increase in size of a semiconductor device.

In order to achieve the heretofore described object, a semiconductor device according to one aspect of the disclosure includes a resistive element wherein a diffusion resistance region provided in an upper portion of a semiconductor base and a thin film resistance layer isolated and distanced from the semiconductor base and diffusion resistance region across an insulating film are alternately connected in series and alternately disposed in parallel.

The heretofore described and other objects, and novel characteristics, of the disclosure will be clear from the description in the specification and from the attached drawings.

According to the disclosure, an increase in the resistance of a resistive element can be achieved while restricting an increase in size of a semiconductor device.

BRIEF DESCRIPTION OF THE DRAWINGS

These and/or others aspects and advantages will become apparent and more readily appreciated from the following description of the embodiments, taken in conjunction with the accompanying drawings of which.

DETAILED DESCRIPTION

Figure 1:
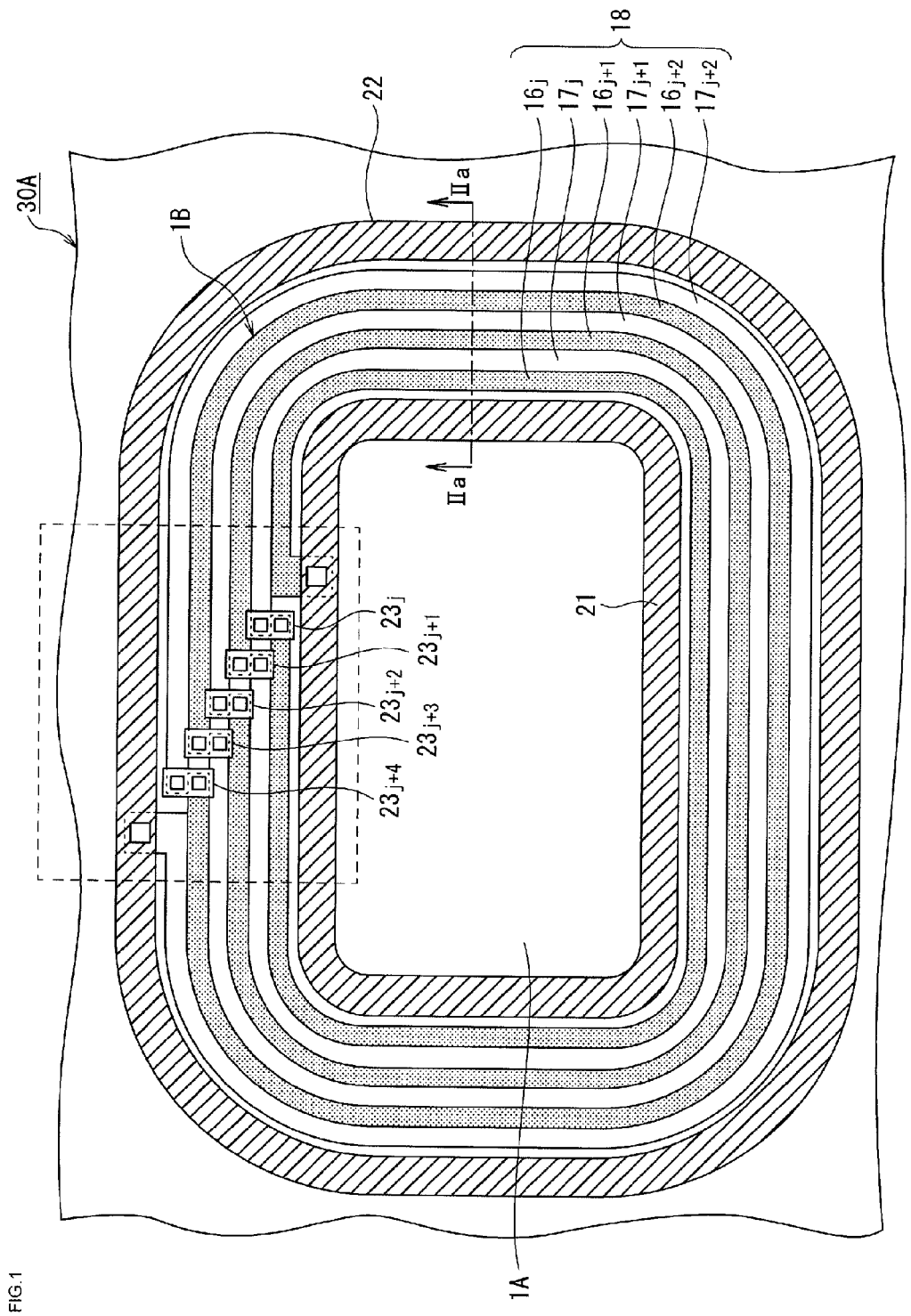
FIG. 1 is a main portion plan view showing a schematic configuration of a semiconductor device according to a first embodiment of the disclosure.

Hereafter, a semiconductor device according to first through sixth embodiments of the disclosure will be described.

In the specification, "first main electrode region" means a region that forms either a source region or drain region in a field effect transistor (FET) or static induction transistor (SIT). "First main electrode region" means a region that forms either an emitter region or collector region in an IGBT, and a region that forms either an anode region or cathode region in a static induction thyristor (SI thyristor), gate turn-off thyristor (GTO), or diode. "Second main electrode region" means the region of the source region and drain region that does not form the first main electrode region in an FET or SIT, the region of the emitter region and collector region that does not form the first main electrode region in an IGBT, and the region of the anode region and cathode region that does not form the first main electrode region in an SI thyristor, GTO, or diode. In the following first through sixth embodiments, a high breakdown voltage MOSFET and high breakdown voltage diode are described as examples of a high breakdown voltage active element, but the high breakdown voltage active element is, of course, not limited to a high breakdown voltage MOSFET or high breakdown voltage diode.

Also, "main electrode terminal" means an electrode terminal connected to one of the first main electrode region and second main electrode region. More specifically, when "an electrode terminal connected to one" is defined as a "first main electrode terminal", "an electrode terminal connected to the other" is a "second main electrode terminal".

In the following description of the first through sixth embodiments, a case wherein a first conductivity type is p-type and a second conductivity type is n-type is described as an example, but the conductivity types may also be selected in a reverse relationship, wherein the first conductivity type is n-type and the second conductivity type is p-type. Also, a layer or region being prefixed with n or p in the specification and attached drawings means that electrons or holes respectively are majority carriers. Also, + or − added as superscript to n or p indicates a semiconductor region in which the impurity concentration is relatively high or low respectively compared with a semiconductor region for which neither + nor − is added. Furthermore, the definitions of "upper" and "lower" in "upper surface", "lower surface" and the like in the following description is merely a problem of expression in a sectional view shown in a drawing. For example, the terms "upper" and "lower" become "left" and "right" when observing after changing the orientation of the semiconductor device by 90°, and when observing after changing by 180°, the relationship between the terms "upper" and "lower" is, of course, reversed.

The same reference signs are given to the same configurations in the following descriptions of the first through sixth embodiments and in the attached drawings, and redundant descriptions are omitted. Also, in order to be more easily viewed or more easily understood, the attached drawings described in the first through sixth embodiments are not drawn to an accurate scale or dimensional ratio. Provided that the scope of the disclosure is not exceeded, the invention is not limited to the details of the first through sixth embodiments described below.

First Embodiment

Figure 3:
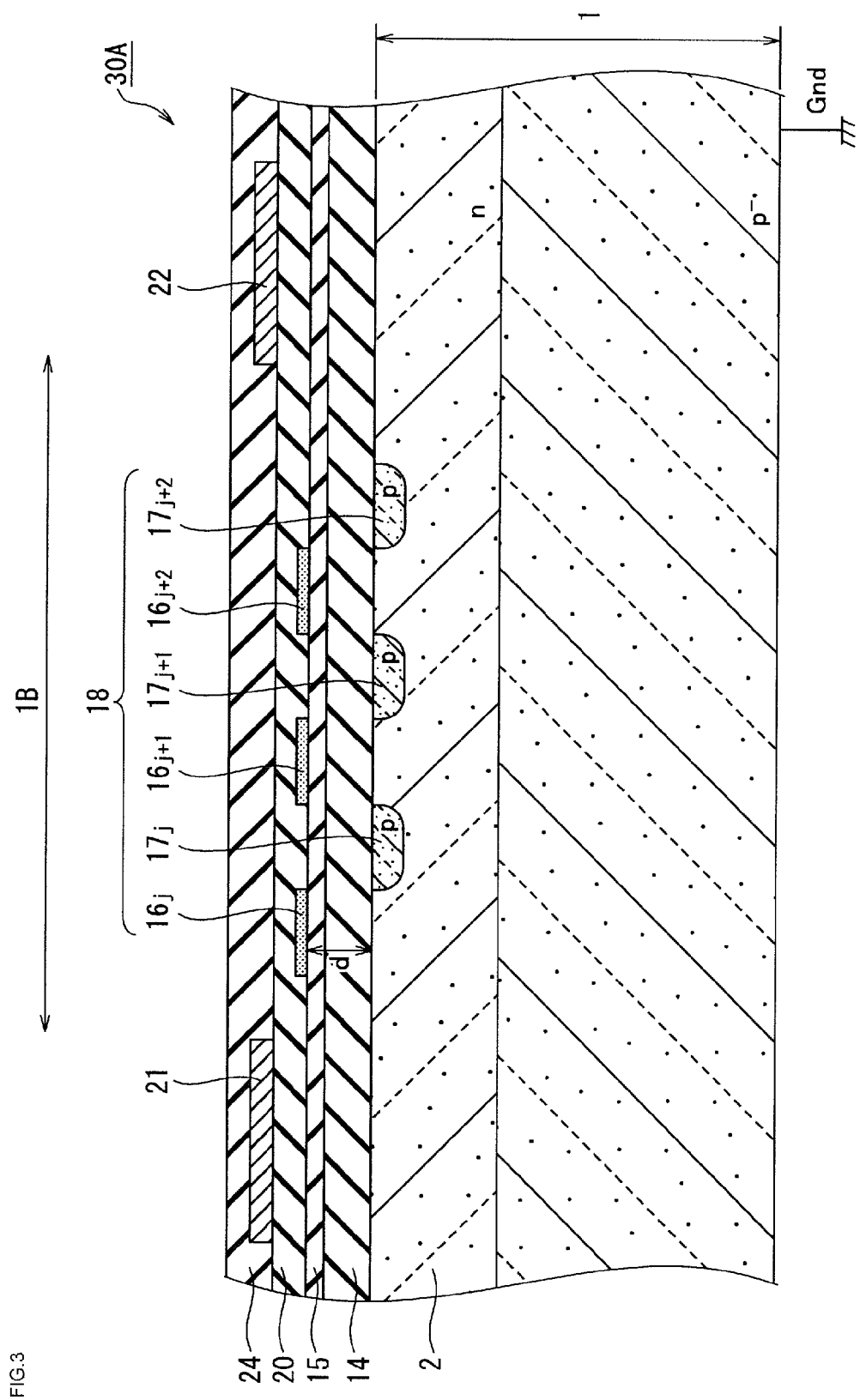
FIG. 3 is a main portion sectional view showing a sectional structure along a IIa-IIa line of FIG. 1.

As shown in FIG. 3, a semiconductor device 30A according to the first embodiment of the disclosure includes a semiconductor base 1, and a resistive element 18 provided as a resistive field plate on the upper surface side of the semiconductor base 1. The semiconductor base 1 is formed of a first conductivity type (p⁻-type) semiconductor substrate formed of, for example, monocrystalline silicon.

Also, the semiconductor device 30A according to the first embodiment includes a second conductivity type (n-type) well region 2 provided in an upper portion of the semiconductor base 1. Also, the semiconductor device 30A according to the first embodiment includes a field insulating film 14 provided on the upper surface of the semiconductor base 1, an interlayer dielectric 15 provided on the field insulating film 14, and an interlayer dielectric 20 provided on the interlayer dielectric 15. Also, the semiconductor device 30A according to the first embodiment includes a first main electrode terminal 21 and second main electrode terminal 22 provided across, for example, the field insulating film 14, interlayer dielectric 15, and interlayer dielectric 20 as insulating films on the upper surface of the semiconductor base 1.

As shown in FIG. 1, the first main electrode terminal 21 and second main electrode terminal 22 are each configured in a ring-form planar pattern extending in an annular form so as to enclose a circuit formation region 1A of the upper surface of the semiconductor base 1. The second main electrode terminal 22 is disposed distanced from the first main electrode terminal 21 in a position enclosing the first main electrode terminal 21 above the upper surface of the semiconductor base 1.

The field insulating film 14 is formed of a silicon dioxide ($SiO_2$) film using, for example, a selective oxidation method. The field insulating film 14 has an aperture portion 14d shown in FIG. 5, an aperture portion 14e shown in FIG. 6, an aperture portion 14h shown in FIG. 7, an aperture portion 14i shown in FIG. 8, an aperture portion 14m shown in FIG. 9, and an aperture portion 14b shown in FIG. 10. Each of the interlayer dielectric 15 and interlayer dielectric 20 is formed of a $SiO_2$ film using, for example, a chemical vapor deposition (CVD) method. Each of the first main electrode terminal 21 and second main electrode terminal 22 is formed of, for example, an aluminum (Al) film, or an aluminum alloy film of aluminum-silicon (Al—Si), aluminum-copper (Al—Cu), aluminum-copper-silicon (Al—Cu—Si), or the like.

As shown in FIG. 3, a protective film 24 is provided so as to cover the first main electrode terminal 21 and second main electrode terminal 22 on the interlayer dielectric 20. The protective film 24 is formed of, for example, a polyimide series insulating resin film.

Figure 2:
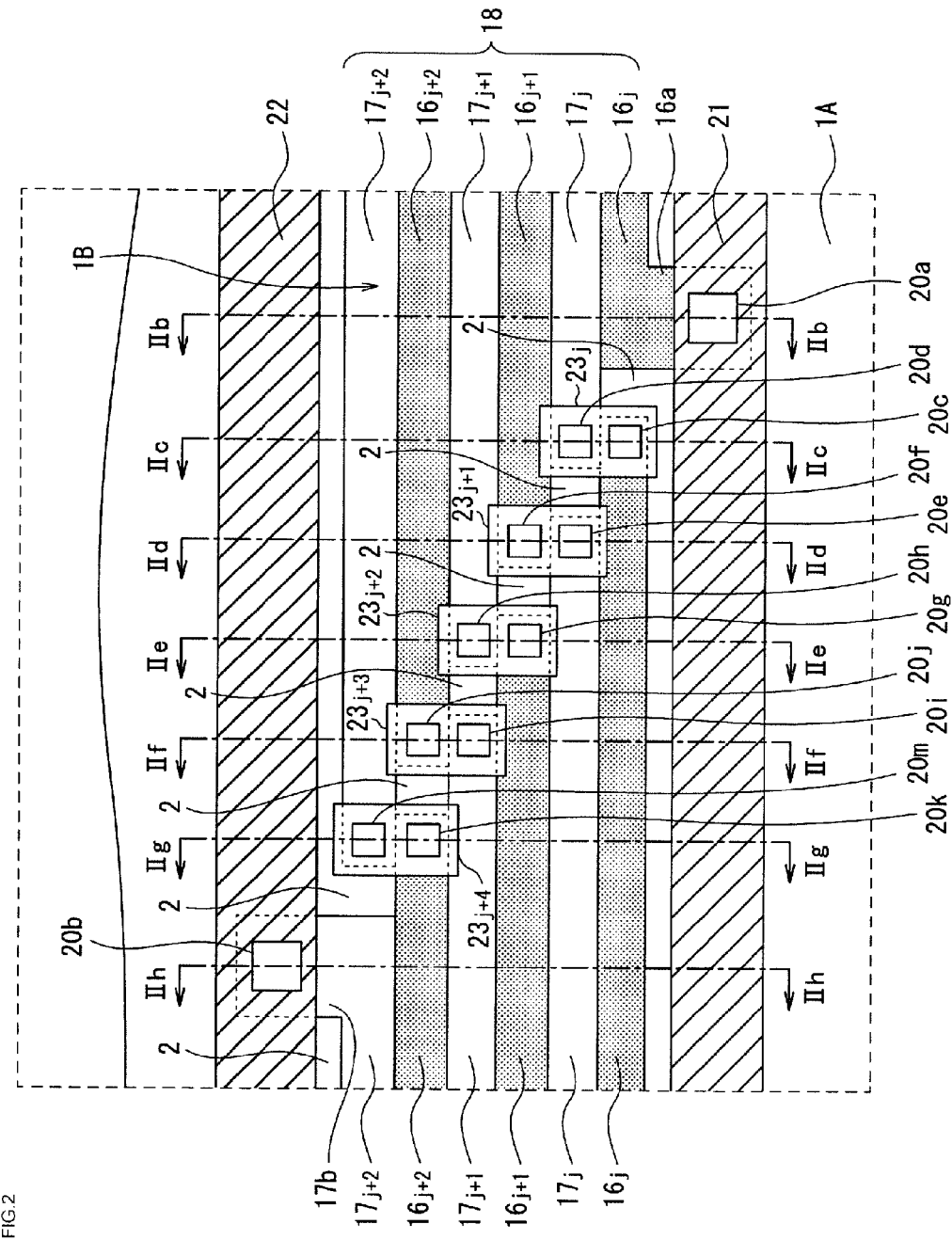
FIG. 2 is an enlarged plan view wherein the region enclosed by dotted lines in FIG. 1 is enlarged.

As shown in FIGS. 1 through 3, the resistive element 18 is disposed in a projection region 1B, which is between the first main electrode terminal 21 and second main electrode terminal 22 when seen from a direction perpendicular to the upper surface of the semiconductor base 1. Although not limited to the quantity shown in FIGS. 1 through 3, the resistive element 18 is of a configuration wherein, for example, three thin film resistance layers $16_j$, $16_{j+1}$, and $16_{j+2}$ and three first conductivity type (p-type) diffusion resistance regions $17_j$, $17_{j+1}$, and $17_{j+2}$ are alternately and continuously connected one by one in series.

As shown in FIG. 3, the diffusion resistance regions $17_j$, $17_{j+1}$, and $17_{j+2}$ are provided in an upper portion of the semiconductor base 1. The diffusion resistance regions $17_j$, $17_{j+1}$, and $17_{j+2}$ are disposed in the interior of the well region 2 provided in an upper portion of the semiconductor base 1 in the first embodiment. The well region 2 is disposed in at least the projection region 1B, and in the first embodiment, the well region 2 is also disposed immediately below each of the first main electrode terminal 21 and second main electrode terminal 22. The well region 2 configures a voltage withstanding structure portion that bears breakdown voltage in the projection region 1B.

As shown in FIG. 3, the thin film resistance layers $16_j$, $16_{j+1}$, and $16_{j+2}$ are isolated and distanced from the semiconductor base 1 and diffusion resistance regions $17_j$, $17_{j+1}$, and $17_{j+2}$ above the upper surface of the semiconductor base 1 across, for example, the field insulating film 14 and interlayer dielectric 15 acting as insulating films. That is, the thin film resistance layers $16_j$, $16_{j+1}$, and $16_{j+2}$ and diffusion resistance regions $17_j$, $17_{j+1}$, and $17_{j+2}$ are configured in mutually differing layers.

As shown in FIG. 1, the resistive element 18 is configured in a planar pattern that continuously loops around in spiral form so as to enclose the first main electrode terminal 21 in the projection region 1B. Also, the resistive element 18 is of a configuration such that the three thin film resistance layers $16_j$, $16_{j+1}$, and $16_{j+2}$ and three diffusion resistance regions $17_j$, $17_{j+1}$, and $17_{j+2}$ interchange one by one every loop. That is, the resistive element 18 is configured in a planar pattern wherein the three thin film resistance layers $16_j$, $16_{j+1}$, and $16_{j+2}$ and three diffusion resistance regions $17_j$, $17_{j+1}$, and $17_{j+2}$ are alternately disposed one by one in parallel from the first main electrode terminal 21 side toward the second main electrode terminal 22 side. In the first embodiment, there is a series connection and parallel disposition wherein the thin film resistance layer $16_j$ is positioned first counting from the first main electrode terminal 21 side, and the diffusion resistance region $17_{j+2}$ is positioned last. Therefore, the thin film resistance layer $16_j$ is positioned on the path of the first loop, the diffusion resistance region $17_j$ is positioned on the path of the second loop, and thereafter, the thin film resistance layers $16_{j+1}$ and $16_{j+2}$ and the diffusion resistance regions $17_{j+1}$ and $17_{j+2}$ are alternately positioned one by one on the paths of the third through sixth loops. Although not limited to this planar pattern, each of the three thin film resistance layers $16_j$, $16_{j+1}$, and $16_{j+2}$ and three diffusion resistance regions $17_j$, $17_{j+1}$, and $17_{j+2}$ extends individually on each loop path so as to enclose the central circuit formation region 1A.

In the first embodiment, there is a series connection and parallel disposition wherein the thin film resistance layer $16_j$ is positioned first counting from the first main electrode terminal 21 side, and the diffusion resistance region $17_{j+2}$ is positioned last, but there is no objection to the diffusion resistance region $17_j$ being positioned first and the thin film resistance layer $16_{j+2}$ being positioned last. Also, in the first embodiment, there are the same number of thin film resistance layers and diffusion resistance regions, but there is no objection to there being one more of either thin film resistance layers or diffusion resistance regions than of the other. In this case, a thin film resistance layer or diffusion resistance region is disposed both first and last.

Figure 4:
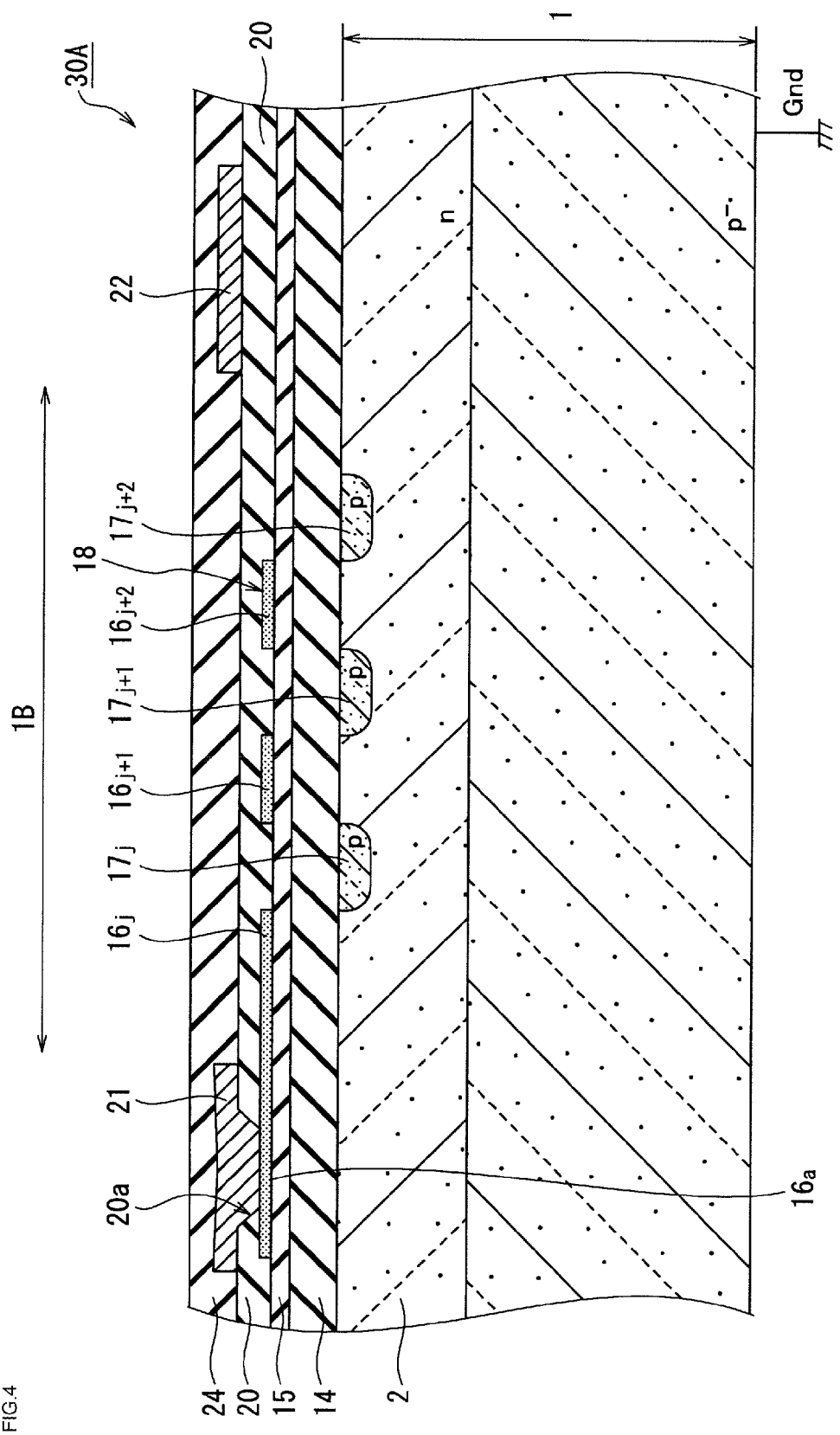
FIG. 4 is a main portion sectional view showing a sectional structure along a IIb-IIb line of FIG. 2.

As shown in FIG. 2, one end side and the other end side of the thin film resistance layer $16_j$ of the first loop are disposed so as to oppose each other at a predetermined interval on the same loop path. As shown in FIGS. 2 and 4, a drawn-out portion 16a drawn out from the first loop path is provided so as to overlap with one portion of the first main electrode terminal 21 on the one end side of the thin film resistance layer 16$_j$ of the first loop. As shown in FIGS. 2 and 4, the one portion of the first main electrode terminal 21 is electrically and metallurgically connected to a contact portion of the drawn-out portion 16*a* via a contact hole 20*a* penetrating the interlayer dielectric 20.

Figure 5:
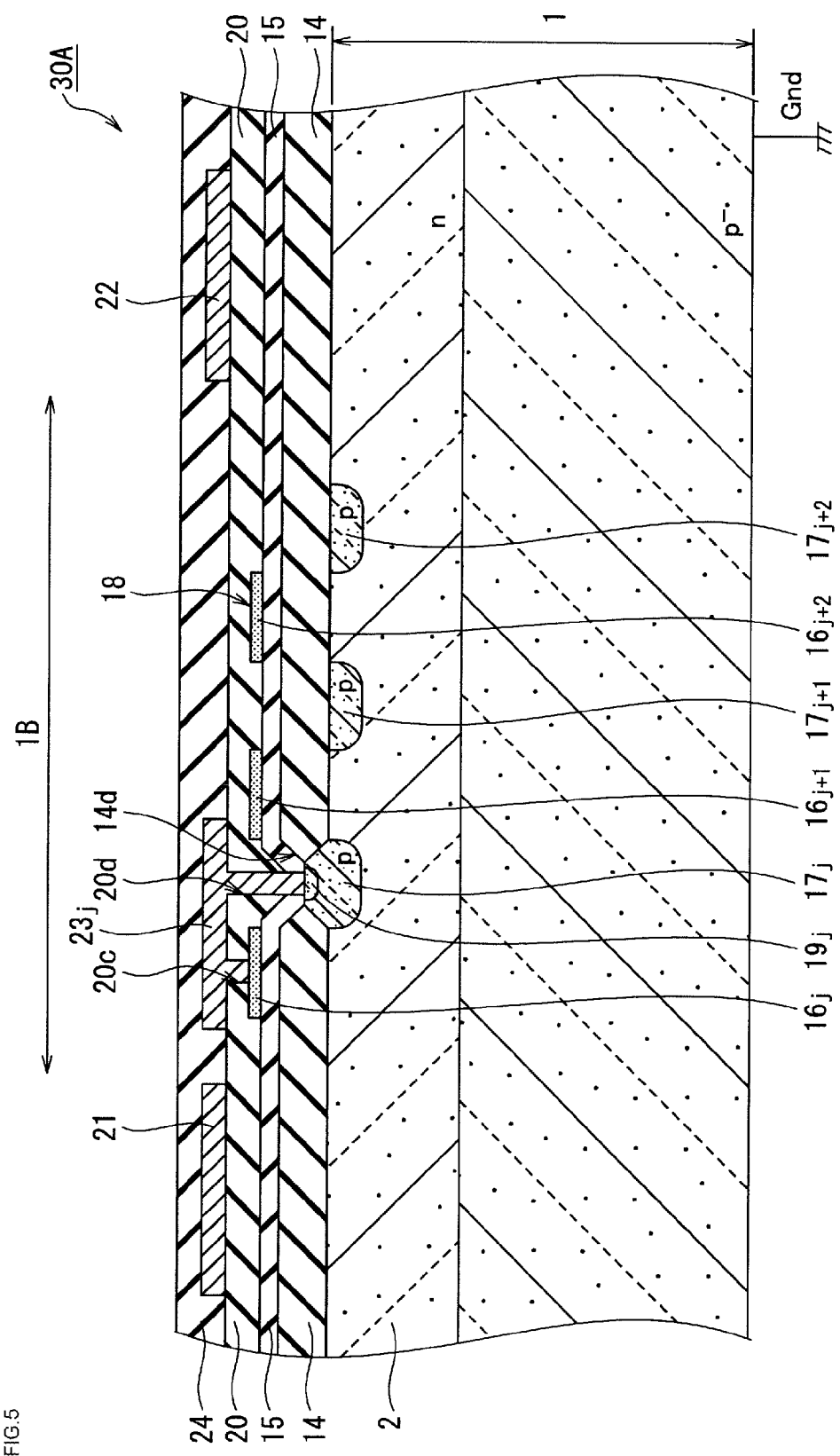
FIG. 5 is a main portion sectional view showing a sectional structure along a IIc-IIc line of FIG. 2.

As shown in FIGS. 2 and 5, one end side of a first relay wire 23$_j$ is electrically and metallurgically connected to the other end side of the thin film resistance layer 16$_j$ of the first loop through a contact hole 20*c* penetrating the interlayer dielectric 20. The first relay wire 23$_j$ is formed in the same layer as, for example, the first main electrode terminal 21.

As shown in FIG. 2, one end side and the other end side of the diffusion resistance region 17$_j$ of the second loop are disposed so as to oppose each other at a predetermined interval on the same loop path. As shown in FIG. 5, a first conductivity type (p$^+$-type) ohmic contact region 19$_j$ is selectively provided in the aperture portion 14*d* of the field insulating film 14 in the interior of the one end side of the diffusion resistance region 17$_j$ of the second loop. As shown in FIGS. 2 and 5, the other end side of the first relay wire 23$_j$ is electrically and metallurgically connected to the ohmic contact region 19$_j$, through a contact hole 20*d* penetrating the interlayer dielectric 20 and interlayer dielectric 15$_j$ so as to form low ohmic contact resistance.

Figure 6:
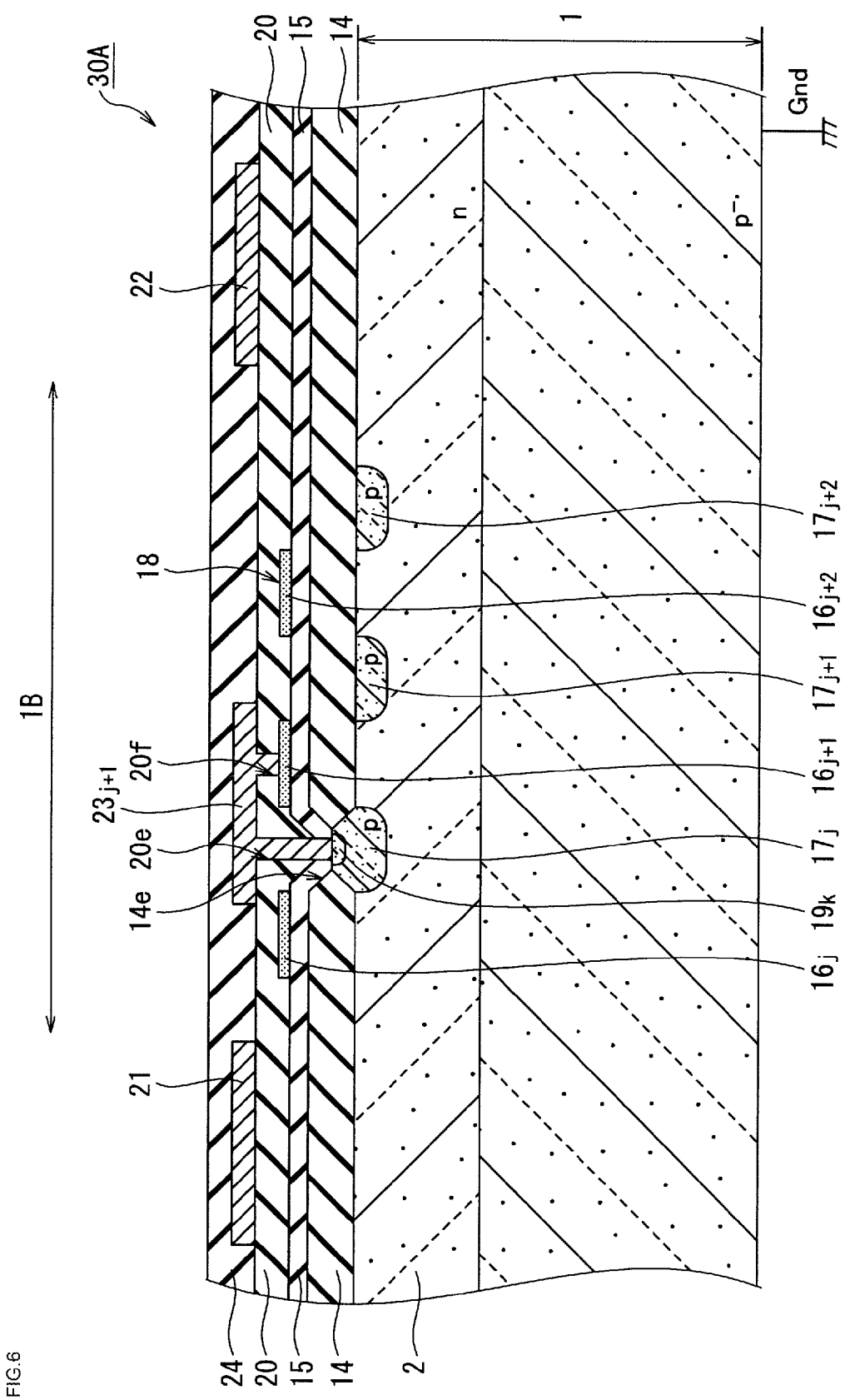
FIG. 6 is a main portion sectional view showing a sectional structure along a IId-IId line of FIG. 2.

As shown in FIG. 6, a p$^+$-type ohmic contact region 19$_k$ is selectively provided in the aperture portion 14*e* of the field insulating film 14 in the interior of the other end side of the diffusion resistance region 17$_j$ of the second loop. As shown in FIGS. 2 and 6, one end side of a second relay wire 23$_{j+1}$ is electrically and metallurgically connected to the ohmic contact region 19$_k$, through a contact hole 20*e* penetrating the interlayer dielectric 20 and interlayer dielectric 15$_j$ so as to form low ohmic contact resistance. The second relay wire 23$_{j+1}$ is formed in the same layer as, for example, the first main electrode terminal 21.

As shown in FIG. 2, one end side and the other end side of the thin film resistance layer 16$_{j+1}$ of the third loop are disposed so as to oppose each other at a predetermined interval on the same loop path. As shown in FIGS. 2 and 6, the other end side of the second relay wire 23$_{j+1}$ is electrically and metallurgically connected to the one end side of the thin film resistance layer 16$_{j+1}$ of the third loop through a contact hole 20*f* penetrating the interlayer dielectric 20.

Figure 7:
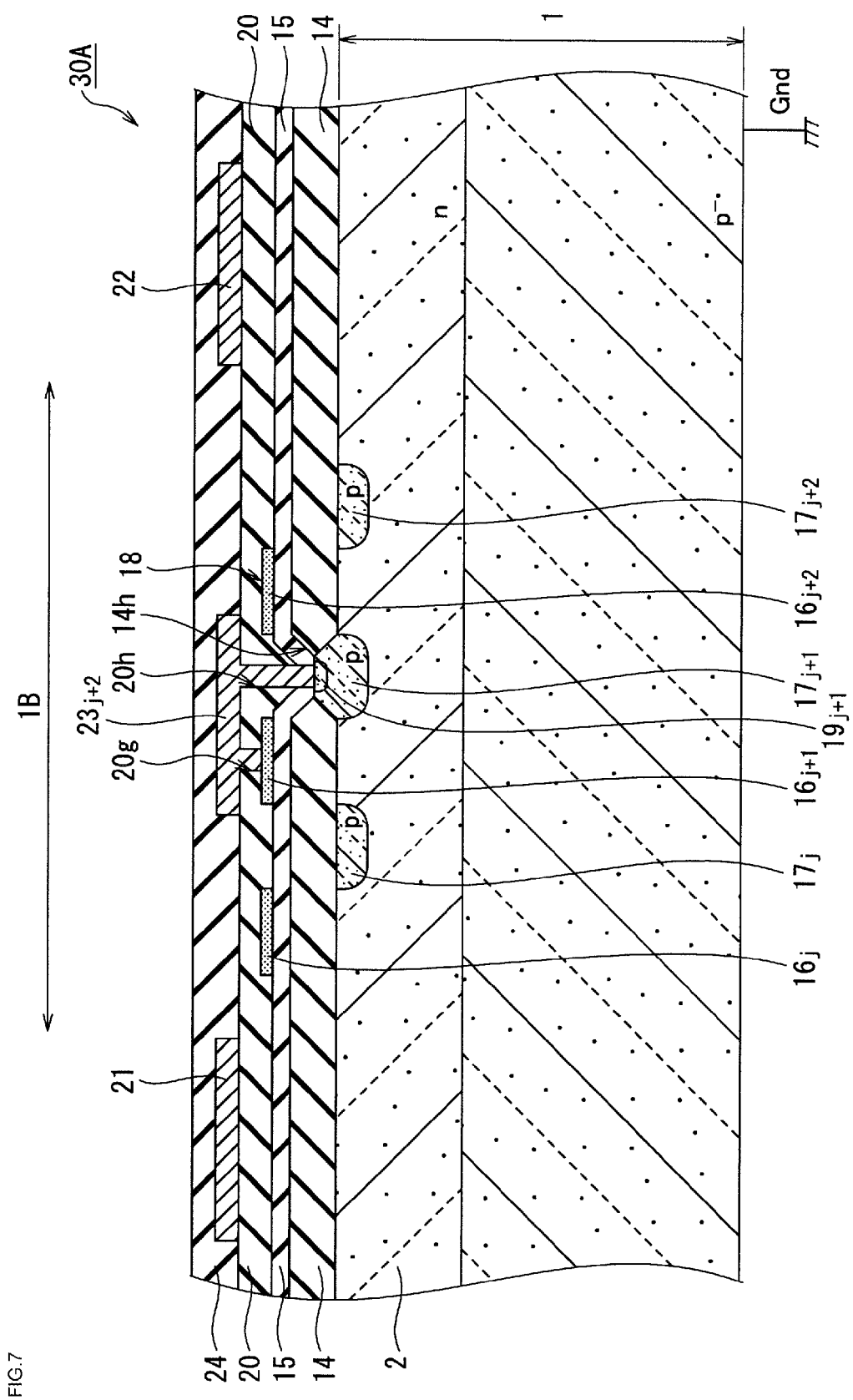
FIG. 7 is a main portion sectional view showing a sectional structure along a IIe-IIe line of FIG. 2.

As shown in FIG. 7, one end side of a third relay wire 23$_{j+2}$ is electrically and metallurgically connected to the other end side of the thin film resistance layer 16$_{j+1}$ of the third loop through a contact hole 20*g* penetrating the interlayer dielectric 20. The third relay wire 23$_{j+2}$ is formed in the same layer as, for example, the first main electrode terminal 21.

As shown in FIG. 2, one end side and the other end side of the diffusion resistance region 17$_{j+1}$ of the fourth loop are disposed so as to oppose each other at a predetermined interval on the same loop path. As shown in FIG. 7, a p$^+$-type ohmic contact region 19$_{j+1}$ is selectively provided in the aperture portion 14*h* of the field insulating film 14 in the interior of the one end side of the diffusion resistance region 17$_{j+1}$ of the fourth loop. As shown in FIGS. 2 and 7, the other end side of the third relay wire 23$_{j+2}$ is electrically and metallurgically connected to the ohmic contact region 19$_{j+1}$, through a contact hole 20*h* penetrating the interlayer dielectric 20 and interlayer dielectric 15$_j$ so as to form low ohmic contact resistance.

Figure 8:
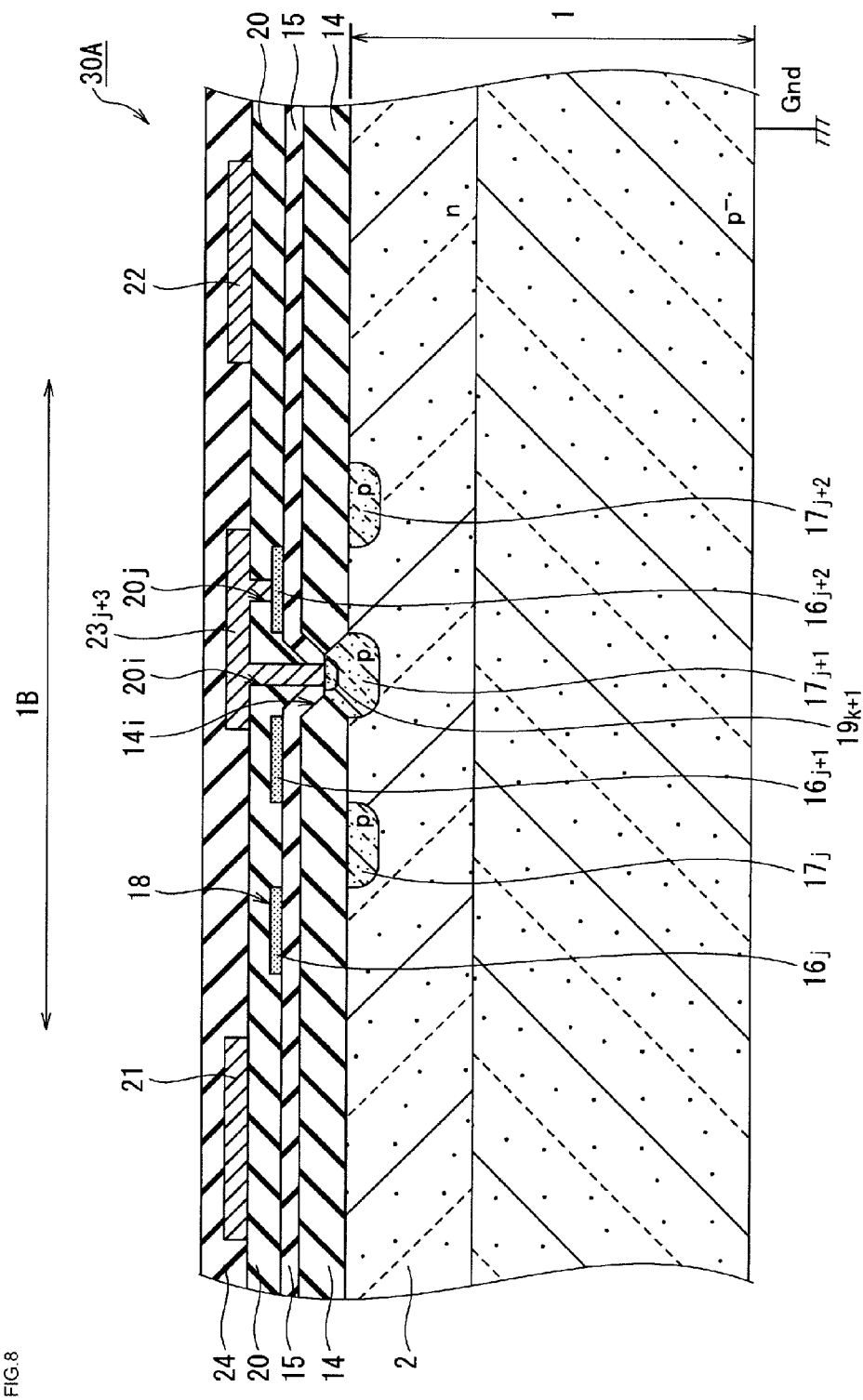
FIG. 8 is a main portion sectional view showing a sectional structure along a IIf-IIf line of FIG. 2.

As shown in FIG. 8, a p$^+$-type ohmic contact region 19$_{k\pm1}$ is selectively provided in the aperture portion 14*i* of the field insulating film 14 in the interior of the other end side of the diffusion resistance region 17$_{j+1}$ of the fourth loop. As shown in FIGS. 2 and 8, one end side of a fourth relay wire 23$_{j+3}$ is electrically and metallurgically connected to the ohmic contact region 19$_{k+1}$, through a contact hole 20*i* penetrating the interlayer dielectric 20 and interlayer dielectric 15, so as to form low ohmic contact resistance. The fourth relay wire 23$_{j+3}$ is formed in the same layer as, for example, the first main electrode terminal 21.

As shown in FIG. 2, one end side and the other end side of the thin film resistance layer 16$_{j+2}$ of the fifth loop are disposed so as to oppose each other at a predetermined interval on the same loop path. As shown in FIG. 8, the other end side of the fourth relay wire 23$_{j+3}$ is electrically and metallurgically connected to the one end side of the thin film resistance layer 16$_{j+2}$ of the fifth loop through a contact hole 20*j* penetrating the interlayer dielectric 20.

Figure 9:
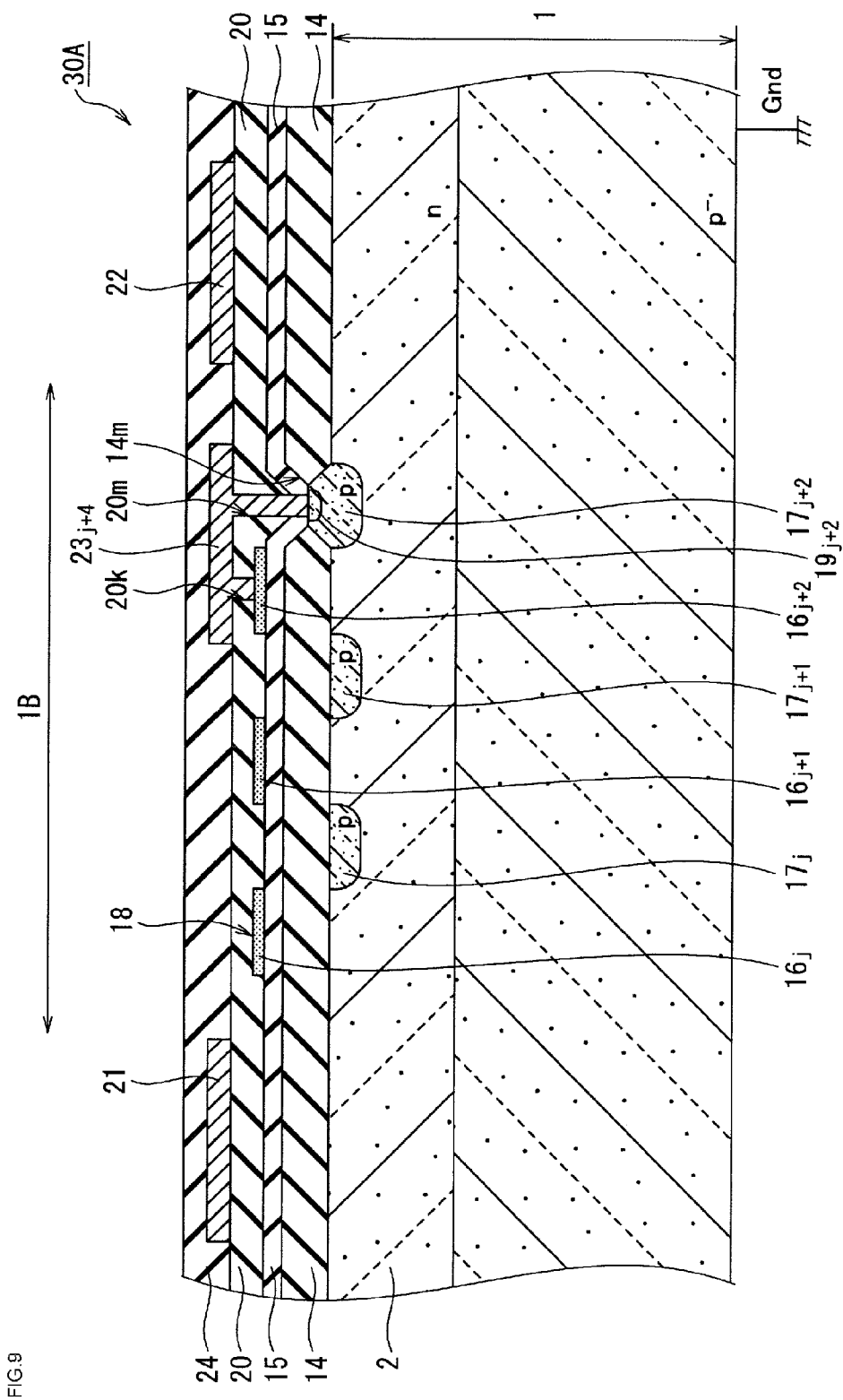
FIG. 9 is a main portion sectional view showing a sectional structure along a IIg-IIg line of FIG. 2.

As shown in FIGS. 2 and 9, one end side of a fifth relay wire 23$_{j+4}$ is electrically and metallurgically connected to the other end side of the thin film resistance layer 16$_{j+2}$ of the fifth loop through a contact hole 20*k* penetrating the interlayer dielectric 20. The fifth relay wire 23$_{j+4}$ is formed in the same layer as, for example, the first main electrode terminal 21.

As shown in FIG. 2, one end side and the other end side of the diffusion resistance region 17$_{j+2}$ of the sixth loop are disposed so as to oppose each other at a predetermined interval on the same loop path. As shown in FIG. 9, a p$^+$-type ohmic contact region 19$_{j+2}$ is selectively provided in the aperture portion 14*m* of the field insulating film 14 in the interior of the one end side of the diffusion resistance region 17$_{j+2}$ of the sixth loop. As shown in FIGS. 2 and 9, the other end side of the fifth relay wire 23$_{j+4}$ is electrically and metallurgically connected to the ohmic contact region 19$_{j+2}$, through a contact hole 20*m* penetrating the interlayer dielectric 20 and interlayer dielectric 15, so as to form low ohmic contact resistance.

Figure 10:
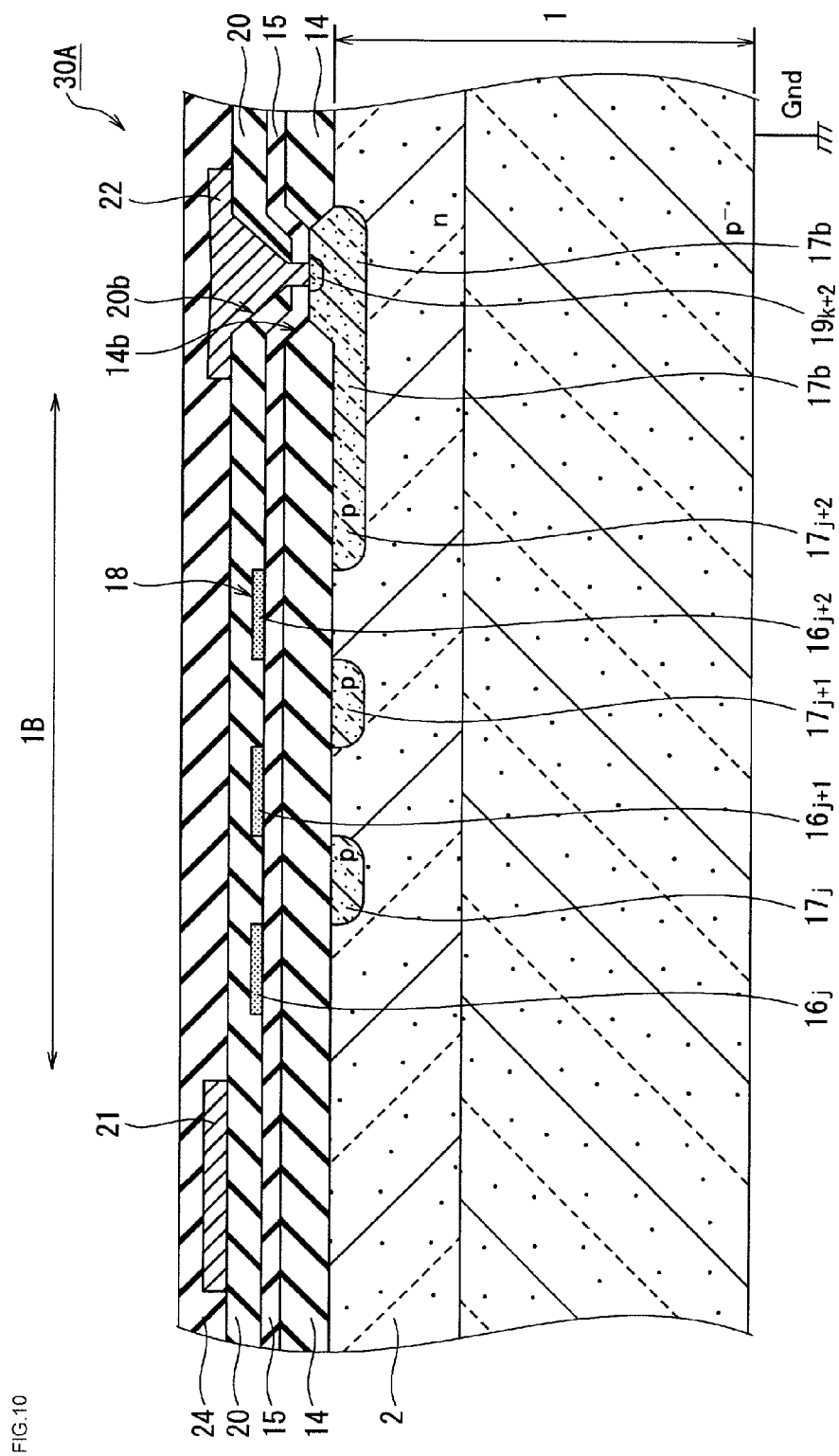
FIG. 10 is a main portion sectional view showing a sectional structure along a IIh-IIh line of FIG. 2.

As shown in FIGS. 2 and 10, a drawn-out portion 17*b* drawn out from the sixth loop path is provided so as to overlap with one portion of the second main electrode terminal 22 on the other end side of the diffusion resistance region 17$_{j+2}$ of the sixth loop. As shown in FIG. 10, a p$^+$-type ohmic contact region 19$_{k+2}$ is selectively provided in the aperture portion 14*b* of the field insulating film 14 in the interior of the drawn-out portion 17*b*. As shown in FIGS. 2 and 10, the one portion of the second main electrode terminal 22 is electrically and metallurgically connected to the ohmic contact region 19$_{k+2}$ through a contact hole 20*b* penetrating the interlayer dielectric 20 and interlayer dielectric 15, so as to form low ohmic contact resistance.

The diffusion resistance regions 17$_j$, 17$_{j+1}$, and 17$_{j+2}$ are formed to have an impurity concentration higher than that of a drift region 2A. The ohmic contact regions 19$_j$, 19$_k$, 19$_{j+1}$, 19$_{k+1}$, 19$_{j+2}$, and 19$_{k+2}$ are formed to have an impurity concentration higher than that of the diffusion resistance regions 17$_j$, 17$_{j+1}$, and 17$_{j+2}$.

Each of the three thin film resistance layers 16$_j$, 16$_{j+1}$, and 16$_{j+2}$ and three diffusion resistance regions 17$_j$, 17$_{j+1}$, and 17$_{j+2}$ is formed to a width of in the region of 0.6 μm through 2.0 μm. Also, the intervals between thin film resistance layers 16$_j$, 16$_{j+1}$, and 16$_{j+2}$ neighboring on differing loop paths, and the intervals between diffusion resistance regions 17$_j$, 17$_{j+1}$, and 17$_{j+2}$ neighboring on differing loop paths, are formed to be in the region of 0.6 μm through 2.0 μm. Also, the intervals between the opposing one end side and other end side of the thin film resistance layers 16$_j$, 16$_{j+1}$, and 16$_{j+2}$ on the same loop path, and the intervals between the opposing one end side and other end side of the diffusion resistance regions $17_j$, $17_{j+1}$, and $17_{j+2}$ on the same loop path, are formed to be in the region of 0.6 µm through 2.0 µm.

The thin film resistance layers $16_j$, $16_{j+1}$, and $16_{j+2}$ are formed of, for example, a polycrystalline silicon film (doped silicon film) into which impurity ions are implanted. The silicon film is doped using, for example, boron (B) ions or boron difluoride ($BF_2$) ions as the impurity ions so that the surface concentration of the thin film resistance layers $16_j$, $16_{j+1}$, and $16_{j+2}$ becomes, for example, $1\times10^{17}/cm^3$ through $1\times10^{20}/cm^3$. The sheet resistance value of the thin film resistance layers $16_j$, $16_{j+1}$, and $16_{j+2}$ in this case is in the region of, for example, 2 kΩ/square. The thin film resistance layers $16_j$, $16_{j+1}$, and $16_{j+2}$ can be formed easily by patterning a doped silicon film into a predetermined pattern using photolithography technology, and the individual total resistance values on each loop path can be practically equal.

The diffusion resistance regions $17_j$, $17_{j+1}$, and $17_{j+2}$ can be formed easily by implanting p-type impurity ions (for example, B ions or $BF_2$ ions) into an upper portion of the well region 2 using a photoresist mask formed by, for example, photolithography technology, and subsequently implementing thermal processing that activates the implanted impurity ions, and the individual total resistance values on each loop path can be practically equal. Each of the three diffusion resistance regions $17_j$, $17_{j+1}$, and $17_{j+2}$ can be formed so as to have a total resistance value practically equal to that of the three thin film resistance layers $16_j$, $16_{j+1}$, and $16_{j+2}$ by adjusting the dose and diffusion time of the impurity ions.

As heretofore described, the semiconductor device 30A according to the first embodiment includes the resistive element 18 wherein the diffusion resistance regions $17_j$, $17_{j+1}$, and $17_{j+2}$ provided in an upper portion of the semiconductor base 1, and the thin film resistance layers $16_j$, and $16_{j+2}$ isolated and distanced from the semiconductor base 1 and diffusion resistance regions $17_j$, $17_{j+1}$, and $17_{j+2}$ across the field insulating film 14 and interlayer dielectric 15 acting as insulating films, are alternately connected in series and alternately disposed in parallel. As shown in FIG. 3, the resistive element 18 is such that the diffusion resistance regions $17_j$, $17_{j+1}$, and $17_{j+2}$ and thin film resistance layers $16_j$, $16_{j+1}$, and $16_{j+2}$ are configured in differing layers. Therefore, when the total array width from the first row to the last row (the width from the thin film resistance layer $16_j$ to the diffusion resistance region $17_{j+2}$) is constant, the effective length is approximately twice as great compared with an existing resistive element configured of only a thin film resistance layer or diffusion resistance region, and the total resistance value from the one end side to which the first main electrode terminal 21 is connected, as shown in FIG. 4, to the other end side to which the second main electrode terminal 22 is connected, as shown in FIG. 10, increases. Therefore, an increase in the resistance of the resistive element 18 can be achieved while restricting an increase in the size of the semiconductor device 30A.

Also, as the thin film resistance layers $16_j$, $16_{j+1}$, and $16_{j+2}$ are isolated and distanced from the semiconductor base 1 and diffusion resistance regions $17_j$, $17_{j+1}$, and $17_{j+2}$ across the insulating films (the field insulating film 14 and interlayer dielectric 15), the resistive element 18 can be of a planar pattern wherein the diffusion resistance regions $17_j$, $17_{j+1}$, and $17_{j+2}$ and thin film resistance layers $16_j$, $16_{j+1}$, and $16_{j+2}$ are laid with no gap when seen from a direction perpendicular to the upper surface of the semiconductor base 1, as shown in FIGS. 1 through 3. Therefore, a greater number of diffusion resistance regions $17_j$, $17_{j+1}$, $17_{j+2}$, and so on, and thin film resistance layers $16_j$, $16_{j+1}$, $16_{j+2}$, and so on, can be arrayed compared with when arraying leaving gaps. As a result of this, a further increase in the resistance of the resistive element 18 can be achieved while restricting an increase in the size of the semiconductor device 30A.

Also, although not shown, the resistive element 18 is such that the thin film resistance layers $16_j$, and $16_{j+2}$ and diffusion resistance regions $17_j$, $17_{j+1}$, and $17_{j+2}$ can also be arrayed so that one portion of each overlaps, and can also be arrayed so that each is distanced from the others, when seen from a direction perpendicular to the upper surface of the semiconductor base 1, because of which the freedom of layout can be increased.

In the semiconductor device 30A according to the first embodiment, the resistive element 18 is disposed so that the other end side of the thin film resistance layer $16_j$ positioned on the path of the first loop and the one end side of the diffusion resistance region $17_j$ positioned on the path of the second loop are neighboring in the array direction (the width direction of the projection region 1B) when seen from a direction perpendicular to the upper surface of the semiconductor base 1, as shown in FIGS. 2 and 5. Further, the one end side of the thin film resistance layer $16_j$ and the other end side of the diffusion resistance region $17_j$ are electrically connected via the first relay wire $23_j$. Further, in the same way, the other end side of the diffusion resistance region $17_j$ positioned on the path of the second loop and the one end side of the thin film resistance layer $16_{j+1}$ positioned on the path of the third loop, as shown in FIGS. 2 and 6, the other end side of the thin film resistance layer $16_{j+1}$ positioned on the path of the third loop and the one end side of the diffusion resistance region $17_{j+1}$ positioned on the path of the fourth loop, as shown in FIGS. 2 and 7, the other end side of the diffusion resistance region $17_{j+1}$ positioned on the path of the fourth loop and the one end side of the thin film resistance layer $16_{j+2}$ positioned on the path of the fifth loop, as shown in FIGS. 2 and 8, and the other end side of the thin film resistance layer $16_{j+2}$ positioned on the path of the fifth loop and the one end side of the diffusion resistance region $17_{j+2}$ positioned on the path of the sixth loop, as shown in FIGS. 2 and 9, are disposed neighboring in the array direction. Further, these one end sides and other end sides too, in the same way, are electrically connected via the second relay wire $23_{j+1}$, third relay wire $23_{j+2}$, fourth relay wire $23_{j+3}$, and fifth relay wire $23_{j+4}$. That is, the resistive element 18 is such that the other end sides of the thin film resistance layers $16_j$, $16_{j+1}$, and $16_{j+2}$ positioned on the path of a preceding loop and the one end sides of the diffusion resistance regions $17_j$, $17_{j+1}$, and $17_{j+2}$ positioned on the path of a subsequent loop are disposed so as to be neighboring in the array direction, and the other end sides of the thin film resistance layers $16_j$, $16_{j+1}$, and $16_{j+2}$ positioned on the path of a preceding loop and the one end sides of the diffusion resistance regions $17_j$, $17_{j+1}$, and $17_{j+2}$ positioned on the path of a subsequent loop are electrically connected via the relay wires ($23_j$, $23_{j+2}$, $23_{j+3}$, $23_{j+4}$). Consequently, the resistive element 18 is such that, even though the diffusion resistance regions $17_j$, $17_{j+1}$, and $17_{j+2}$ and thin film resistance layers $16_j$, $16_{j+1}$, and $16_{j+2}$ are configured in differing layers, the diffusion resistance regions $17_j$, $17_{j+1}$, and $17_{j+2}$ and thin film resistance layers $16_j$, $16_{j+1}$, and $16_{j+2}$ can be alternately connected in series, and can configure a planar pattern that continuously loops around in spiral form.

Also, connection of the other end sides of the thin film resistance layers $16_j$, $16_{j+1}$, and $16_{j+2}$ positioned on the path of a preceding loop and the one end sides of the diffusion resistance regions $17_j$, $17_{j+1}$, and $17_{j+2}$ positioned on the path of a subsequent loop can be carried out at the minimum distance, because of which an increase in resistance in the connection portions of the thin film resistance layers $16_j$, $16_{j+1}$, and $16_{j+2}$ and diffusion resistance regions $17_j$, $17_{j+1}$, and $17_{j+2}$ can be restricted, and an evening of the resistance value from the one end sides to the other end sides can be achieved.

As shown in FIG. 3, the semiconductor device 30A according to the first embodiment is such that the resistive element 18 is provided so as to oppose the well region 2 configuring the voltage withstanding structure portion in the projection region 1B. Further, the resistive element 18 is such that the diffusion resistance regions $17_j$, $17_{j+1}$, and $17_{j+2}$ are provided in the interior of the well region 2. Consequently, to describe with reference to FIG. 3, when a first reference potential (for example, 0V) is applied to the second main electrode terminal 22 and p⁻-type semiconductor base 1 and a second reference potential (for example, 1,200V) higher than the first reference potential is applied to the first main electrode terminal 21 and n-type well region 2, and reverse bias is applied between the p⁻-type semiconductor base 1 and n-type well region 2 and between the n-type well region 2 and p-type diffusion resistance regions $17_j$, $17_{j+1}$, and $17_{j+2}$, a depletion layer spreads from the p-n junction interface between the semiconductor base 1 and well region 2 and from the p-n junction interface between the diffusion resistance regions $17_j$, $17_{j+1}$, and $17_{j+2}$ and well region 2. The electrical field can be relaxed, thus achieving an increase in breakdown voltage, by the two depletion layers connecting. That is, as the diffusion resistance regions $17_j$, $17_{j+1}$, and $17_{j+2}$ are provided in the interior of the well region 2, the resistive element 18 can configure a pseudo double RESURF structure.

In particular, as the resistive element 18 is configured in a spiral planar pattern, a practically uniform potential gradient is obtained inside the resistive element 18 from the current flowing through the resistive element 18, and the potential on the base side is practically equal to the potential of the spiral resistive element 18, because of which a stable breakdown voltage can be obtained.

As shown in FIGS. 1 through 3, the resistive element 18 is disposed laid so that no gap (opening region) occurs between the thin film resistance layers $16_j$, $16_{j+1}$, and $16_{j+2}$ and diffusion resistance regions $17_j$, $17_{j+1}$, and $17_{j+2}$ when seen from a direction perpendicular to the upper surface of the semiconductor base 1. Consequently, by the resistive element 18 being used as a field plate, the total resistance value of the resistive field plate can be increased, and the effect of surface charge reduced without limit.

Herein, when using a resistive field plate in the voltage withstanding structure portion of a high voltage integrated circuit, an increase in the total resistance value of the resistive field plate and a reduction of leakage current is required in order to reduce the power consumption of the high voltage integrated circuit when on standby. In order to reduce the leakage current, it is sufficient to increase the total resistance value by simply increasing the number of turns of the resistive field plate, thus increasing the effective length, but an existing resistive field plate is such that the planar size increases in accordance with the number of turns. An increase in size of the resistive field plate results in an increase in size of the semiconductor chip, that is, an increase in size of the semiconductor device.

In response to this, the resistive element 18 according to the first embodiment is such that, when the total array width is constant, the effective length is approximately twice as great compared with an existing resistive element configured of only a thin film resistance layer or diffusion resistance region, and the total resistance value increases, as heretofore described. Therefore, the leakage current when a potential higher than that applied to the second main electrode terminal 22 is applied to the first main electrode terminal 21 can be reduced. Consequently, according to the semiconductor device 30A according to the first embodiment, a reduction in power consumption when on standby can be achieved while restricting an increase in the size of the semiconductor device 30A itself.

As shown in FIG. 3, when the resistive element 18 is used as the field plate, it is necessary that a thickness d (nm) of the field insulating film 14 and interlayer dielectric 15 acting as insulating films that isolate and distance the thin film resistance layers $16_j$, $16_{j+1}$, and $16_{j+2}$ from the semiconductor base 1 (well region 2) and diffusion resistance regions $17_j$, $17_{j+1}$, and $17_{j+2}$ is of a value that satisfies the inequality $$X \cdot d \cdot 10^{\wedge}(-9) > (V_{max}/R_{all}) \cdot \max(R_1, R_2) \qquad (1)$$

(the value of the greater of $R_1$, and $R_2$ is assigned to max $(R_1, R_2)$), wherein $V_{max}(V)$ is the voltage that can be applied between the first main electrode terminal 21 and second main electrode terminal 22, $R_{all}(\Omega)$ is the total resistance value of the resistive field plate, $R_1$ ($\Omega$) is the total resistance value of the outermost thin film resistance layer, $R_2$ ($\Omega$) is the total resistance value of the outermost diffusion resistance region, and X (V/nm) is the dielectric breakdown strength of the thickness d (nm) of the insulating films.

When the necessary insulating film thickness obtained from Expression 1 is 100 nm or less, one portion of the thick field insulating film 14 may be omitted by the thickness of the interlayer dielectric 15 being approximately 100 nm. When omitting the field insulating film 14, the diffusion resistance regions $17_j$, $17_{j+1}$, and $17_{j+2}$ can be selectively formed by self-alignment with respect to the thin film resistance layers $16_j$, $16_{j+1}$, and $16_{j+2}$ by implanting impurity ions with the thin film resistance layers $16_j$, $16_{j+1}$, and $16_{j+2}$ as a mask.

Figure 23:
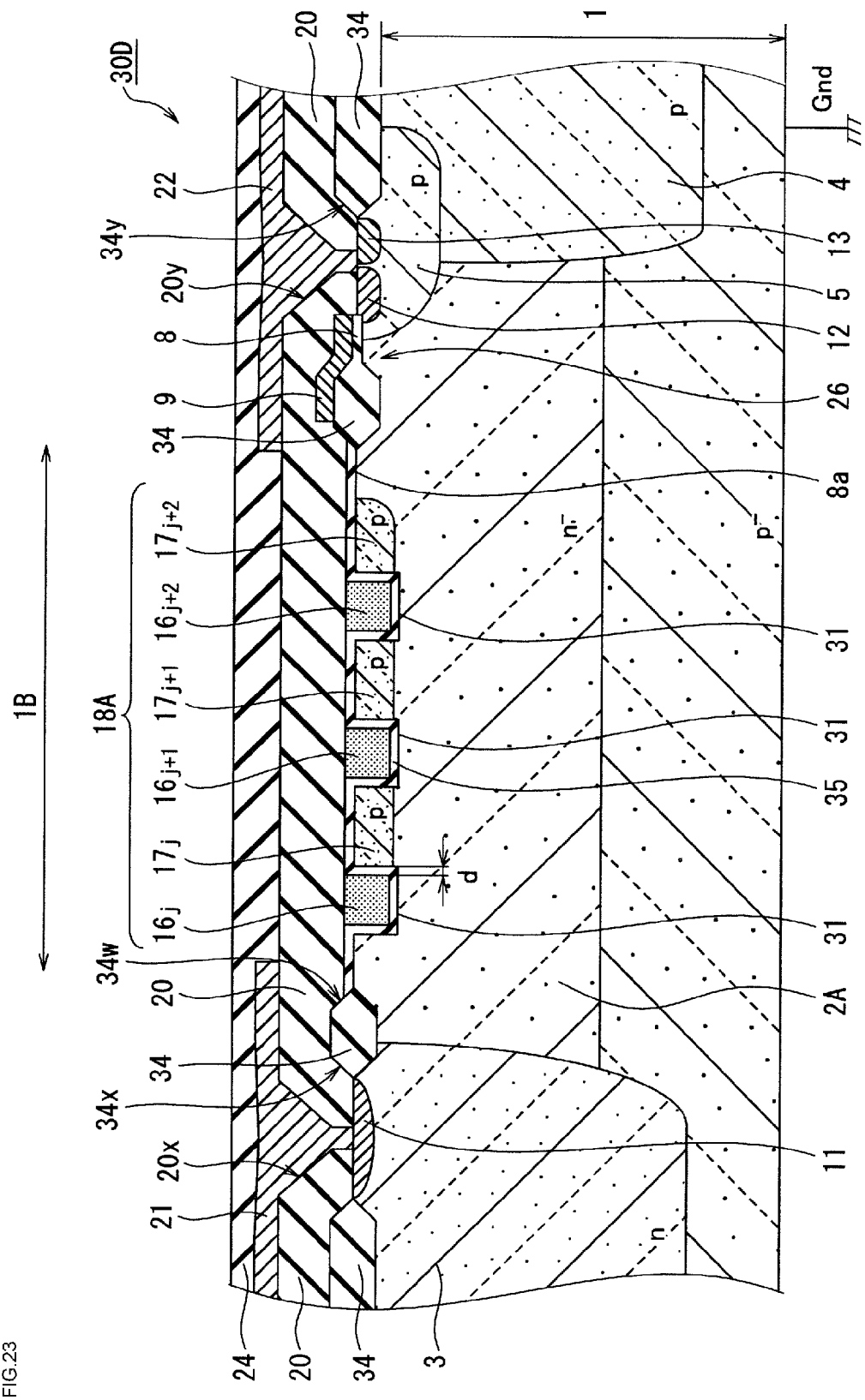
FIG. 23 is a main portion sectional view showing a sectional structure along a Va-Va line of FIG. 21.

To give an example of the thickness d (nm) of the insulating films, when the voltage $V_{max}(V)$ that can be applied between the first main electrode terminal 21 and second main electrode terminal 22 is 1,600V, the total resistance value $R_{all}(\Omega)$ of the resistive field plate is 600 M$\Omega$, the total resistance value $R_1$ ($\Omega$) of the outermost thin film resistance layer $16_{j+2}$ is 9 M$\Omega$, the total resistance value $R_2$ ($\Omega$) of the outermost diffusion resistance region $17_{j+2}$ is 7 M$\Omega$, and the dielectric breakdown strength X (V/nm) when using oxide films as the insulating films is 3 MV/cm, the thickness d of the insulating films is 80 nm, and one portion of the thick field insulating film 14 can be omitted, as in the case of a field insulating film 34 shown in FIG. 23 of a fifth embodiment, to be described hereafter.

When the width of the resistive field plate decreases partway along and there is a place in which the resistance increases, there is a possibility of the electrical field intensity in the vicinity thereof reaching the maximum, because of which it is preferable that the width of the resistive element 18 is constant. The semiconductor device 30A according to the first embodiment is such that an increase in resistance in the connection portions of the thin film resistance layers $16_j$, $16_{j+1}$, and $16_{j+2}$ and diffusion resistance regions $17_j$, $17_{j+1}$, and $17_{j+2}$ of the resistive element 18 can be restricted, because of which electrical field concentration in the connection portions can be restricted.

As heretofore described, according to the semiconductor device 30A according to the first embodiment, an increase in the resistance of the resistive element 18 can be achieved while restricting an increase in the size of the semiconductor device 30A itself.

Also, according to the semiconductor device 30A according to the first embodiment, a reduction in power consumption when on standby can be achieved while restricting an increase in the size of the semiconductor device 30A itself.

Second Embodiment

In a second embodiment, a description will be given of a semiconductor device including a high breakdown voltage MOSFET as a high breakdown voltage active element to which a field plate effect is applied.

Figure 13:
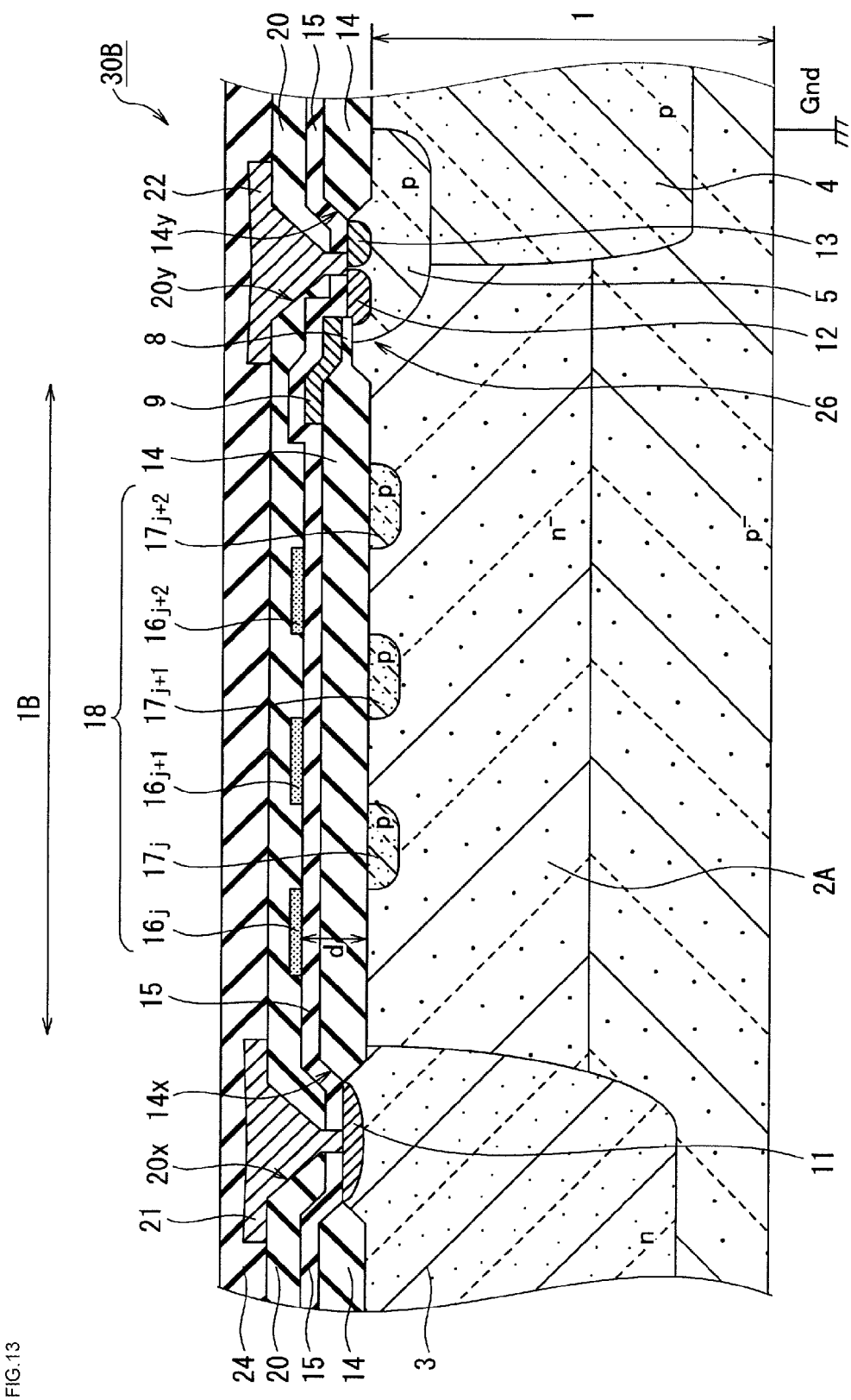
FIG. 13 is a main portion sectional view showing a sectional structure along a IIIa-IIIa line of FIG. 11.

As shown in FIG. 13, a semiconductor device 30B according to the second embodiment of the disclosure includes the semiconductor base 1, the resistive element 18 provided as a resistive field plate on the upper surface side of the semiconductor base 1, and the field insulating film 14, interlayer dielectric 15, and interlayer dielectric 20 sequentially provided on the upper surface of the semiconductor base 1. Also, the semiconductor device 30B according to the second embodiment includes the first main electrode terminal 21 and second main electrode terminal 22 provided above the upper surface of the semiconductor base 1 across, for example, the field insulating film 14, interlayer dielectric 15, and interlayer dielectric 20 acting as insulating films. Also, the semiconductor device 30B according to the second embodiment includes a planar gate type high breakdown voltage MOSFET 26 as a high breakdown voltage active element.

Figure 11:
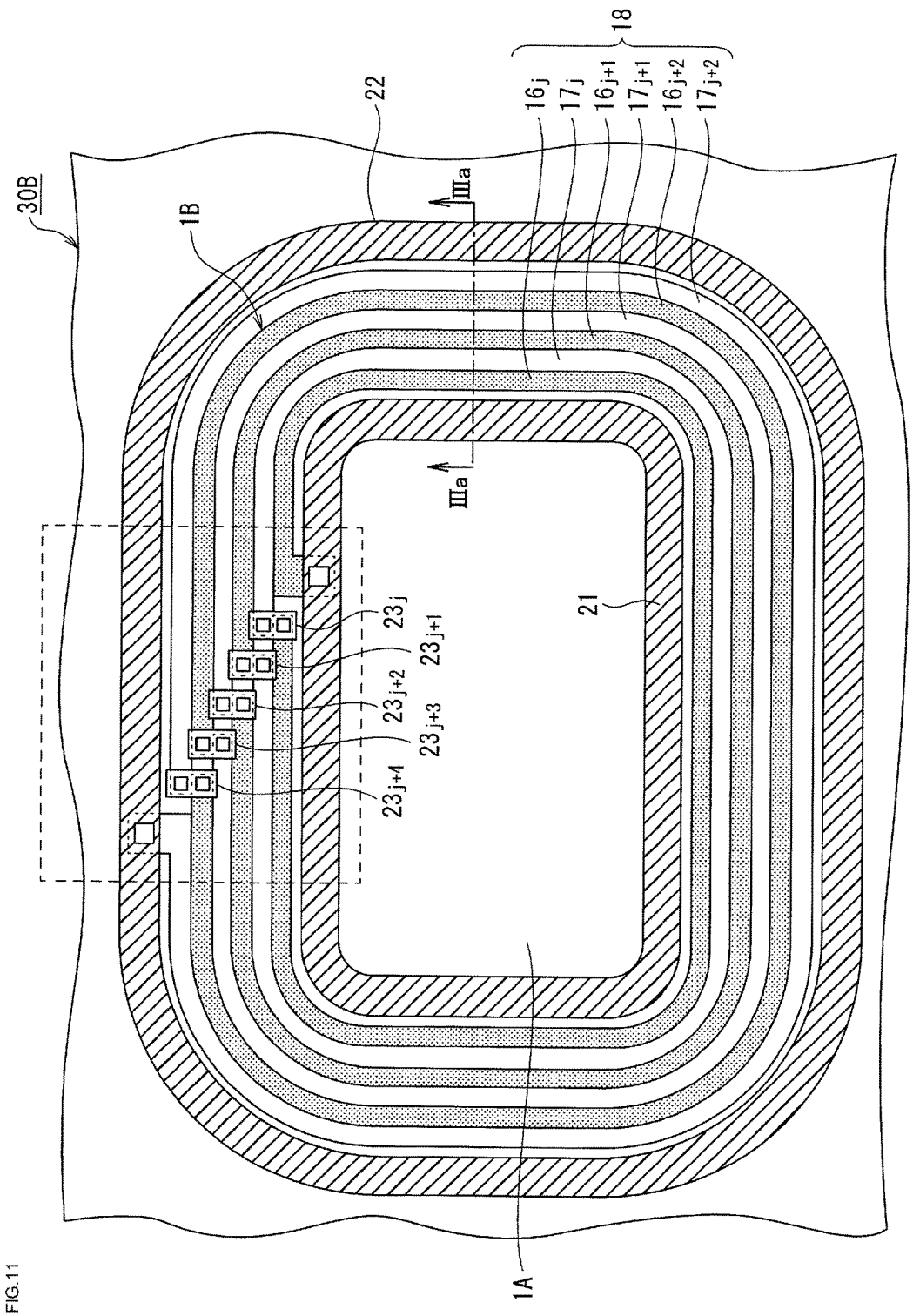
FIG. 11 is a main portion plan view showing a schematic configuration of a semiconductor device according to a second embodiment of the disclosure.

As shown in FIG. 11, the first main electrode terminal 21 and second main electrode terminal 22 are each configured in a ring-form planar pattern extending in an annular form so as to enclose the circuit formation region 1A of the upper surface of the semiconductor base 1. The second main electrode terminal 22 is disposed distanced from the first main electrode terminal 21 in a position enclosing the first main electrode terminal 21 above the upper surface of the semiconductor base 1.

The field insulating film 14 has an aperture portion 14$x$ and an aperture portion 14$y$, as shown in FIG. 13. Although omitted from the drawings in the second embodiment, the field insulating film 14, in the same way as in the first embodiment, has the aperture portion 14$d$ shown in FIG. 5, the aperture portion 14$e$ shown in FIG. 6, the aperture portion 14$h$ shown in FIG. 7, the aperture portion 14$i$ shown in FIG. 8, and the aperture portion 14$m$ shown in FIG. 9, as seen when referring to FIGS. 5 through 9 of the first embodiment.

Figure 12:
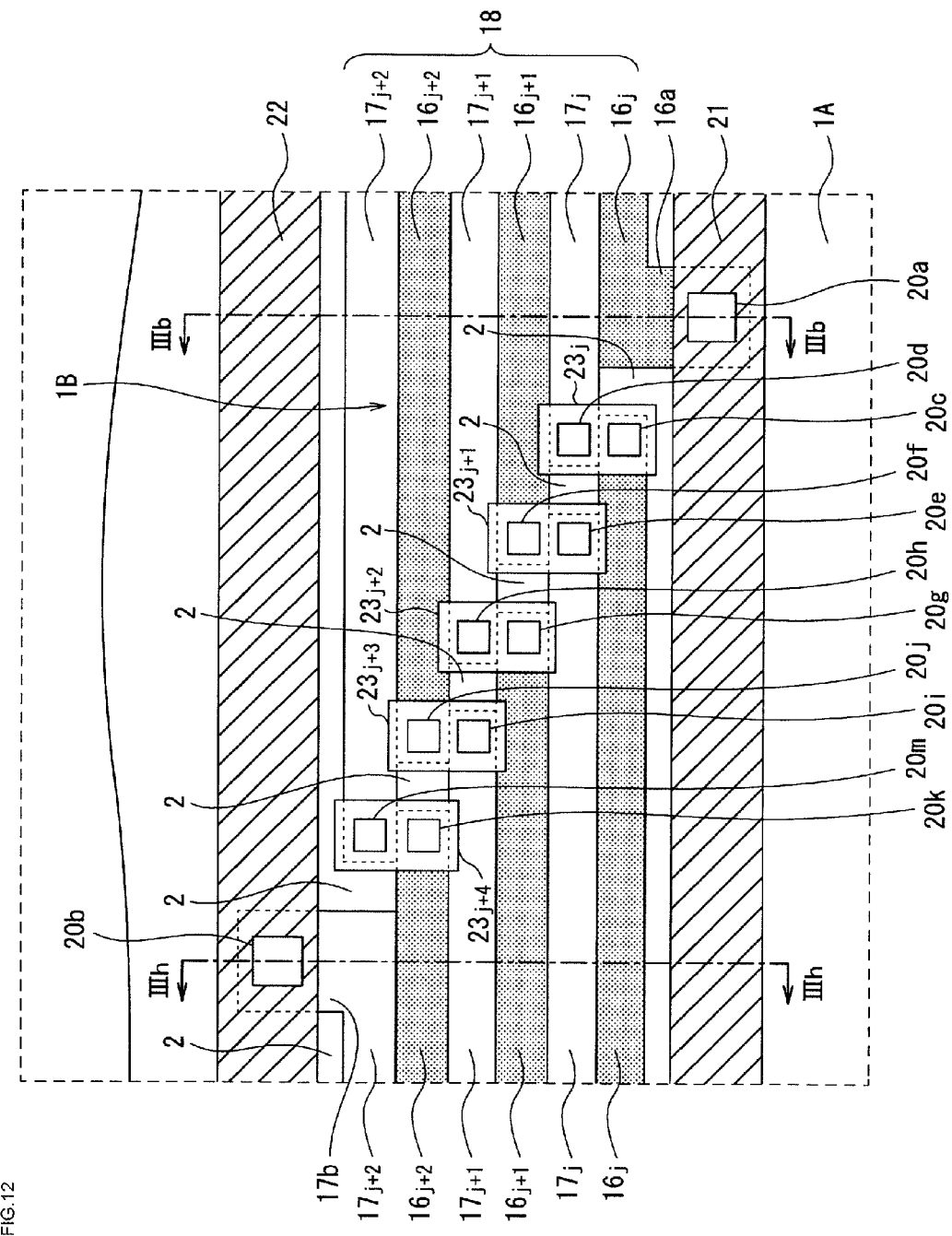
FIG. 12 is an enlarged plan view wherein the region enclosed by dotted lines in FIG. 11 is enlarged.

As shown in FIGS. 11 through 13, the resistive element 18, which is a field plate, is disposed in the projection region 1B between the first main electrode terminal 21 and second main electrode terminal 22 when seen from a direction perpendicular to the upper surface of the semiconductor base 1. The resistive element 18 is of the same configuration as in the first embodiment. That is, the resistive element 18 is of a configuration wherein the diffusion resistance regions $17_j$, $17_{j+1}$, and $17_{j+2}$ provided in an upper portion of the semiconductor base 1, and the thin film resistance layers $16_j$, $16_{j+1}$, and $16_{j+2}$ isolated and distanced from the semiconductor base 1 and diffusion resistance regions $17_j$, $17_{j+1}$, and $17_{j+2}$ across the field insulating film 14 and interlayer dielectric 15 acting as insulating films, are alternately connected one by one in series. Also, the resistive element 18 is of a configuration wherein the thin film resistance layers $16_j$, $16_{j+1}$, and $16_{j+2}$ and diffusion resistance regions $17_j$, $17_{j+1}$, and $17_{j+2}$ are alternately disposed one by one in parallel. Also, the resistive element 18 is of a configuration wherein the other end sides of the thin film resistance layers $16_j$, $16_{j+1}$, and $16_{j+2}$ and the one end sides of the diffusion resistance regions $17_j$, $17_{j+1}$, and $17_{j+2}$ are electrically connected via the relay wires ($23_j$, $23_{j+1}$, $23_{j+2}$, $23_{j+3}$, $23_{j+4}$). Also, the resistive element 18 is configured in a planar pattern that loops around in spiral form so as to enclose the first main electrode terminal 21 in the projection region 1B.

Figure 14:
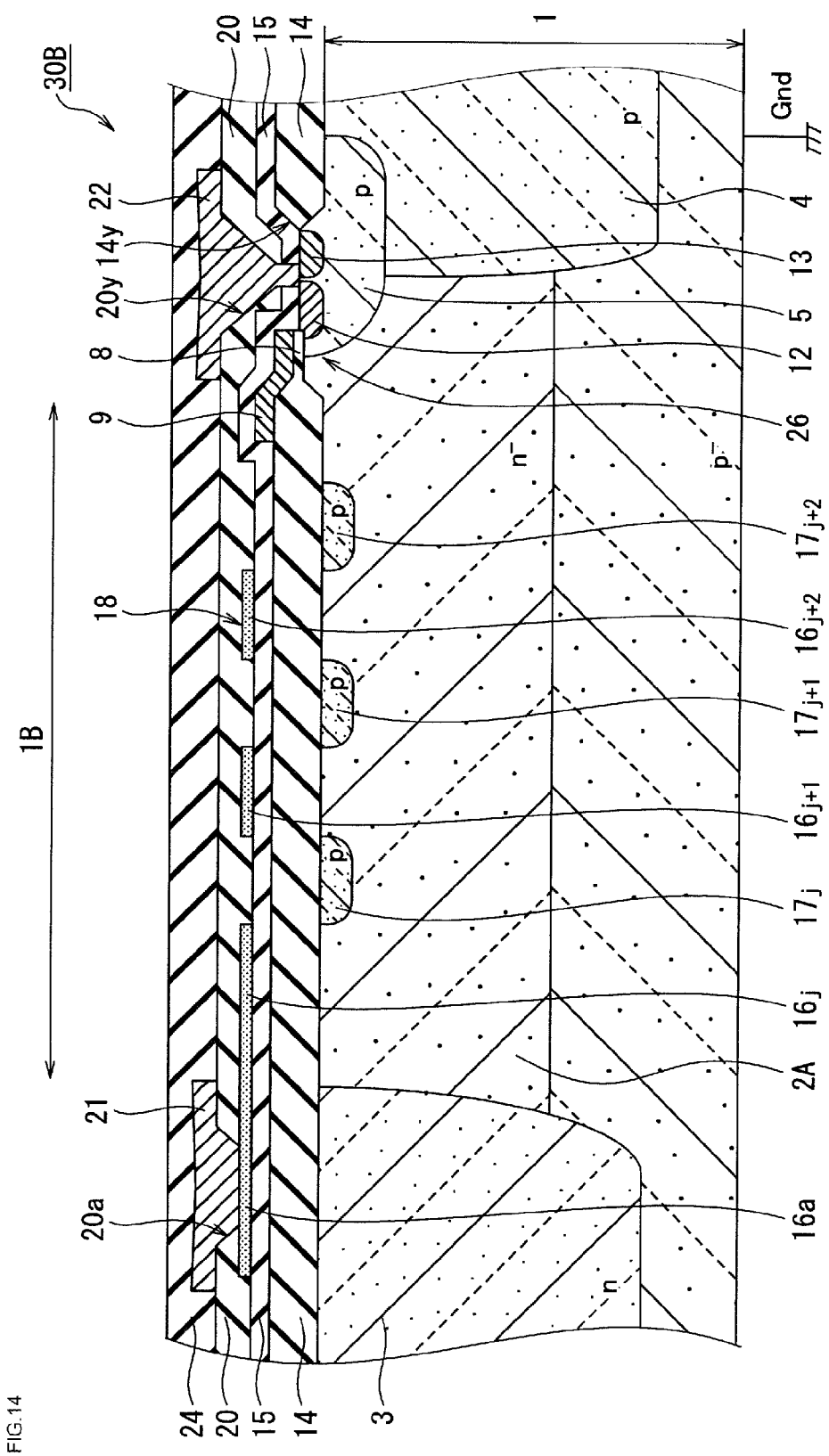
FIG. 14 is a main portion sectional view showing a sectional structure along a IIIb-IIIb line of FIG. 12.

Also, as shown in FIGS. 12 and 14, the resistive element 18 has the drawn-out portion 16$a$ drawn out from the first loop path so as to overlap with one portion of the first main electrode terminal 21 on the one end side of the thin film resistance layer $16_j$ of the first loop. The one portion of the first main electrode terminal 21 is electrically and mechanically connected to the contact portion of the drawn-out portion 16$a$ via the contact hole 20$a$ penetrating the interlayer dielectric 20.

Figure 15:
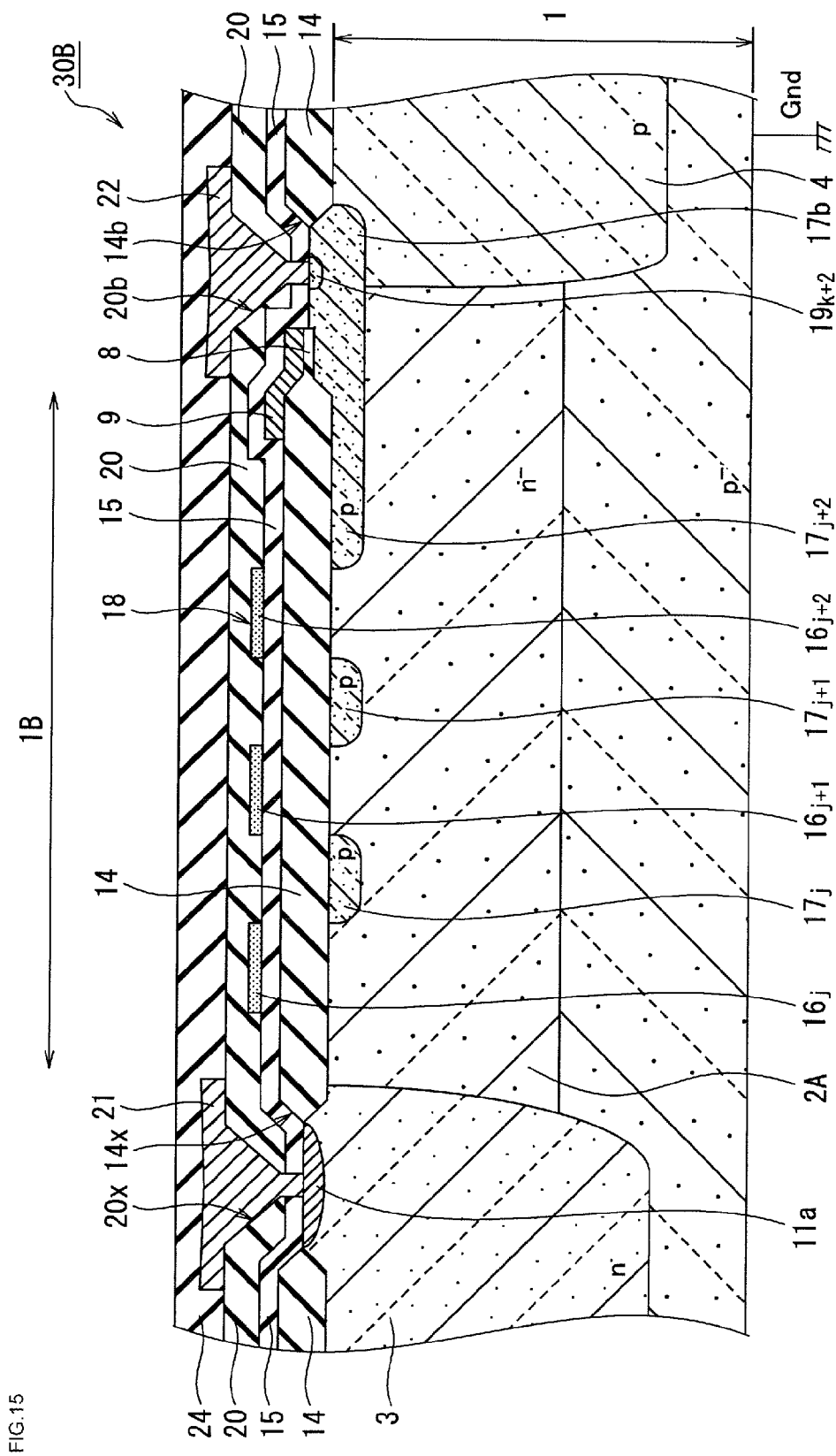
FIG. 15 is a main portion sectional view showing a sectional structure along a IIIh-IIIh line of FIG. 12.

Also, as shown in FIGS. 12 and 15, the resistive element 18 has the drawn-out portion 17$b$ drawn out from the sixth loop path so as to overlap with one portion of the second main electrode terminal 22 on the other end side of the diffusion resistance region $17_{j+2}$ of the sixth loop. The $p^+$-type ohmic contact region $19_{k+2}$ is selectively provided in the aperture portion 14$b$ of the field insulating film 14 in the interior of the drawn-out portion 17$b$. The one portion of the second main electrode terminal 22 is electrically and metallurgically connected to the ohmic contact region $19_{k+2}$ through the contact hole 20$b$ penetrating the interlayer dielectric 20 and interlayer dielectric 15, so as to form low ohmic contact resistance.

As shown in FIG. 13, the high breakdown voltage MOSFET 26 is configured in an upper portion of the semiconductor base 1. The high breakdown voltage MOSFET 26 mainly has the second conductivity type ($n^-$-type) drift region 2A, a first conductivity type (p-type) channel formation region 5, a gate insulating film 8, a gate electrode 9 (an example of a control electrode), a second conductivity type ($n^+$-type) first main electrode region 11 acting as a drain region, a second conductivity type ($n^+$-type) second main electrode region 12 acting as a source region, and a first conductivity type (p-type) pick-up region 13.

As is clear from FIG. 13, the drift region 2A is provided in an upper portion of the semiconductor base 1 so as to oppose the resistive element 18 in the projection region 1B. A second conductivity type (n-type) well region 3 on the first main electrode terminal 21 side (inner side) of the drift region 2A, and a first conductivity type (p-type) well region 4 on the second main electrode terminal 22 side (outer side) of the drift region 2A, are provided so as to be in contact with the drift region 2A in the upper portion of the semiconductor base 1.

The well region 3 is provided in the extension direction of the first main electrode terminal 21, and the well region 4 is provided in the extension direction of the second main electrode terminal 22. Further, the drift region 2A is provided in the extension direction of the well region 3 and well region 4 between the well region 3 and well region 4.

The drift region 2A configures a voltage withstanding region of the high breakdown voltage MOSFET 26, that is, a voltage withstanding structure portion that bears the breakdown voltage.

The channel formation region 5 is a base region, in an upper portion of the semiconductor base 1, provided from an upper portion of the drift region 2A to an upper portion of the well region 4.

The first main electrode region (drain region) 11 is disposed in an upper portion of the well region 3 positioned in the interior of the aperture portion 14x of the field insulating film 14. The first main electrode region 11 is disposed in a position overlapping the first main electrode terminal 21 in a plan view seen from a direction perpendicular to an upper portion of the semiconductor base 1.

In the second embodiment, the first main electrode region 11 is disposed in an upper portion of the well region 3, as shown in FIG. 13, but the first main electrode region 11 may be disposed in an upper portion of the drift region 2A. Also, the first main electrode region 11 may be disposed from an upper portion of the well region 3 to an upper portion of the drift region 2A.

The second main electrode region (source region) 12 and pick-up region 13 are disposed in an upper portion of the channel formation region (base region) 5 positioned in the interior of the aperture portion 14y of the field insulating film 14 in a planar pattern. The second main electrode region 12 and pick-up region 13 are disposed in positions overlapping the second main electrode terminal 22 when seen from a direction perpendicular to the upper surface of the semiconductor base 1.

The gate insulating film 8 is provided on the upper surface of the semiconductor base 1. The gate insulating film 8 is disposed in an upper portion of each of the drift region 2A and channel formation region 5 in the interior of the aperture portion 14y of the field insulating film 14. The gate insulating film 8 is formed of a $SiO_2$ film fabricated by thermally oxidizing the upper surface of the semiconductor base 1 using, for example, a thermal oxidation method. As $SiO_2$ films, there are a thermally oxidized film formed using a thermal oxidation method and a deposited oxide film formed using a CVD method, but in the high breakdown voltage MOSFET 26, for which high breakdown voltage is required, it is preferable that a thermally oxidized film with excellent density is used as the gate insulating film 8. In the second embodiment, a description is given of a case in which the high breakdown voltage MOSFET 26, wherein the gate insulating film 8 is formed of a $SiO_2$ film, is used as a high breakdown voltage transistor, but a high breakdown voltage MISFET wherein a gate insulating film is formed of a silicon nitride film, or of stacked films such as a silicon nitride film and silicon oxide film, may be used as the high breakdown voltage transistor.

As shown in FIG. 14 the gate electrode 9 is provided across the gate insulating film 8 on the channel formation region 5. The gate electrode 9 is provided on the gate insulating film 8 above the channel formation region 5 and above the drift region 2A in the vicinity of the channel formation region 5, and is disposed so that one portion thereof rides up onto the field insulating film 14 in the direction of the first main electrode region 11. The gate electrode 9 is formed of, for example, a polycrystalline silicon film (doped silicon film) of low resistivity to which an impurity has been added. The top of the gate electrode 9 is covered by the interlayer dielectric 15 and interlayer dielectric 20.

Although a plan view is omitted, the first main electrode region 11 is provided in an upper portion of the well region 3 along the planar pattern of the first main electrode terminal 21 shown in FIG. 11. In the same way, each of the channel formation region 5, gate insulating film 8, gate electrode 9, and pick-up region 13 is provided along the planar pattern of the second main electrode terminal 22 as a plan view.

As shown in FIG. 13, one portion of the first main electrode terminal 21 is electrically and metallurgically connected to the first main electrode region 11, through a contact hole 20x penetrating the interlayer dielectric 20 and interlayer dielectric 15, so as to form low ohmic contact resistance. Also, one portion of the second main electrode terminal 22 is electrically and metallurgically connected to the second main electrode region 12 and pick-up region 13, through a contact hole 20y penetrating the interlayer dielectric 20 and interlayer dielectric 15, so as to form low ohmic contact resistance. That is, in the semiconductor device 30B according to the second embodiment, one end side of the resistive element 18 is electrically connected via the first main electrode terminal 21 to the first main electrode region 11 of the high breakdown voltage MOSFET 26, as is clear from FIGS. 13 and 14, and the other end side of the resistive element 18 is electrically connected via the second main electrode terminal 22 to the second main electrode region 12 of the high breakdown voltage MOSFET 26, as is clear from FIGS. 13 and 15.

Although not shown in detail, the second main electrode terminal 22 is electrically connected to the semiconductor base 1. That is, the potential of the semiconductor base 1 is fixed at the potential applied to the second main electrode terminal 22.

In the semiconductor device 30B according to the second embodiment, to describe referring to FIG. 13, the high breakdown voltage MOSFET 26 is such that a channel is formed in the surface of the channel formation region 5 immediately below the gate electrode 9 by the surface potential being controlled by the voltage applied to the gate electrode 9. Carriers move from the second main electrode region (source region) 12 to the first main electrode region (drain region) 11 through the channel immediately below the gate electrode 9 and the drift region 2A.

Also, as shown in FIG. 13, the semiconductor device 30B according to the second embodiment includes the resistive element 18 provided opposing the drift region 2A configuring the voltage withstanding structure portion in the projection region 1B. Further, the resistive element 18 is such that the diffusion resistance regions $17_j$, $17_{j+1}$, and $17_{j+2}$ are provided in the interior of the drift region 2A. Consequently, when a first reference potential (for example, 0V) is applied to the second main electrode terminal 22 and a second reference potential (for example, 200V) higher than the first reference potential is applied to the first main electrode terminal 21, and reverse bias is applied between the second main electrode region (source region) 12 and first main electrode region (drain region) 11, a depletion layer spreads with good balance to each of the p-n junction interface between the p⁻-type semiconductor base 1 and n⁻-type drift region 2A and the p-n junction interface between the n⁻-type drift region 2A and p-type diffusion resistance regions $17_j$, $17_{j+1}$, and $17_{j+2}$. The electrical field can be relaxed, thus achieving an increase in breakdown voltage, by the two depletion layers connecting. That is, in the second embodiment too, a pseudo double RESURF structure is configured.

In particular, as the spiral form resistive element 18 acting as a resistive field plate is disposed on the n⁻-type drift region 2A of the high breakdown voltage MOSFET 26, a practically uniform potential gradient is obtained inside the resistive element 18 from the current flowing through the resistive element 18 when reverse bias is applied between the second main electrode region (source region) 12 and first main electrode region (drain region) 11, and the potential on the base side is practically equal to the potential of the spiral resistive element 18, because of which a stable breakdown voltage can be obtained.

As shown in FIGS. 11 through 13, the semiconductor device 30B according to the second embodiment includes the resistive element 18 wherein the diffusion resistance regions $17_j$, $17_{j+1}$, and $17_{j+2}$ provided in an upper portion of the semiconductor base 1, and the thin film resistance layers $16_j$, $16_{j+1}$, and $16_{j+2}$ isolated and distanced from the semiconductor base 1 and diffusion resistance regions $17_j$, $17_{j+1}$, and $17_{j+2}$ across the field insulating film 14 and interlayer dielectric 15 acting as insulating films, are alternately connected in series and alternately disposed in parallel. Consequently, the semiconductor device 30B according to the second embodiment too, in the same way as the semiconductor device 30A according to the first embodiment, is such that an increase in the resistance of the resistive element 18 can be achieved while restricting an increase in the size of the semiconductor device 30B itself. Also, the semiconductor device 30B according to the second embodiment too, in the same way as the semiconductor device 30A according to the first embodiment, is such that a reduction in power consumption when on standby can be achieved while restricting an increase in the size of the semiconductor device 30B itself.

Also, as shown in FIG. 13, the semiconductor device 30B according to the second embodiment includes the high breakdown voltage MOSFET 26 as a high breakdown voltage active element to which the field plate effect is applied. Further, the drift region 2A of the high breakdown voltage MOSFET 26 is provided in an upper portion of the semiconductor base 1 so as to oppose the resistive element 18. Further, the diffusion resistance regions $17_j$, $17_{j+1}$, and $17_{j+2}$ of the resistive element 18 are provided in the interior of the drift region 2A. Consequently, the semiconductor device 30B according to the second embodiment is also such that the electrical field in the voltage withstanding structure portion can be relaxed, thus achieving an increase in breakdown voltage. Also, a pseudo double RESURF structure can be configured.

Third Embodiment

For the semiconductor device 30B according to the second embodiment, a description has been given of a case in which the semiconductor device 30B includes the high breakdown voltage MOSFET 26 as a high breakdown voltage active element to which the field plate effect is applied, as shown in FIG. 13. As opposed to this, a semiconductor device 30C according to a third embodiment of the disclosure includes a high breakdown voltage diode 27 as a high breakdown voltage active element to which the field plate effect is applied.

Figure 18:
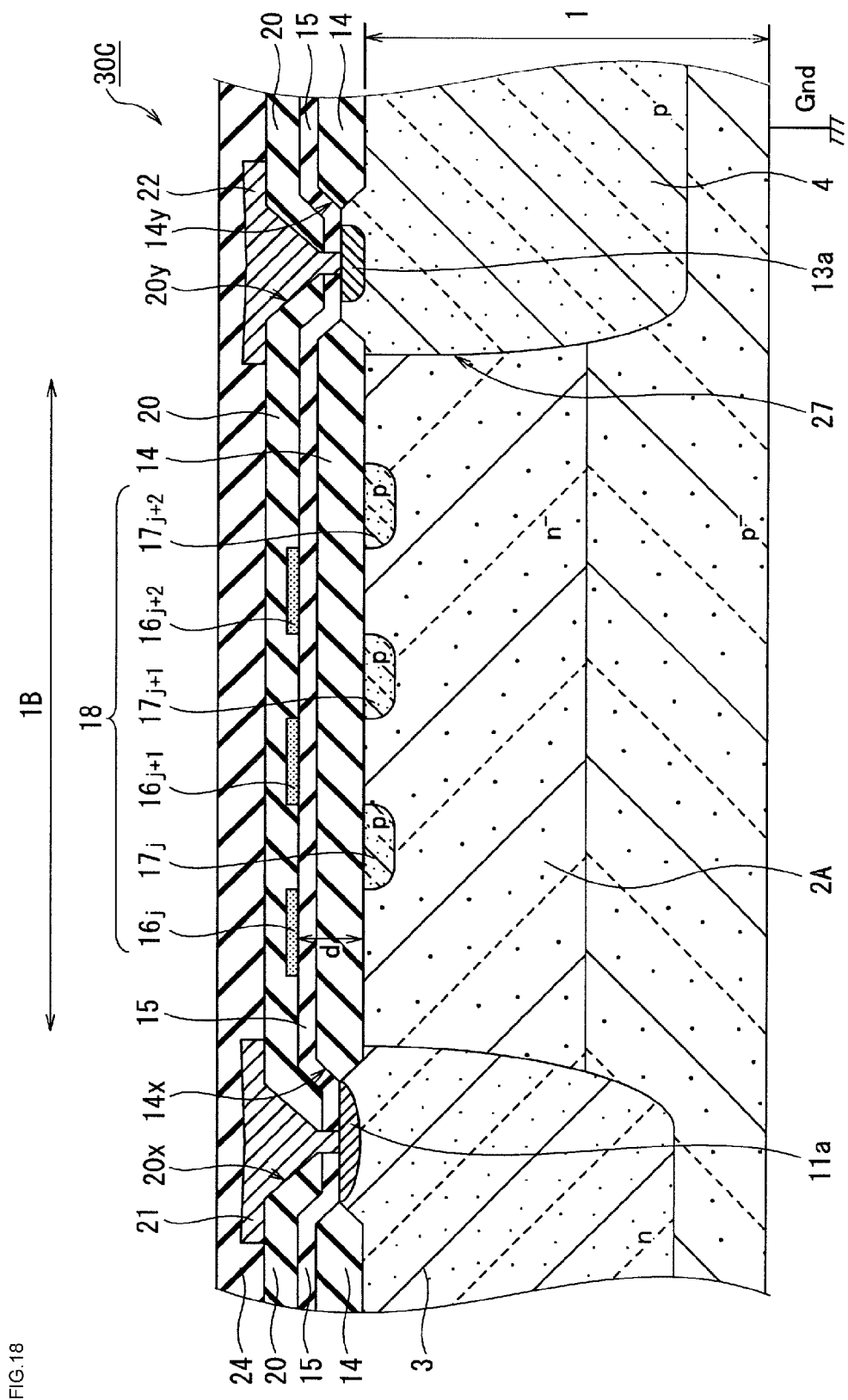
FIG. 18 is a main portion sectional view showing a sectional structure along a IVa-IVa line of FIG. 16.

As shown in FIG. 18, the semiconductor device 30C according to the third embodiment of the disclosure includes the semiconductor base 1, the resistive element 18 provided as a resistive field plate on the upper surface side of the semiconductor base 1, and the field insulating film 14, interlayer dielectric 15, and interlayer dielectric 20 sequentially provided on the upper surface of the semiconductor base 1. Also, the semiconductor device 30C according to the third embodiment includes the first main electrode terminal 21 and second main electrode terminal 22 provided above the upper surface of the semiconductor base 1 across, for example, the field insulating film 14, interlayer dielectric 15, and interlayer dielectric 20 acting as insulating films. Also, the semiconductor device 30C according to the third embodiment includes the high breakdown voltage diode 27 as a high breakdown voltage active element.

Figure 16:
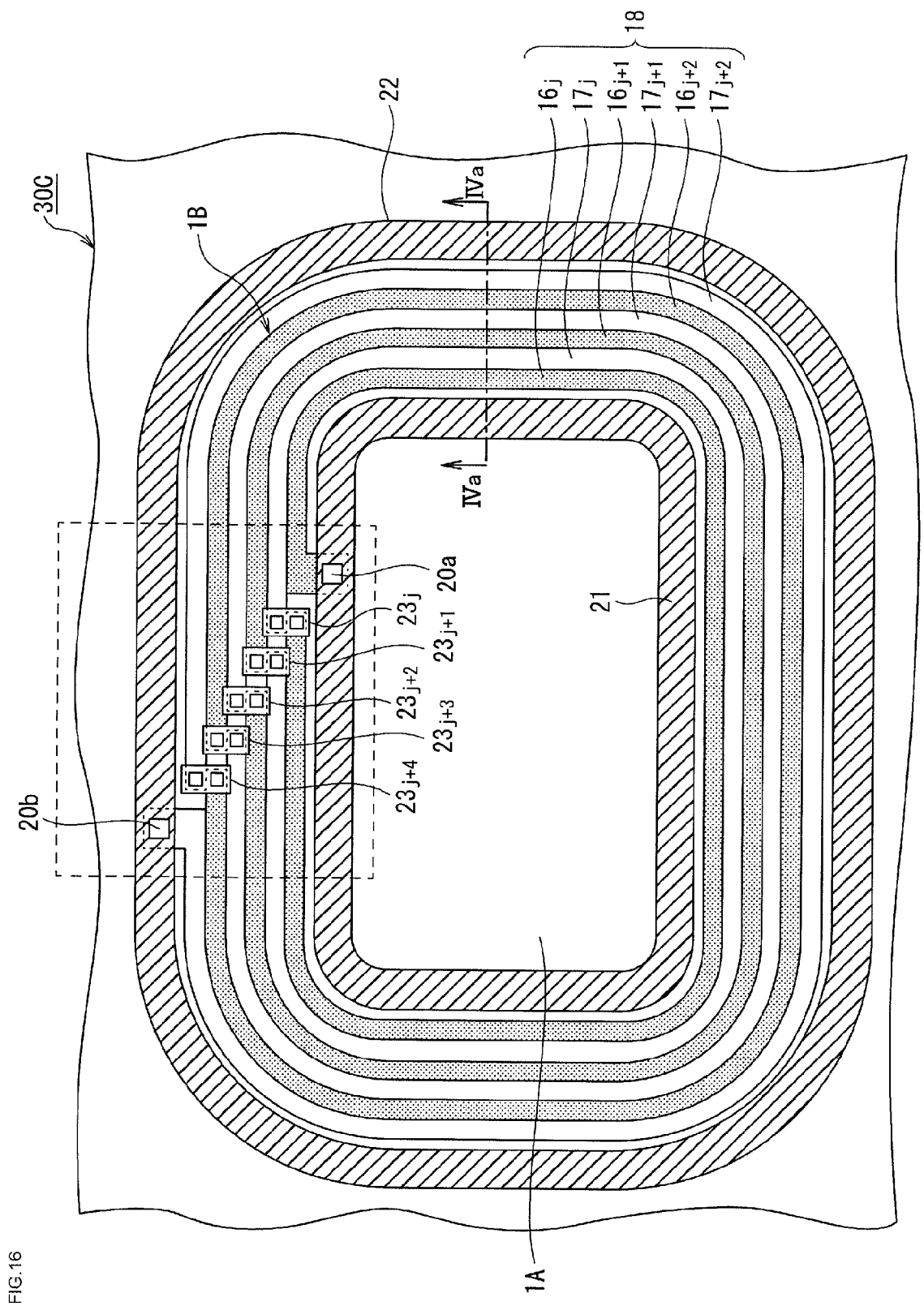
FIG. 16 is a main portion plan view showing a schematic configuration of a semiconductor device according to a third embodiment of the disclosure.

As shown in FIG. 16, the first main electrode terminal 21 and second main electrode terminal 22 are each configured in a ring-form planar pattern extending in an annular form so as to enclose the circuit formation region 1A of the upper surface of the semiconductor base 1. The second main electrode terminal 22 is disposed distanced from the first main electrode terminal 21 in a position enclosing the first main electrode terminal 21 above the upper surface of the semiconductor base 1.

The field insulating film 14 has the aperture portion $14x$ and aperture portion $14y$, as shown in FIG. 18. Also, although also omitted from the drawings in the third embodiment, the field insulating film 14, in the same way as in the first embodiment, has the aperture portion $14d$ shown in FIG. 5, the aperture portion $14e$ shown in FIG. 6, the aperture portion $14h$ shown in FIG. 7, the aperture portion $14i$ shown in FIG. 8, and the aperture portion $14m$ shown in FIG. 9, as seen when referring to FIGS. 5 through 9 of the first embodiment.

Figure 17:
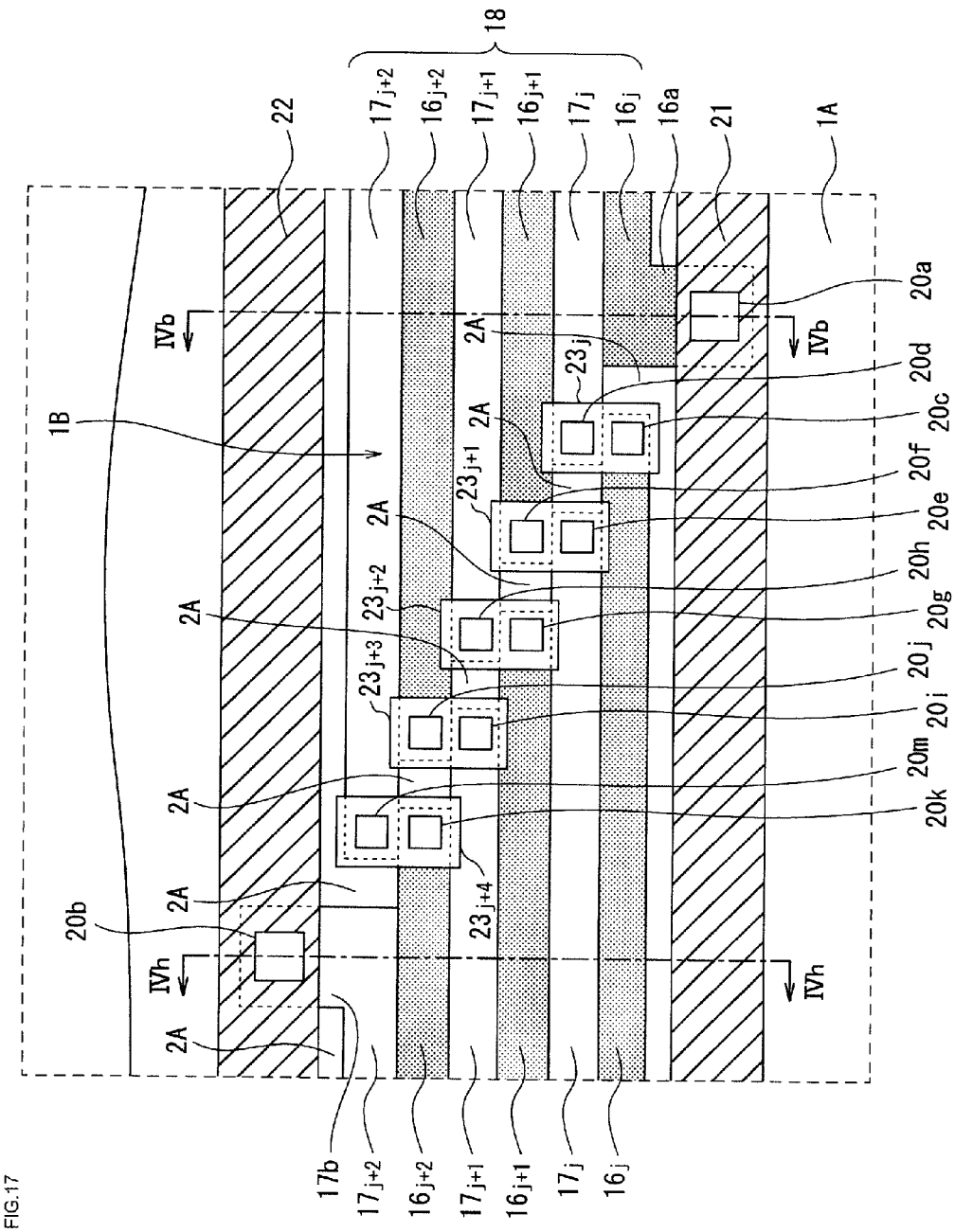
FIG. 17 is an enlarged plan view wherein the region enclosed by dotted lines in FIG. 16 is enlarged.

As shown in FIGS. 16 through 18, the resistive element 18, which is a field plate, is disposed in the projection region 1B between the first main electrode terminal 21 and second main electrode terminal 22 when seen from a direction perpendicular to the upper surface of the semiconductor base 1. The resistive element 18 is of the same configuration as in the first and second embodiments. That is, the resistive element 18 is of a configuration wherein the diffusion resistance regions $17_j$, $17_{j+1}$, and $17_{j+2}$ provided in an upper portion of the semiconductor base 1, and the thin film resistance layers $16_j$, $16_{j+1}$, and $16_{j+2}$ isolated and distanced from the semiconductor base 1 and diffusion resistance regions $17_j$, $17_{j+1}$, and $17_{j+2}$ across the field insulating film 14 and interlayer dielectric 15 acting as insulating films, are alternately connected one by one in series. Also, the resistive element 18 is of a configuration wherein the thin film resistance layers $16_j$, $16_{j+1}$, and $16_{j+2}$ and diffusion resistance regions $17_j$, $17_{j+1}$, and $17_{j+2}$ are alternately disposed one by one in parallel. Also, the resistive element 18 is of a configuration wherein the other end sides of the thin film resistance layers $16_j$, $16_{j+1}$, and $16_{j+2}$ and the one end sides of the diffusion resistance regions $17_j$, $17_{j+1}$, and $17_{j+2}$ are electrically connected via the relay wires ($23_j$, $23_{j+2}$, $23_{j+3}$, $23_{j+4}$). Also, the resistive element 18 is configured in a planar pattern that loops around in spiral form so as to enclose the first main electrode terminal 21 in the projection region 1B.

Figure 19:
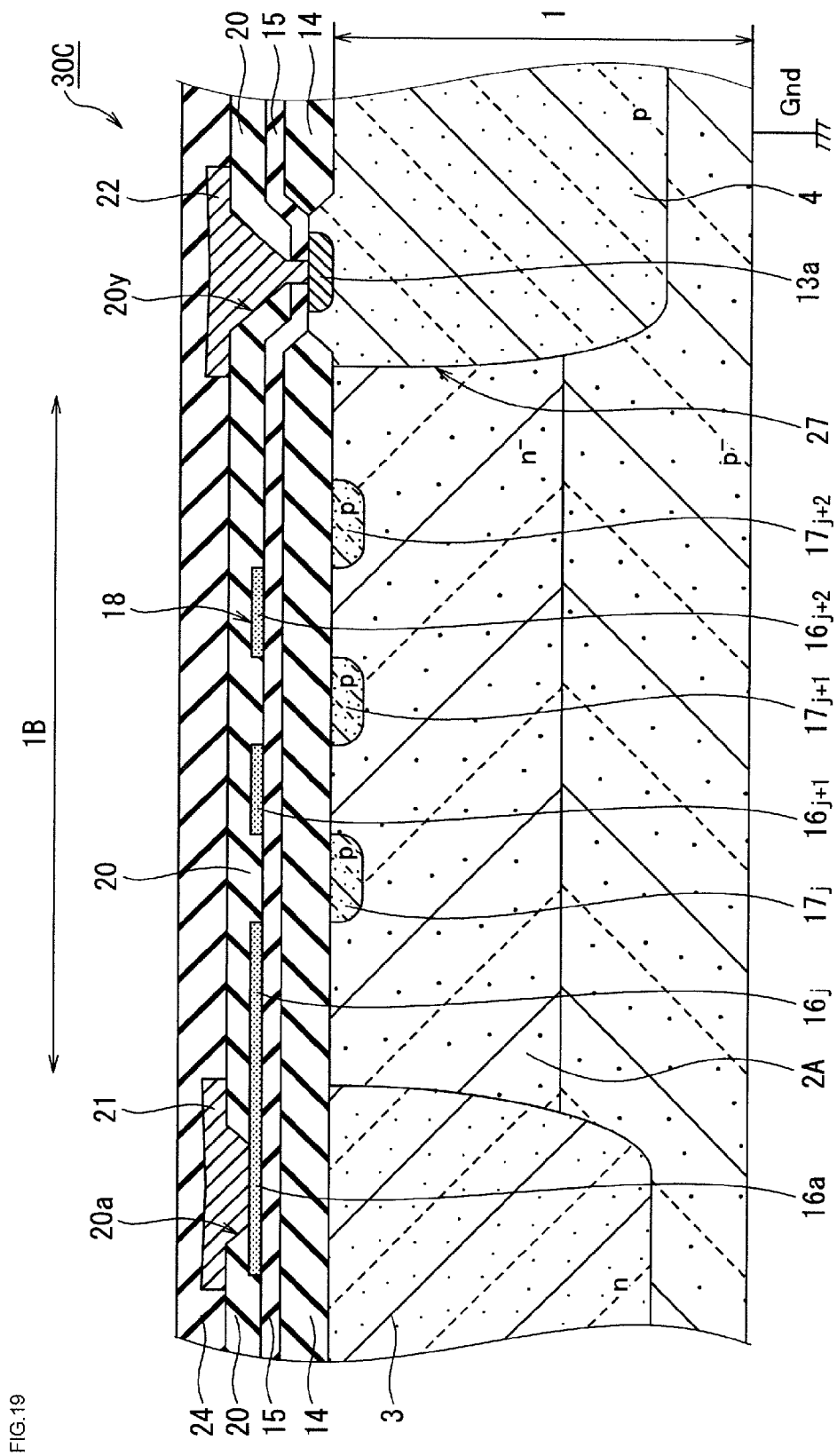
FIG. 19 is a main portion sectional view showing a sectional structure along a IVb-IVb line of FIG. 17.

Also, as shown in FIGS. 17 and 19, the resistive element 18 has the drawn-out portion $16a$ drawn out from the first loop path so as to overlap with one portion of the first main electrode terminal 21 on the one end side of the thin film resistance layer $16_j$ of the first loop. The one portion of the first main electrode terminal 21 is electrically and mechanically connected to the contact portion of the drawn-out portion $16a$ via the contact hole $20a$ penetrating the interlayer dielectric 20.

Figure 20:
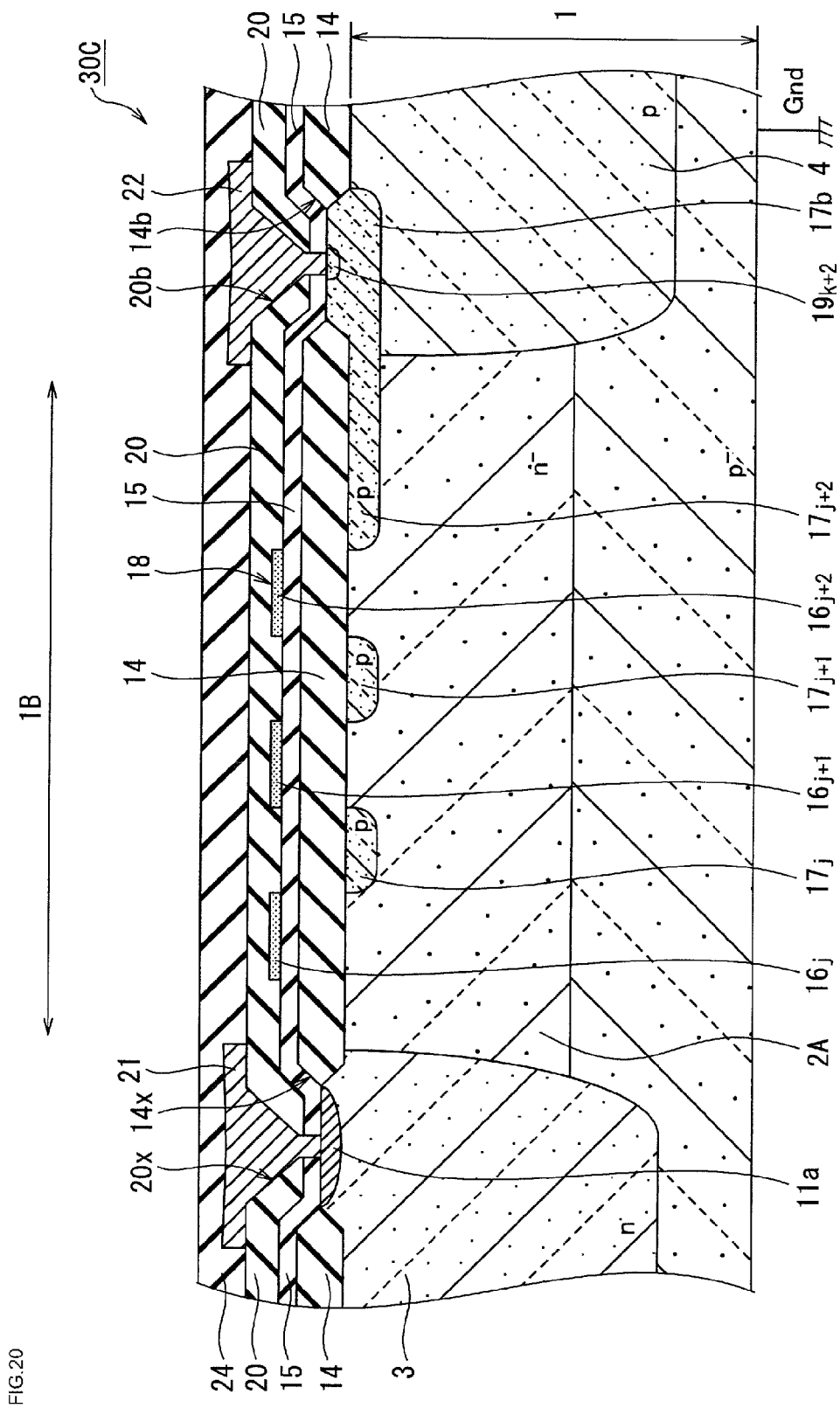
FIG. 20 is a main portion sectional view showing a sectional structure along a IVh-IVh line of FIG. 17.

Also, as shown in FIGS. 17 and 20, the resistive element 18 has the drawn-out portion $17b$ drawn out from the sixth loop path so as to overlap with one portion of the second main electrode terminal 22 on the other end side of the diffusion resistance region $17_{j+2}$ of the sixth loop. The p$^+$-type ohmic contact region $19_{k+2}$ is selectively provided in the aperture portion $14b$ of the field insulating film 14 in the interior of the drawn-out portion $17b$. The one portion of the second main electrode terminal 22 is electrically and metallurgically connected to the ohmic contact region $19_{k+2}$ through the contact hole 20b penetrating the interlayer dielectric 20 and interlayer dielectric 15, so as to form low ohmic contact resistance.

As shown in FIG. 18, the high breakdown voltage diode 27 is configured in an upper portion of the semiconductor base 1. The high breakdown voltage diode 27 has a second conductivity type (n$^+$-type) first main electrode region 11a acting as a cathode region disposed in an upper portion of the n-type well region 3 (or drift region 2A) in the interior of the aperture portion 14x of the field insulating region 14, and a first conductivity type (p$^+$-type) second main electrode region 13a acting as an anode region disposed in an upper portion of the p-type well region 4 in the interior of the aperture portion 14y of the field insulating region 14. The first main electrode region 11a, in the same way as the first main electrode region 11 according to the first embodiment, is of a configuration extending in ring form along the planar pattern of the first main electrode terminal 21. The second main electrode region 13a, in the same way as the pick-up region 13 according to the first embodiment, is of a configuration extending in ring form along the planar pattern of the second main electrode terminal 21.

As shown in FIG. 18, one portion of the first main electrode terminal 21 is electrically and metallurgically connected to the first main electrode region 11a, through the contact hole 20x penetrating the interlayer dielectric 20 and interlayer dielectric 15, so as to form low ohmic contact resistance. Also, one portion of the second main electrode terminal 22 is electrically and metallurgically connected to the second main electrode region 13a, through the contact hole 20y penetrating the interlayer dielectric 20 and interlayer dielectric 15, so as to form low ohmic contact resistance. That is, in the semiconductor device 30C according to the third embodiment, one end side of the resistive element 18 is electrically connected via the first main electrode terminal 21 to the first main electrode region 11a of the high breakdown voltage diode 27, as is clear from FIGS. 18 and 19, and the other end side of the resistive element 18 is electrically connected via the second main electrode terminal 22 to the second main electrode region 12 of the high breakdown voltage diode 27, as is clear from FIGS. 18 and 20.

As shown in FIGS. 16 through 18, the semiconductor device 30C according to the third embodiment includes the resistive element 18 wherein the diffusion resistance regions $17_j$, $17_{j+1}$, and $17_{j+2}$ provided in an upper portion of the semiconductor base 1, and the thin film resistance layers $16_j$, $16_{j+1}$, and $16_{j+2}$ isolated and distanced from the semiconductor base 1 and diffusion resistance regions $17_j$, $17_{j+1}$, and $17_{j+2}$ across the field insulating film 14 and interlayer dielectric 15 acting as insulating films, are alternately connected in series and alternately disposed in parallel. Consequently, the semiconductor device 30C according to the third embodiment too, in the same way as the semiconductor devices 30A and 30B according to the first and second embodiments, is such that an increase in the resistance of the resistive element 18 can be achieved while restricting an increase in the size of the semiconductor device 30C itself. Also, the semiconductor device 30C according to the third embodiment too, in the same way as the semiconductor devices 30A and 30B according to the first and second embodiments, is such that a reduction in power consumption when on standby can be achieved while restricting an increase in the size of the semiconductor device 30C itself.

Also, as shown in FIG. 18, the semiconductor device 30C according to the third embodiment includes the high breakdown voltage diode 27 as a high breakdown voltage active element to which the field plate effect is applied. Further, the drift region 2A of the high breakdown voltage diode 27 is provided in an upper portion of the semiconductor base 1 so as to oppose the resistive element 18. Further, the diffusion resistance regions $17_j$, $17_{j+1}$, and $17_{j+2}$ of the resistive element 18 are provided in the interior of the drift region 2A. Consequently, the semiconductor device 30C according to the third embodiment is also such that the electrical field in the voltage withstanding structure portion can be relaxed, thus achieving an increase in breakdown voltage. Also, a pseudo double RESURF structure can be configured.

Fourth Embodiment

Although a semiconductor device 30D according to a fourth embodiment of the disclosure is of practically the same configuration as the semiconductor device 30B according to the second embodiment, the configuration of the resistive element acting as the resistive field plate is slightly different.

As shown in FIG. 23, the semiconductor device 30D according to the fourth embodiment of the disclosure includes the semiconductor base 1, a resistive element 18A provided as a resistive field plate on the upper surface side of the semiconductor base 1, and a field insulating film 34, an interlayer dielectric 35, and the interlayer dielectric 20 sequentially provided on the upper surface of the semiconductor base 1. Also, the semiconductor device 30D according to the fourth embodiment includes the first main electrode terminal 21 and second main electrode terminal 22 provided above the upper surface of the semiconductor base 1 across, for example, the field insulating film 34 and interlayer dielectric 20 acting as insulating films. Also, the semiconductor device 30D according to the fourth embodiment includes the planar gate type high breakdown voltage MOSFET 26 as a high breakdown voltage active element.

Figure 21:
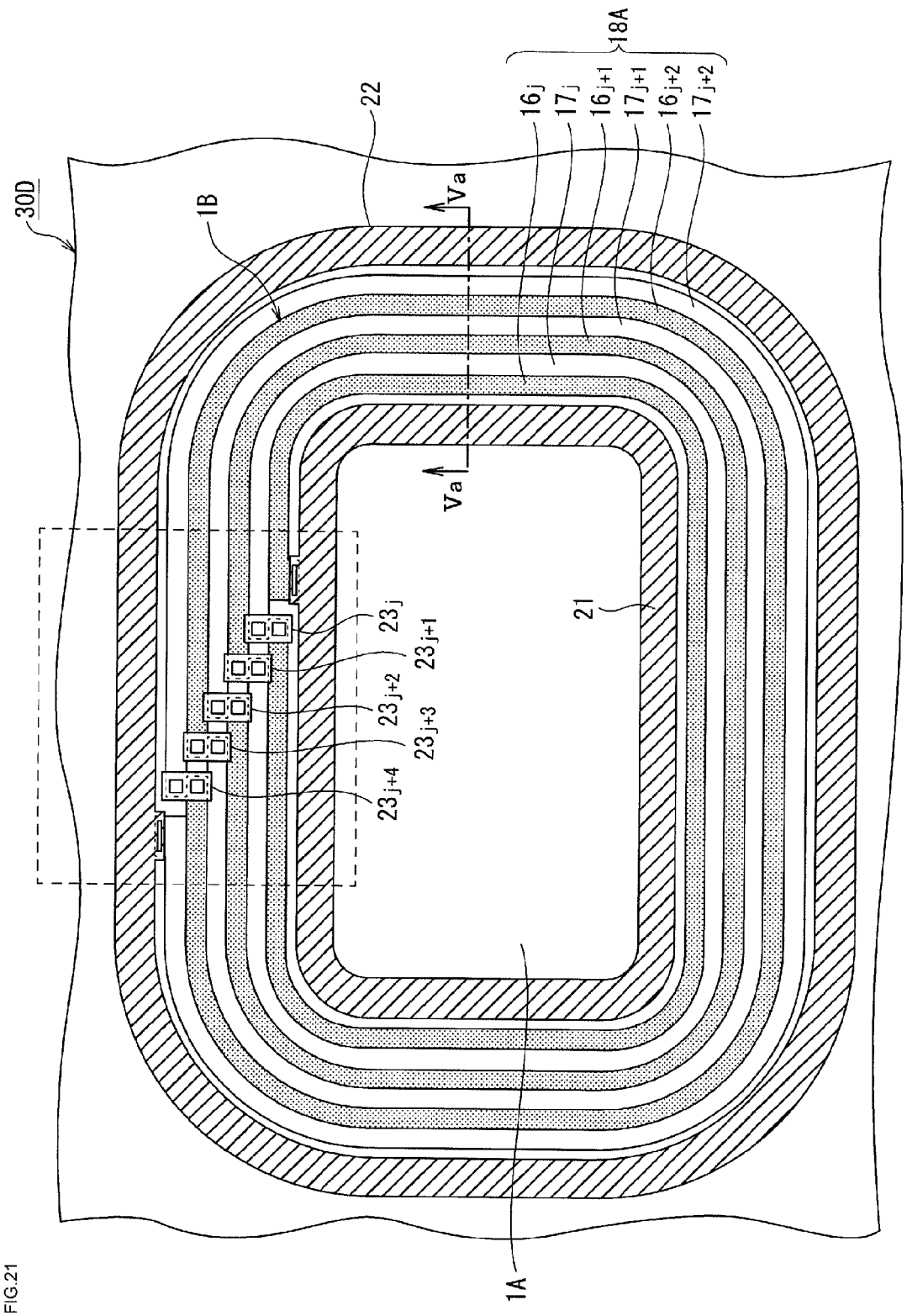
FIG. 21 is a main portion plan view showing a schematic configuration of a semiconductor device according to a fourth embodiment of the disclosure.

As shown in FIG. 21, the first main electrode terminal 21 and second main electrode terminal 22 are each configured in a ring-form planar pattern extending in an annular form so as to enclose the circuit formation region 1A of the upper surface of the semiconductor base 1. The second main electrode terminal 22 is disposed distanced from the first main electrode terminal 21 in a position enclosing the first main electrode terminal 21 above the upper surface of the semiconductor base 1.

The field insulating film 34 has an aperture portion 34w, an aperture portion 34x, and an aperture portion 34y, as shown in FIG. 23. The field insulating film 34, in the same way as the field insulating film 14 according to the first through third embodiments, is formed of a SiO$_2$ film using, for example, a selective oxidation method. The aperture portion 34w is provided in the projection region 1B, which is between the first main electrode terminal 21 and second main electrode terminal 22 when seen from a direction perpendicular to the upper surface of the semiconductor base 1. The aperture portion 34w is provided in the extension direction of the resistive element 18 in the projection region 1B. The interlayer dielectric 35, in the same way as the field insulating film 14 according to the first through third embodiments, is formed of a SiO$_2$ film using, for example, a CVD method.

Figure 22:
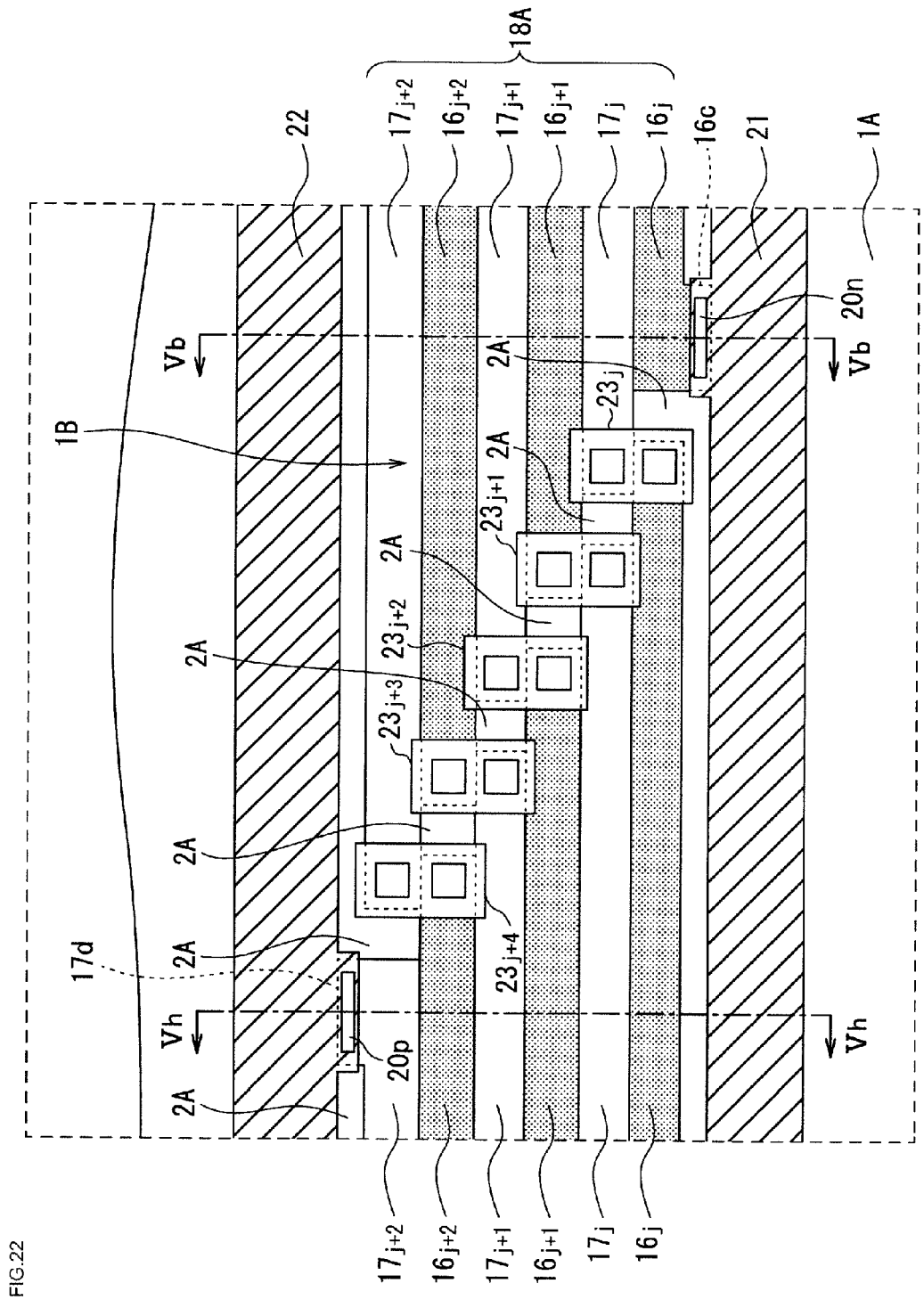
FIG. 22 is an enlarged plan view wherein the region enclosed by dotted lines in FIG. 21 is enlarged.

As shown in FIGS. 21 through 23, the resistive element 18A, which is a field plate, is disposed in the projection region 1B. The resistive element 18A is basically of the same configuration as the resistive element 18 according to the first and second embodiments, but the thin film resistance layers $16_j$, $16_{j+1}$, and $16_{j+2}$ are disposed so as to be embedded across the interlayer dielectric 35 in the interior of a groove 31 provided in the semiconductor base 1, as shown in FIG. 23. Unlike the resistive element 18 according to the first through third embodiments, the resistive element 18A is of a configuration wherein the thin film resistance layers $16_j$, $16_{j+1}$, and $16_{j+2}$ and diffusion resistance regions $17_j$, $17_{j+1}$, and $17_{j+2}$ are disposed in the same plane so that each is of practically the same height.

As shown in FIGS. 21 through 23, the resistive element 18A is of a configuration wherein the diffusion resistance regions $17_j$, $17_{j+1}$, and $17_{j+2}$ provided in an upper portion of the semiconductor base 1, and the thin film resistance layers $16_j$, $16_{j+1}$, and $16_{j+2}$ disposed across the interlayer dielectric 35 in the interior of the groove 31 of the semiconductor base 1 and isolated and distanced from the semiconductor base 1 and diffusion resistance regions $17_j$, $17_{j+1}$, and $17_{j+2}$ across the interlayer dielectric 35 acting as an insulating film, are alternately connected one by one in series. Also, the resistive element 18A is of a configuration wherein the thin film resistance layers $16_j$, $16_{j+1}$, and $16_{j+2}$ and diffusion resistance regions $17_j$, $17_{j+1}$, and $17_{j+2}$ are alternately disposed one by one in parallel. Also, the resistive element 18A is of a configuration wherein the other end sides of the thin film resistance layers $16_j$, $16_{j+1}$, and $16_{j+2}$ and the one end sides of the diffusion resistance regions $17_j$, $17_{j+1}$, and $17_{j+2}$ are electrically connected via the relay wires ($23_j$, $23_{j+1}$, $23_{j+2}$, $23_{j+3}$, $23_{j+4}$). Also, the resistive element 18A is configured in a planar pattern that loops around in spiral form so as to enclose the first main electrode terminal 21 in the projection region 1B.

Figure 24:
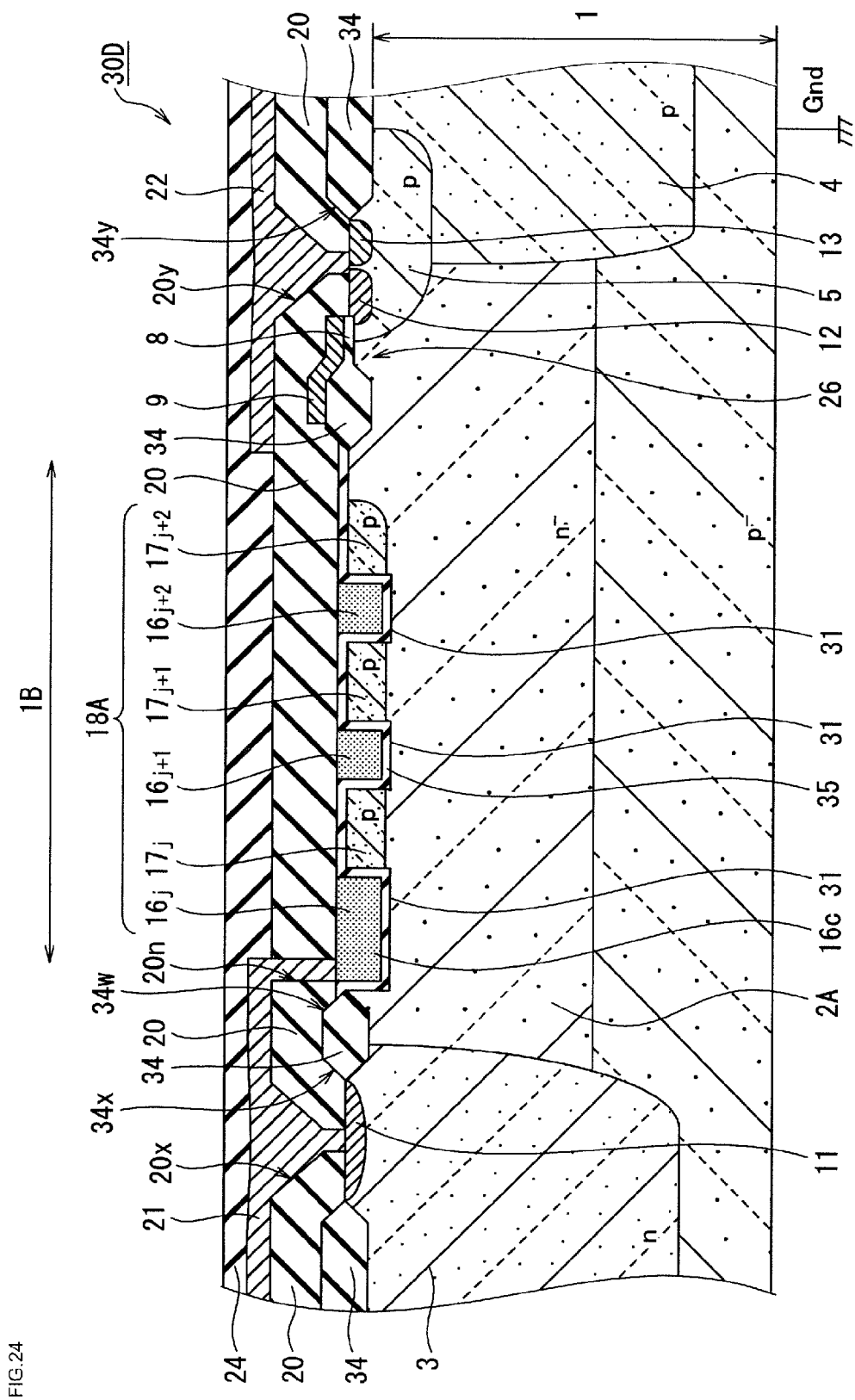
FIG. 24 is a main portion sectional view showing a sectional structure along a Vb-Vb line of FIG. 22.

Also, as shown in FIGS. 22 and 24, the resistive element 18A has a drawn-out portion 16c drawn out from the first loop path so as to overlap with one portion of the first main electrode terminal 21 on the one end side of the thin film resistance layer $16_j$ of the first loop. The one portion of the first main electrode terminal 21 is electrically and metallurgically connected to the contact portion of the drawn-out portion 16c through a contact hole 20n penetrating the interlayer dielectric 20.

Figure 25:
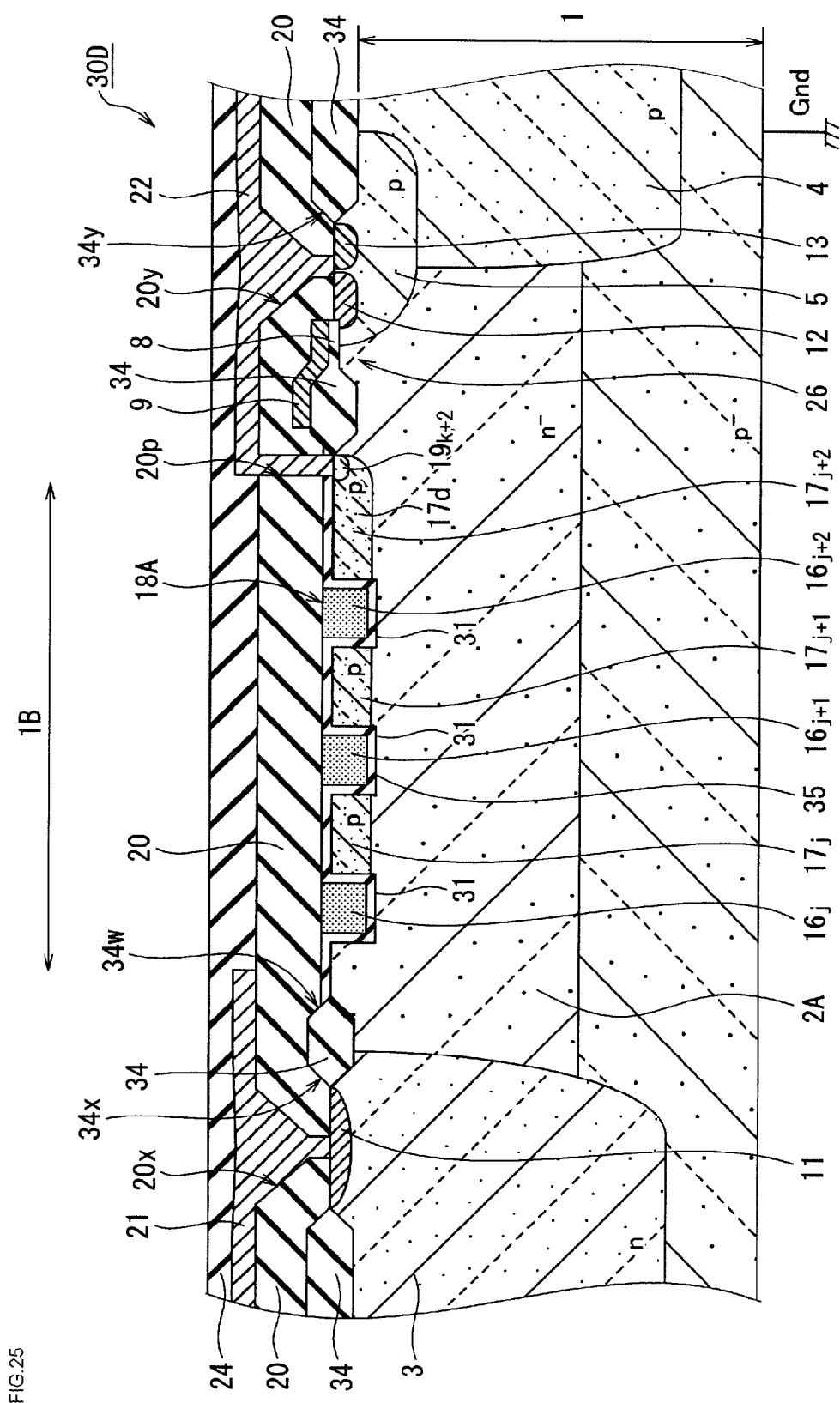
FIG. 25 is a main portion sectional view showing a sectional structure along a Vh-Vh line of FIG. 22.

Also, as shown in FIGS. 22 and 25, the resistive element 18A has a drawn-out portion 17d drawn out from the sixth loop path so as to overlap with one portion of the second main electrode terminal 22 on the other end side of the diffusion resistance region $17_{j+2}$ of the sixth loop. The p+-type ohmic contact region $19_{k+2}$ is selectively provided in the interior of the drawn-out portion 17d. The one portion of the second main electrode terminal 22 is electrically and metallurgically connected to the ohmic contact region $19_{k+2}$ through a contact hole 20p penetrating the interlayer dielectric 20, so as to form low ohmic contact resistance.

Also, although not shown in detail, the resistive element 18A is such that, in the same way as the resistive element 18 according to the first through third embodiments, the other end sides of the thin film resistance layers $16_j$, $16_{j+1}$, and $16_{j+2}$ positioned on the path of a preceding loop and the one end sides of the diffusion resistance regions $17_j$, $17_{j+1}$, and $17_{j+2}$ positioned on the path of a subsequent loop are disposed so as to be neighboring in the array direction, and the other end sides of the thin film resistance layers $16_j$, $16_{j+1}$, and $16_{j+2}$ positioned on the path of a preceding loop and the one end sides of the diffusion resistance regions $17_j$, $17_{j+1}$, and $17_{j+2}$ positioned on the path of a subsequent loop are electrically connected via the relay wires ($23_j$, $23_{j+1}$, $23_{j+2}$, $23_{j+3}$, $23_{j+4}$), as seen by referring to FIG. 22. Although not shown, connection of the thin film resistance layers $16_j$, $16_{j+1}$, and $16_{j+2}$ and diffusion resistance regions $17_j$, $17_{j\pm1}$, and $17_{j+2}$ with the relay wires ($23_j$, $23_{j+1}$, $23_{j+2}$, $23_{j+3}$, $23_{j+4}$) is carried out through contact holes penetrating the interlayer dielectric 20.

In the semiconductor device 30D according to the fourth embodiment, in the same way as in the semiconductor device 30B according to the second embodiment, one end side of the resistive element 18A is electrically connected via the first main electrode terminal 21 to the first main electrode region 11 of the high breakdown voltage MOSFET 26, as is clear from FIGS. 23 and 24, and the other end side of the resistive element 18A is electrically connected via the second main electrode terminal 22 to the second main electrode region 12 and pick-up region 13 of the high breakdown voltage MOSFET 26, as is clear from FIGS. 23 and 25.

As shown in FIGS. 21 through 23, the semiconductor device 30D according to the fourth embodiment includes the resistive element 18A wherein the diffusion resistance regions $17_j$, $17_{j+1}$, and $17_{j+2}$ provided in an upper portion of the semiconductor base 1, and the thin film resistance layers $16_j$, $16_{j+1}$, and $16_{j+2}$ isolated and distanced from the semiconductor base 1 and diffusion resistance regions $17_j$, $17_{j+1}$, and $17_{j+2}$ across the interlayer dielectric 35 acting as an insulating film, are alternately connected in series and alternately disposed in parallel. Consequently, the semiconductor device 30D according to the fourth embodiment too, in the same way as the semiconductor devices 30A, 30B, and 30C according to the first through third embodiments, is such that an increase in the resistance of the resistive element 18A can be achieved while restricting an increase in the size of the semiconductor device 30D itself. Also, the semiconductor device 30D according to the fourth embodiment too, in the same way as the semiconductor devices 30A, 30B, and 30C according to the first through third embodiments, is such that a reduction in power consumption when on standby can be achieved while restricting an increase in the size of the semiconductor device 30D itself.

Also, as shown in FIG. 23, the semiconductor device 30D according to the fourth embodiment includes the high breakdown voltage MOSFET 26 as a high breakdown voltage active element to which the field plate effect is applied. Further, the drift region 2A of the high breakdown voltage MOSFET 26 is provided in an upper portion of the semiconductor base 1 so as to oppose the resistive element 18A. Further, the diffusion resistance regions $17_j$, $17_{j+1}$, and $17_{j+2}$ of the resistive element 18A are provided in the interior of the drift region 2A. Consequently, the semiconductor device 30D according to the fourth embodiment is also such that the electrical field in the voltage withstanding structure portion can be relaxed, thus achieving an increase in breakdown voltage. Also, a pseudo double RESURF structure can be configured.

Also, in the semiconductor device 30D according to the fourth embodiment, the resistive element 18A is such that the thin film resistance layers $16_j$, $16_{j+1}$, and $16_{j+2}$ are disposed across the interlayer dielectric 35 in the interior of the groove 31 of the semiconductor base 1 so that each of the thin film resistance layers $16_j$, $16_{j+1}$, and $16_{j+2}$ and diffusion resistance regions $17_j$, $17_{j+1}$, and $17_{j+2}$ is of practically the same height. Consequently, according to the semiconductor device 30D according to the fourth embodiment, the distribution of an equipotential line owing to the field plate effect of the resistive element 18A is more even, because of which breakdown voltage can be increased in comparison with the semiconductor devices 30A, 30B, and 30C according to the first through third embodiments, which include the resistive element 18.

Fifth Embodiment

For the semiconductor device 30D according to the fourth embodiment, a description has been given of a case in which the semiconductor device 30D includes the high breakdown voltage MOSFET 26 as a high breakdown voltage element to which the field plate effect is applied, as shown in FIG. 23. As opposed to this, a semiconductor device 30E according to a fifth embodiment of the disclosure includes the high breakdown voltage diode 27 as a high breakdown voltage element to which the field plate effect is applied.

Figure 27:
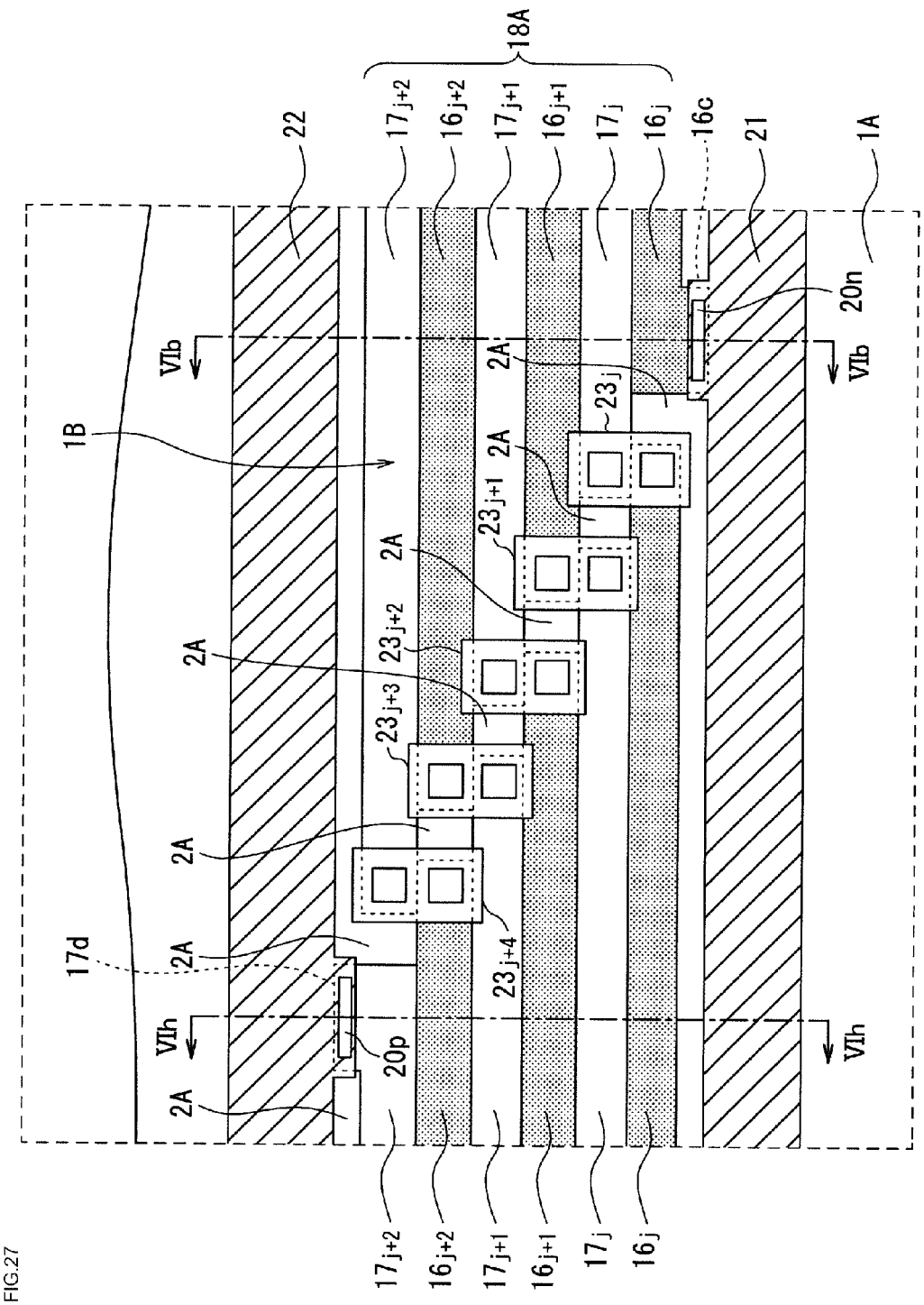
FIG. 27 is an enlarged plan view wherein the region enclosed by dotted lines in FIG. 26 is enlarged.
Figure 28:
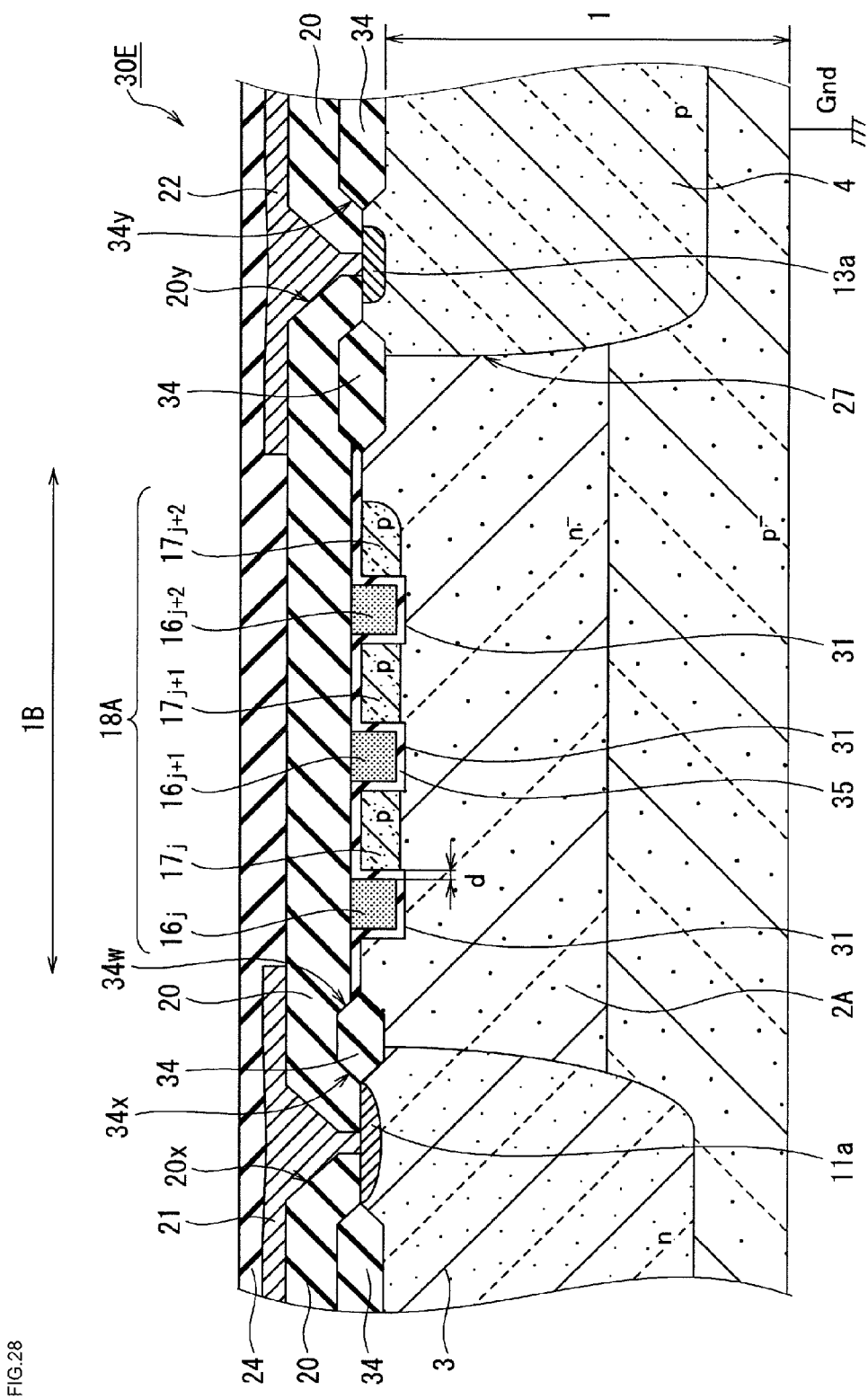
FIG. 28 is a main portion sectional view showing a sectional structure along a VIa-VIa line of FIG. 26.

As shown in FIG. 28, the semiconductor device 30E according to the fifth embodiment of the disclosure includes the semiconductor base 1, the resistive element 18A provided as a resistive field plate on the upper surface side of the semiconductor base 1, and the field insulating film 34, interlayer dielectric 35, and interlayer dielectric 20 sequentially provided on the upper surface of the semiconductor base 1. Also, the semiconductor device 30E according to the fifth embodiment includes the first main electrode terminal 21 and second main electrode terminal 22 provided above the upper surface of the semiconductor base 1 across, for example, the field insulating film 34, interlayer dielectric 35, and interlayer dielectric 20 acting as insulating films. Also, the semiconductor device 30E according to the fifth embodiment includes the high breakdown voltage diode 27 as a high breakdown voltage active element. The resistive element 18A, which is a resistive field plate, is of the same configuration as the resistive element 18A according to the fourth embodiment, as shown in FIGS. 26 through 30.

Figure 29:
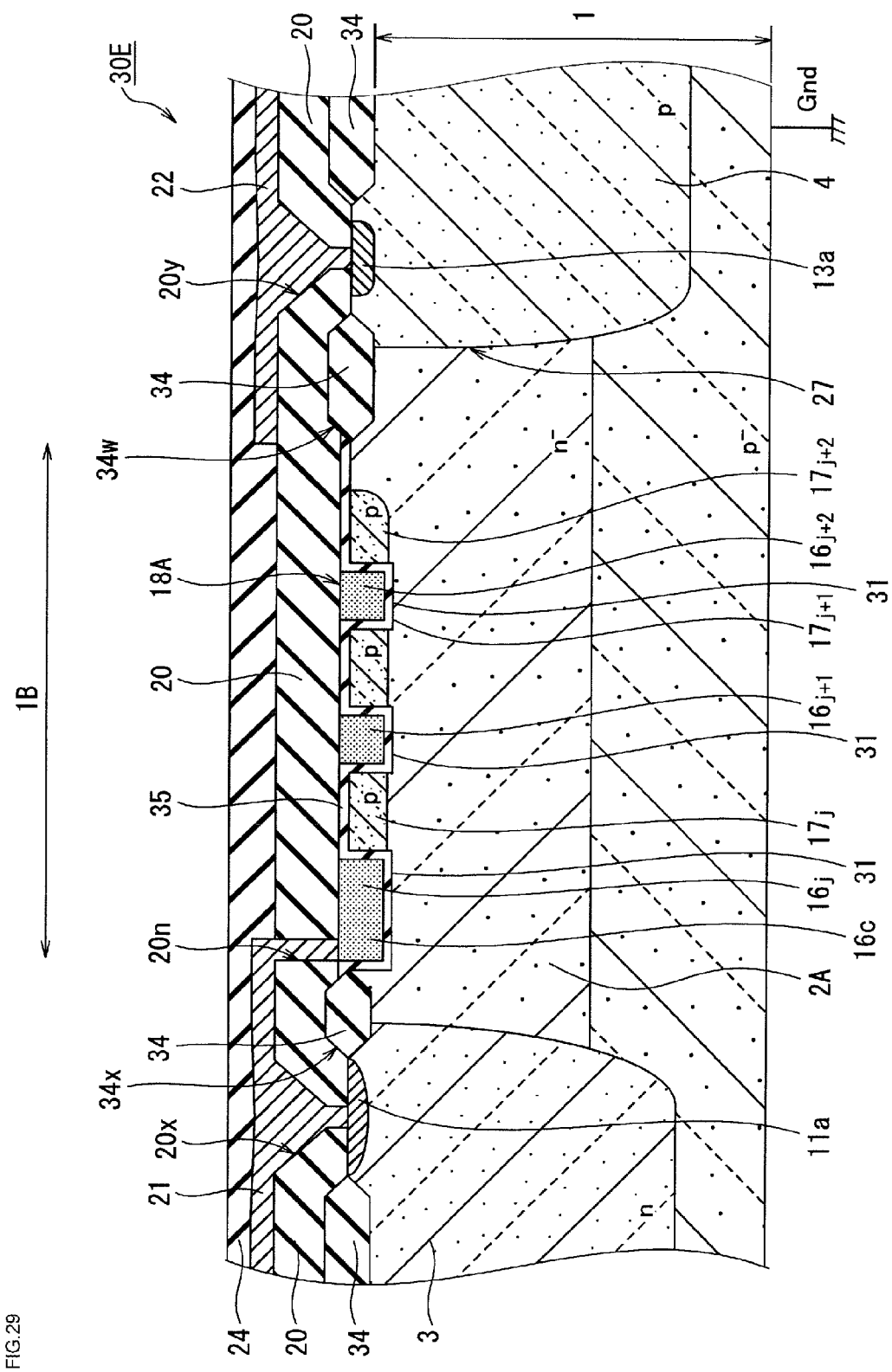
FIG. 29 is a main portion sectional view showing a sectional structure along a VIb-VIb line of FIG. 27.
Figure 30:
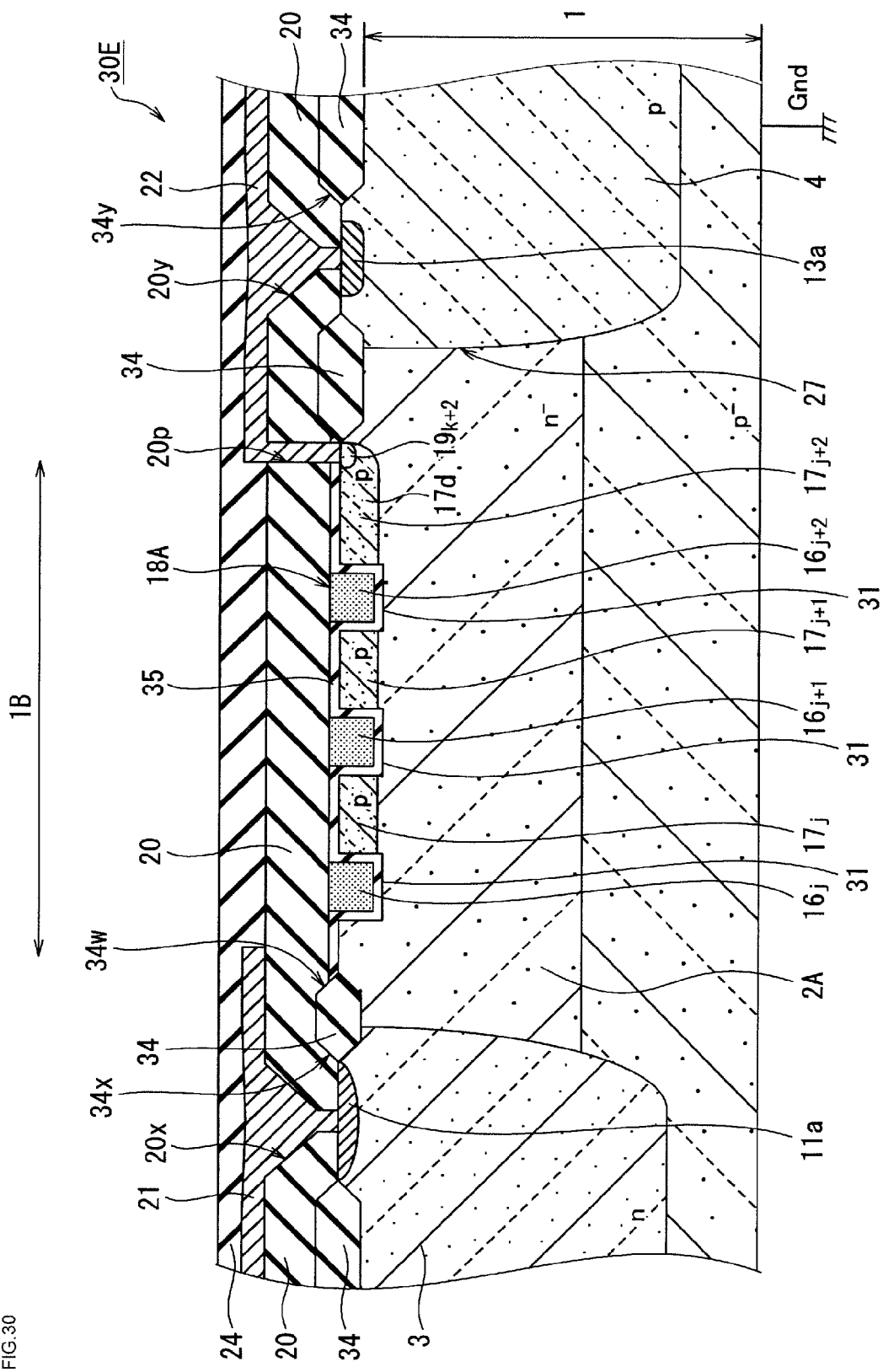
FIG. 30 is a main portion sectional view showing a sectional structure along a VIh-VIh line of FIG. 27.

In the semiconductor device 30E according to the fifth embodiment, in the same way as in the semiconductor device 30C according to the third embodiment, one end side of the resistive element 18A is electrically connected via the first main electrode terminal 21 to the first main electrode region 11a of the high breakdown voltage diode 27, as is clear from FIGS. 28 and 29, and the other end side of the resistive element 18A is electrically connected via the second main electrode terminal 22 to the second main electrode region 13a of the high breakdown voltage diode 27, as is clear from FIGS. 28 and 30.

Figure 26:
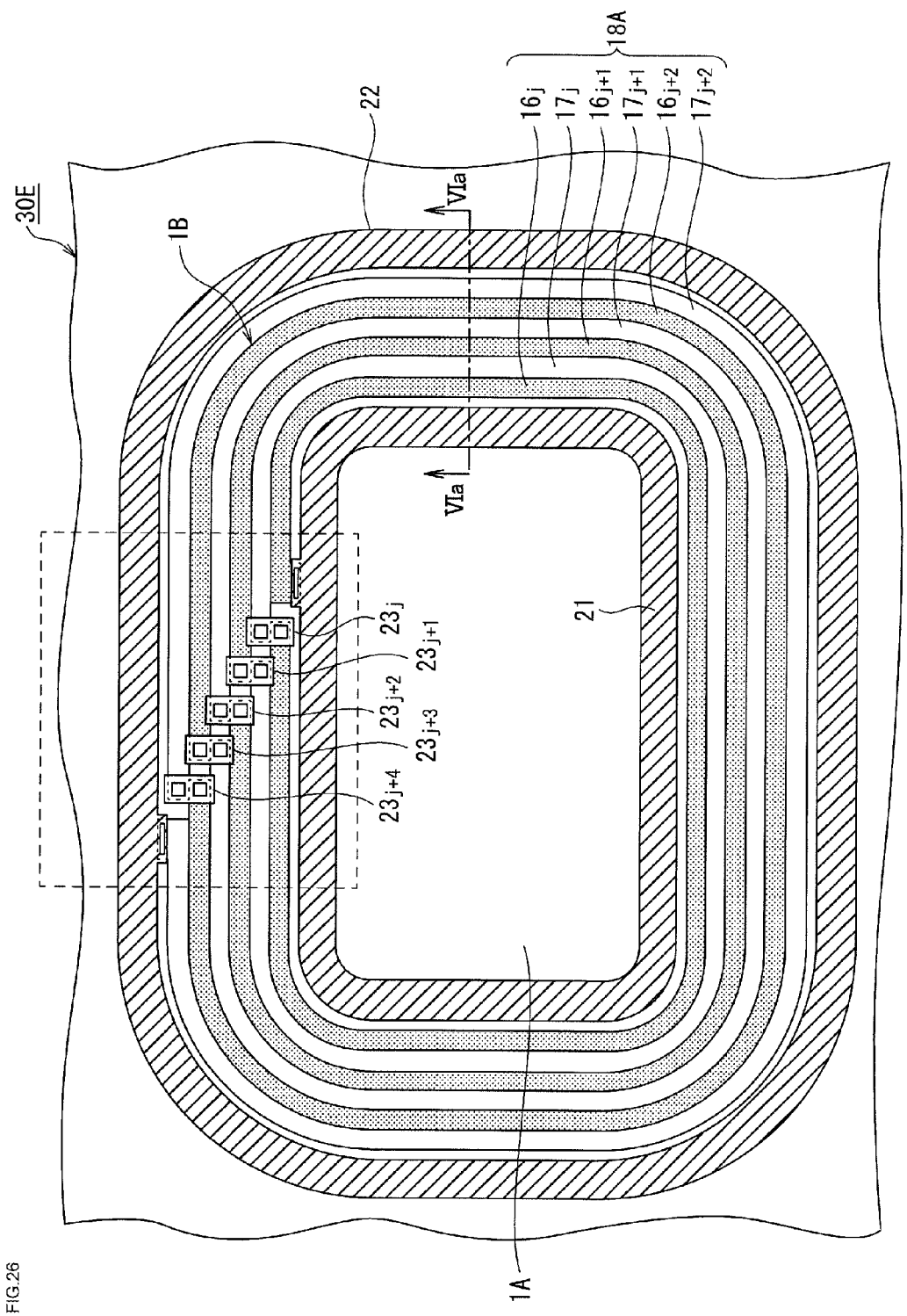
FIG. 26 is a main portion plan view showing a schematic configuration of a semiconductor device according to a fifth embodiment of the disclosure.

As shown in FIGS. 26 through 28, the semiconductor device 30E according to the fifth embodiment includes the resistive element 18A wherein the diffusion resistance regions $17_j$, $17_{j+1}$, and $17_{j+2}$ provided in an upper portion of the semiconductor base 1, and the thin film resistance layers $16_j$, $16_{j+1}$, and $16_{j+2}$ isolated and distanced from the semiconductor base 1 and diffusion resistance regions $17_j$, $17_{j+1}$, and $17_{j+2}$ across the interlayer dielectric 35 acting as an insulating film, are alternately connected in series and alternately disposed in parallel. Consequently, the semiconductor device 30E according to the fifth embodiment too, in the same way as the semiconductor devices 30A, 30B, 30C, and 30D according to the first through fourth embodiments, is such that an increase in the resistance of the resistive element 18A can be achieved while restricting an increase in the size of the semiconductor device 30E itself. Also, the semiconductor device 30E according to the fifth embodiment too, in the same way as the semiconductor devices 30A, 30B, 30C, and 30D according to the first through fourth embodiments, is such that a reduction in power consumption when on standby can be achieved while restricting an increase in the size of the semiconductor device 30E itself.

Also, as shown in FIG. 29, the semiconductor device 30E according to the fifth embodiment includes the high breakdown voltage diode 27 as a high breakdown voltage active element to which the field plate effect is applied. Further, the drift region 2A of the high breakdown voltage diode 27 is provided in an upper portion of the semiconductor base 1 so as to oppose the resistive element 18A. Further, the diffusion resistance regions $17_j$, $17_{j+1}$, and $17_{j+2}$ of the resistive element 18A are provided in the interior of the drift region 2A. Consequently, the semiconductor device 30E according to the fifth embodiment is also such that the electrical field in the voltage withstanding structure portion can be relaxed, thus achieving an increase in breakdown voltage. Also, a pseudo double RESURF structure can be configured.

Also, in the semiconductor device 30E according to the fifth embodiment, the resistive element 18A is such that the thin film resistance layers $16_j$, $16_{j+1}$, and $16_{j+2}$ are disposed across the interlayer dielectric 35 in the interior of the groove 31 of the semiconductor base 1 so that each of the thin film resistance layers $16_j$, $16_{j+1}$, and $16_{j+2}$ and diffusion resistance regions $17_j$, $17_{j+1}$, and $17_{j+2}$ is of practically the same height. Consequently, the semiconductor device 30E according to the fifth embodiment is also such that the distribution of an equipotential line owing to the field plate effect of the resistive element 18A is more even, because of which breakdown voltage can be increased in comparison with the semiconductor devices 30A, 30B, and 30C according to the first through third embodiments, which include the resistive element 18.

Sixth Embodiment

For the semiconductor devices 30A through 30E according to the first through fifth embodiments, a description has been given of a case in which one end side of a resistive element, which is a resistive field plate, is electrically connected to the first main electrode region 11, 11a of a high breakdown voltage MOSFET or high breakdown voltage diode. As opposed to this, for a semiconductor device 30F according to a sixth embodiment of the disclosure, a description will be given of a case in which one end side of a resistive element 18B is electrically connected to a VS terminal.

Figure 31:
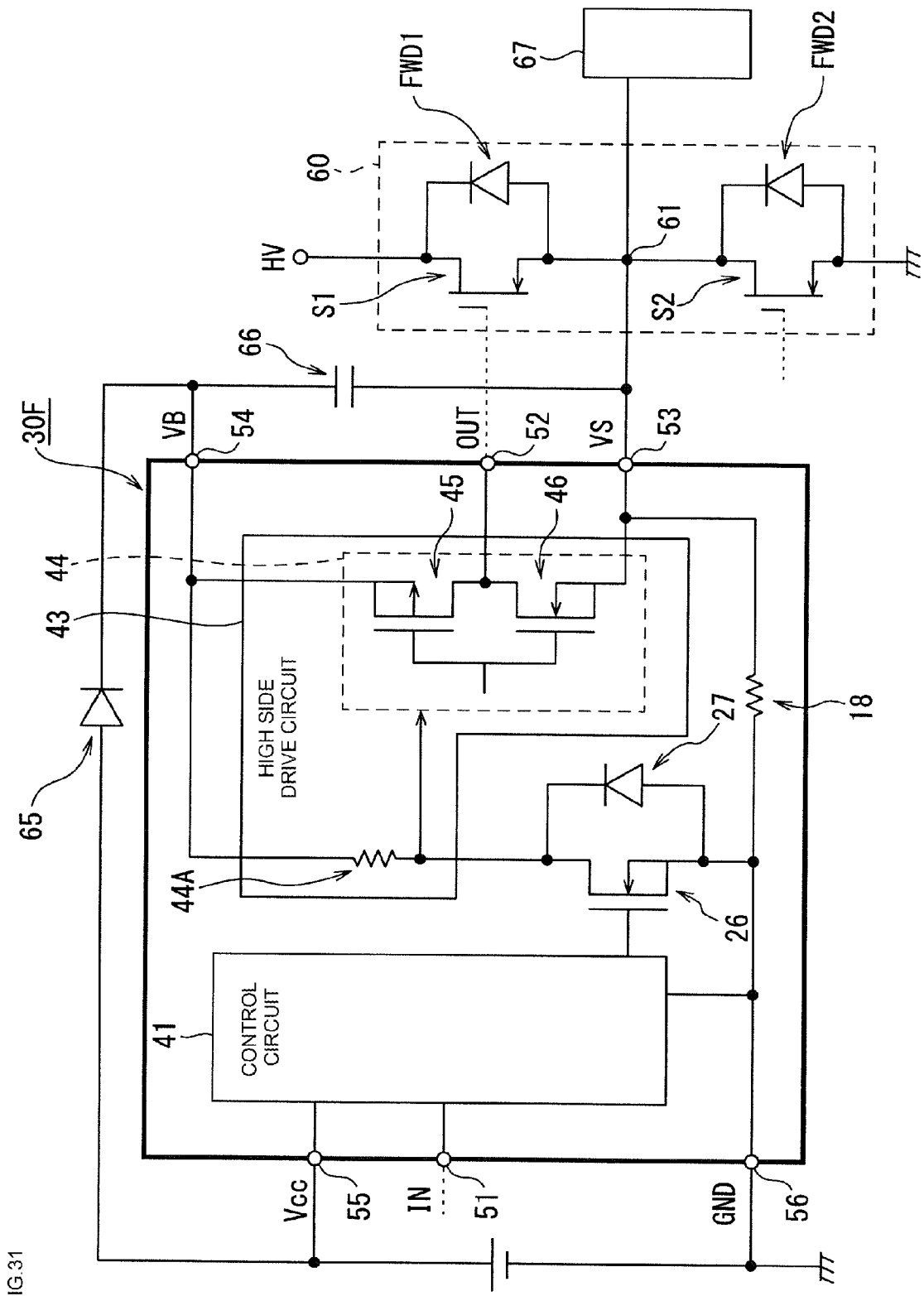
FIG. 31 is a circuit diagram showing a schematic configuration of a semiconductor device according to a sixth embodiment of the disclosure.

As shown in FIG. 31, the semiconductor device 30F according to the sixth embodiment of the disclosure is a high voltage integrated circuit including a control circuit 41, a high side drive circuit 43, a low side drive circuit (not shown), the high breakdown voltage MOSFET 26 acting as a level shifter, the high breakdown voltage diode 27 connected in anti-parallel to the high breakdown voltage MOSFET 26, the resistive element 18B acting as a resistive field plate, and the like. Also, the semiconductor device 30F according to the sixth embodiment is a high voltage integrated circuit that drives, for example, a power conversion unit 60, which is one phase of a power conversion bridge circuit, as a drive target. The semiconductor device 30F according to the sixth embodiment outputs from an output terminal 52 a drive signal that drives by turning the gate of a switching element configuring the power conversion unit 60 on and off in accordance with a signal input from an input terminal 51.

As shown in FIG. 31, the power conversion unit 60 configures a half-bridge circuit wherein a high-voltage side switching element S1 and low-voltage side switching element S2 are connected in series. The high-voltage side switching element S1 and low-voltage side switching element S2 are configured of an active element such as an IGBT. Freewheeling diodes FWD1 and FWD2 are connected in anti-parallel to the high-voltage side and low-voltage side switching elements S1 and S2 respectively.

The high-voltage side switching element S1 and low-voltage side switching element S2 are connected in series between a high voltage main power supply HV, which is the positive electrode side, and a ground (GND) potential, which is the negative electrode side of the main power supply HV. A VS terminal 53 acting as a second terminal to which a VS potential is applied as a second potential is connected to a connection point 61 of the high-voltage side switching element S1 and low-voltage side switching element S2. The connection point 61 is an output point of the power conversion unit 60, which is one phase of a power conversion bridge circuit. The low-voltage side switching element S2 is connected between the connection point 61 and GND potential. A motor, or the like, is connected to the connection point 61 as a load 67.

When the semiconductor device 30F is in operation, the VS potential applied to the VS terminal 53 repeatedly rises and falls between the high potential side potential (in the region of, for example, 400V) and low potential side potential (GND potential) of the main power supply HV, fluctuating between 0 volts and several hundred volts, owing to the high-voltage side switching element S1 configuring a high side circuit and the low-voltage side switching element S2 being turned on and off in a complementary way.

The high side drive circuit 43 includes a gate drive circuit 44, a level shift resistor 44A, and the like. The gate drive circuit 44 is configured of a CMOS circuit wherein, for example, a p-channel MOSFET (hereafter called pMOS) 45 acting as a first conductivity type channel first field-effect transistor, which is an active element, and, for example, an n-channel MOSFET (hereafter called nMOS) 46 acting as a second conductivity type channel second field-effect transistor, which is an active element, are connected in series so as to offset each other. Specifically, the source of the pMOS 45 is connected to a VB terminal 54, while the drain of the pMOS 45 is connected to the drain of the nMOS 46. The source of the nMOS 46 is connected to the VS terminal 53.

The gate drive circuit 44 operates with the VS potential applied to the VS terminal 53 as a reference potential, and a VB potential applied as a first potential to the VB terminal 54 acting as a first terminal as a power supply potential, and outputs a drive signal from the output terminal 52 based on a voltage drop signal from the level shift resistor 44A, thereby driving the high-voltage side switching element S1.

The control circuit 41 operates with the GND potential applied to a GND (ground) terminal 56 as a reference potential, and a VCC potential applied to a VCC terminal 55 as a power supply potential, and generates a low side level on/off signal for turning the high-voltage side switching element S1 on and off, and a low side level on/off signal for turning the low-voltage side switching element S2 on and off. The GND potential is a common potential.

The high breakdown voltage MOSFET 26 converts a low side level on/off signal generated by the control circuit 41 into a high side level on/off signal. The high breakdown voltage MOSFET 26 is such that the drain is connected to the level shift resistor, while the source is connected to the GND terminal 56. The one end side of the resistive element 18 is connected to the VS terminal 53, while the other end side is connected to the GND terminal 56.

The semiconductor device 30F according to the sixth embodiment is such that, when driving the high-voltage side switching element S1, a low side level on/off signal for turning the high-voltage side switching element S1 on and off is generated by the control circuit 41. The low side level on/off signal is converted into a high side level on/off signal by the high breakdown voltage MOSFET 26, and subsequently input into the high side drive circuit 43.

The on/off signal input into the high side drive circuit 43 from the control circuit 41 is input via the gate drive circuit 44 into the gate of the high-voltage side switching element S1. The high-voltage side switching element S1 is turned on and off based on the on/off signal input from the control circuit 41.

A bootstrap diode 65 acting as an external element is connected between the VCC terminal 55 and VB terminal 54. Also, a bootstrap capacitor 66 acting as an external element is connected between the VB terminal 54 and VS terminal 53. The bootstrap diode 65 and bootstrap capacitor 66 generate the drive power supply of the high-voltage side switching element S1.

The VB potential is the maximum potential applied to the semiconductor device 30F, and is maintained at in the region of 15V higher than the VS potential in the bootstrap capacitor 66 in a normal state unaffected by noise. The VS potential is the potential of the connection point (output node unit) 61 of the high-voltage side switching element S1 and low-voltage side switching element S2 of the power conversion bridge circuit, changes between 0 volts and several hundred volts during the power conversion process, and may become a negative potential.

Figure 34:
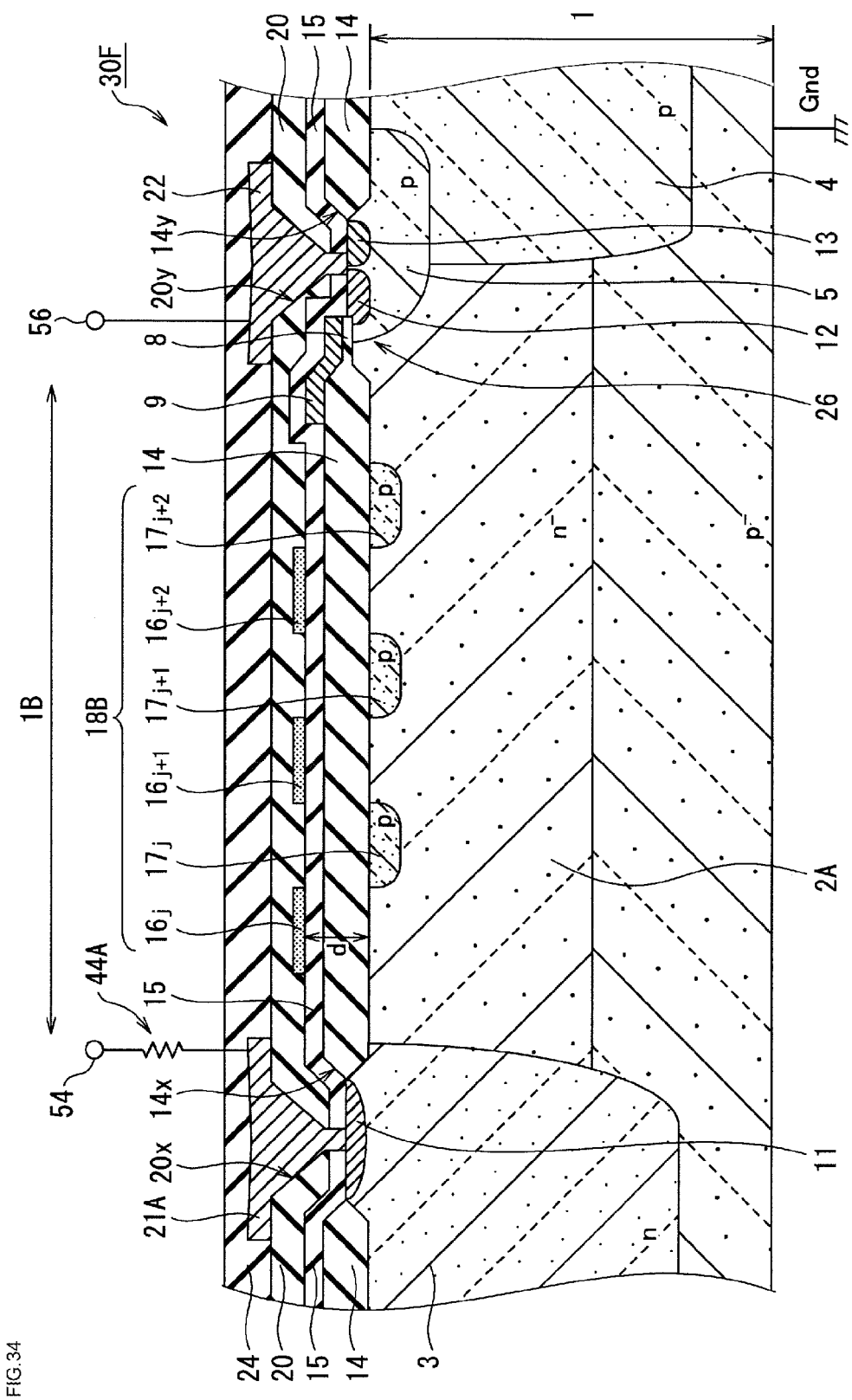
FIG. 34 is a main portion sectional view showing a sectional structure along a VIIa-VIIa line of FIG. 32.

As shown in FIG. 34, the semiconductor device 30F according to the sixth embodiment includes the semiconductor base 1, and a first main electrode terminal 21A and the second main electrode terminal 22 provided above the upper surface of the semiconductor base 1 across, for example, the field insulating film 14, interlayer dielectric 15, and interlayer dielectric 20 acting as insulating films.

Figure 32:
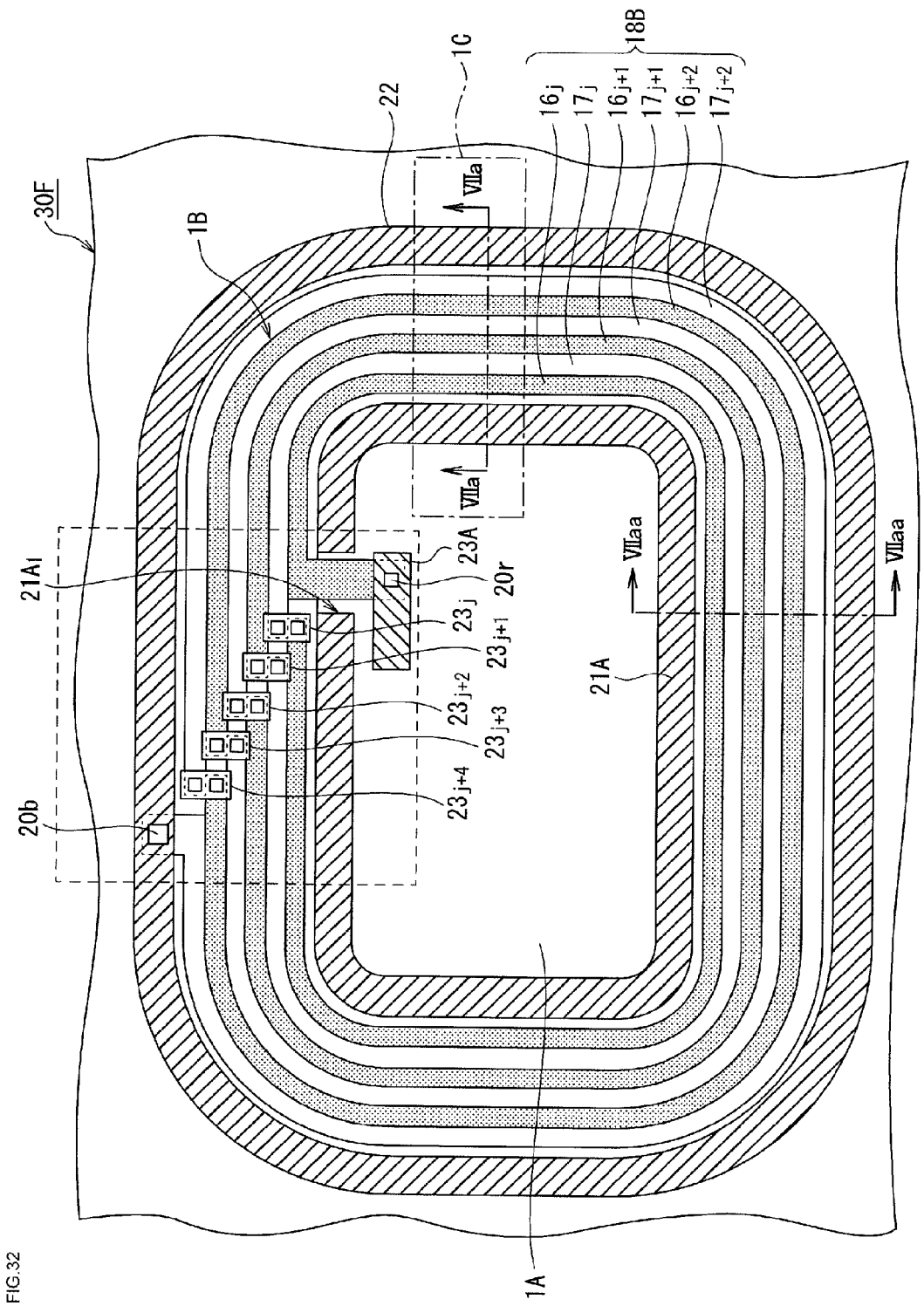
FIG. 32 is a main portion plan view showing a schematic configuration of the semiconductor device according to the sixth embodiment of the disclosure.

As shown in FIG. 32, the first main electrode terminal 21A and second main electrode terminal 22 are each configured in a ring-form planar pattern extending in an annular form so as to enclose the circuit formation region 1A of the upper surface of the semiconductor base 1. The second main electrode terminal 22 is disposed distanced from the first main electrode terminal 21A in a position enclosing the first main electrode terminal 21A above the upper surface of the semiconductor base 1. Although the first main electrode terminal 21A is basically of the same configuration as the first main electrode terminal 21, the first main electrode terminal 21A is configured in a ring-form planar pattern wherein a cutaway portion $21A_1$ is provided so that one end side and the other end side oppose each other on the same loop path, as shown in FIGS. 32 and 33.

Figure 33:
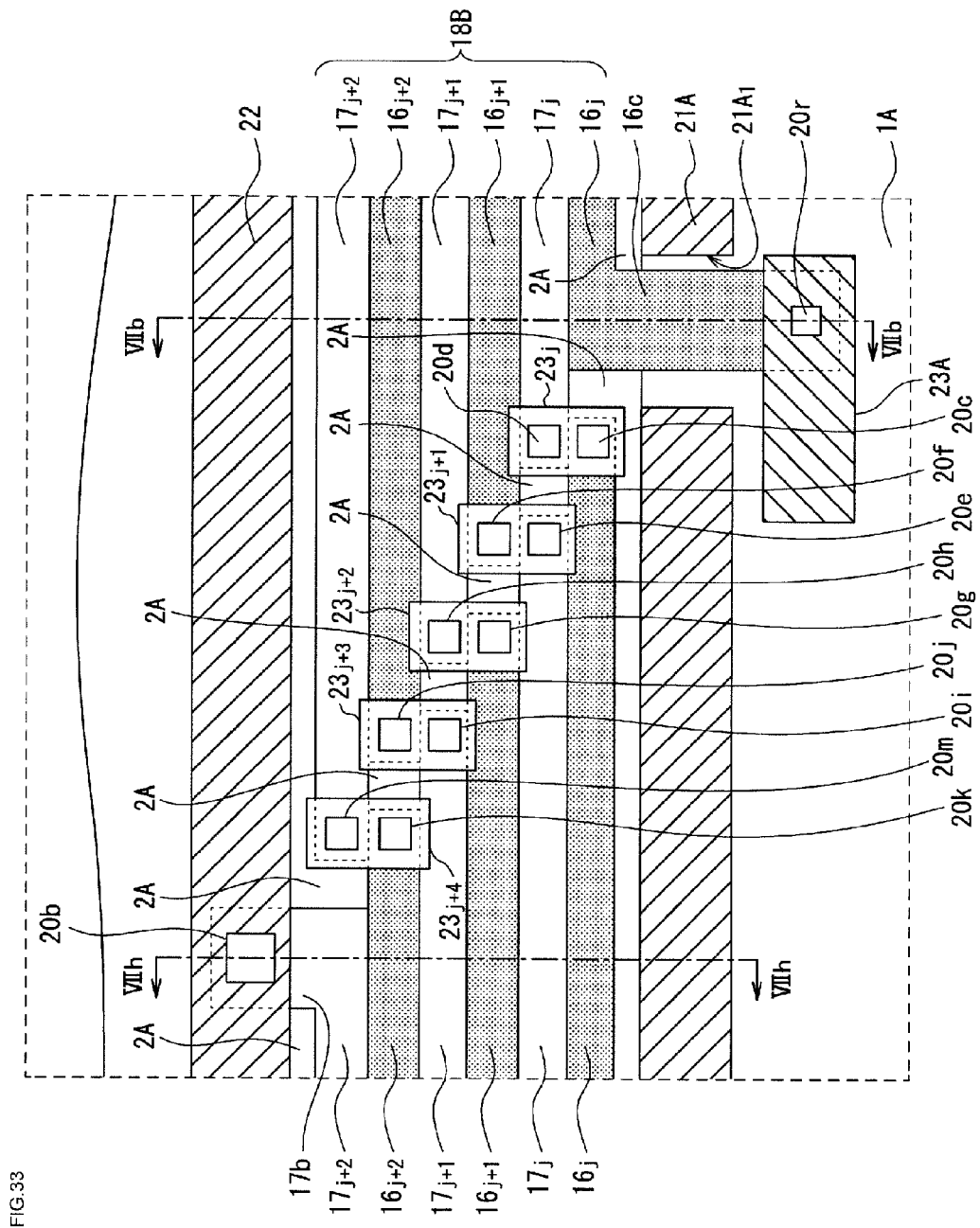
FIG. 33 is an enlarged plan view wherein the region enclosed by dotted lines in FIG. 32 is enlarged.

As shown in FIGS. 32 through 34, the resistive element 18B, which is a resistive field plate, is disposed in the projection region 1B on the upper surface side of the semiconductor base 1. Although the resistive element 18B is basically of the same configuration as the resistive element 18, the configuration of the one end side of the thin film resistance layer $16_j$ of the first loop differs. That is, as shown in FIGS. 33 and 36, the drawn-out portion 16c drawn out from the first loop path to the circuit formation region 1A side is provided so as to cross the cutaway portion $21A_1$ of the first main electrode terminal 21A on the one end side of the thin film resistance layer $16_j$ of the first loop. As shown in FIG. 36, one portion of a wire 23A is electrically and metallurgically connected to the contact portion of the drawn-out portion 16c through a contact hole 20r penetrating the interlayer dielectric 20. The wire 23A is formed in the same layer as, for example, the first main electrode terminal 21A, and is covered by a protective film 24. As configurations other than this are the same as in the resistive element 18, as shown in FIGS. 32 through 37, a description thereof will be omitted here.

As shown in FIG. 34, the high breakdown voltage MOSFET 26 is configured in an upper portion of the semiconductor base 1. The high breakdown voltage MOSFET 26 mainly has the $n^-$-type drift region 2A, the p-type channel formation region 5, the gate insulating film 8, the gate electrode 9, the $n^+$-type first main electrode region 11 acting as a drain region, the $n^+$-type second main electrode region 12 acting as a source region, and the p-type pick-up region 13. As is clear from FIG. 34, the drift region 2A is provided in an upper portion of the semiconductor base 1 so as to oppose the resistive element 18 in the projection region 1B. The first main electrode region 11 is disposed in an upper portion of the n-type well region 3, while the second main electrode region 12 and pick-up region 13 are disposed in an upper portion of the p-type channel formation region 5.

Figure 35:
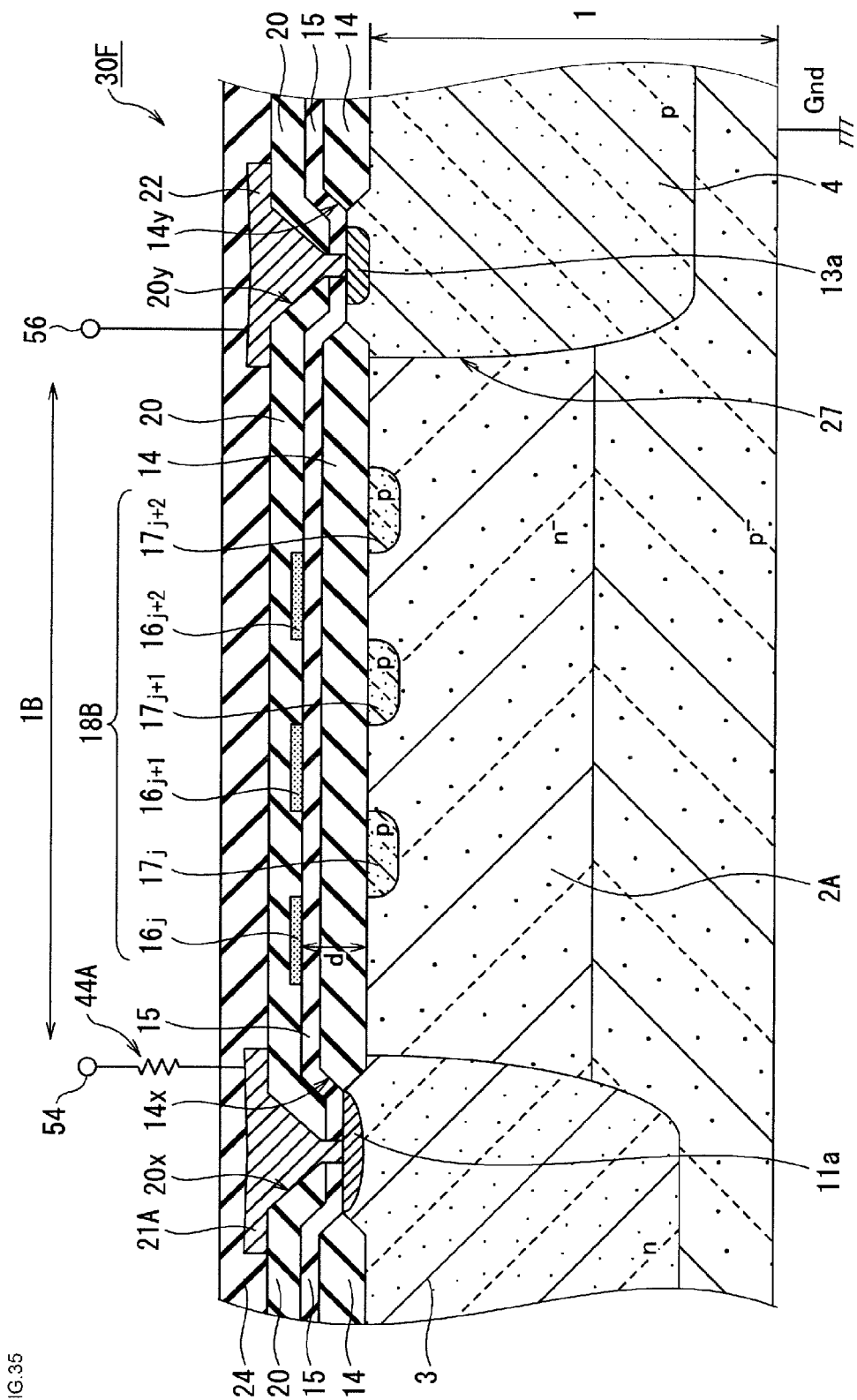
FIG. 35 is a main portion sectional view showing a sectional structure along a VIIaa-VIIaa line of FIG. 32.
Figure 36:
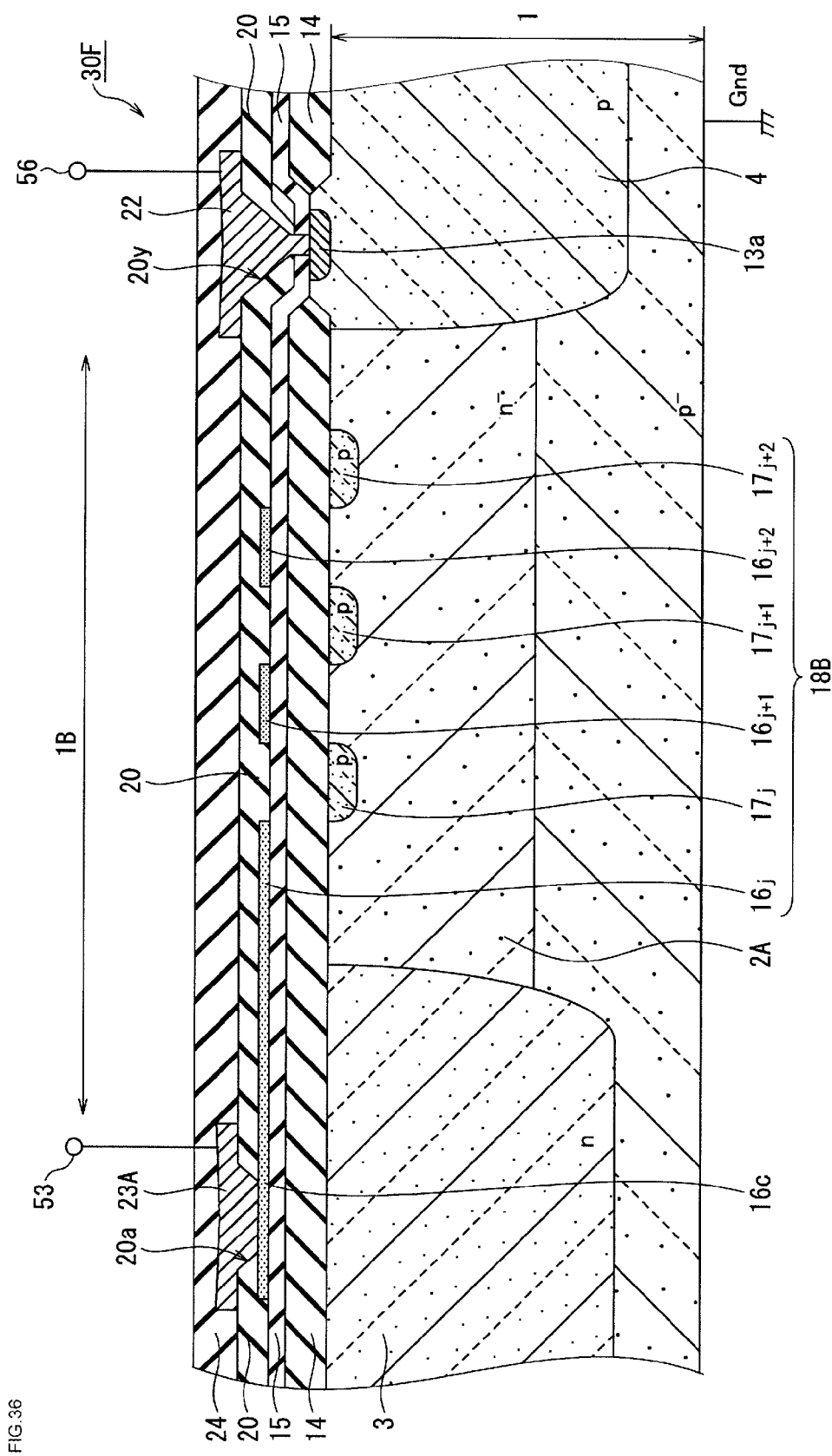
FIG. 36 is a main portion sectional view showing a sectional structure along a VIIb-VIIb line of FIG. 33.

As shown in FIG. 35, the high breakdown voltage diode 27 is configured in an upper portion of the semiconductor base 1. The high breakdown voltage diode 27 mainly has the $n^-$-type drift region 2A, the $n^+$-type first main electrode region 11a acting as a cathode region, and the $p^+$-type second main electrode region 13a acting as an anode region. The first main electrode region 11a is provided in an upper portion of the n-type well region 3, while the second main electrode region 13a is provided in an upper portion of the p-type well region 4.

As shown in FIG. 32, the high breakdown voltage MOSFET 26 is selectively configured in the interior of a region 10 enclosed by the dashed-dotted line when seen from a direction perpendicular to the upper surface of the semiconductor base 1. Further, the high breakdown voltage diode 27 is configured in a ring-form planar pattern that loops around the circuit formation region 1A excepting the region 10. That is, the semiconductor device 30F according to the sixth embodiment includes two high breakdown voltage active elements, those being the high breakdown voltage MOSFET 26 and high breakdown voltage diode 27, in a high breakdown voltage isolation region enclosing the circuit formation region 1A.

The high side drive circuit 43 is configured in the interior of the circuit formation region 1A enclosed by the high breakdown voltage element formation regions. Also, the control circuit 41 is configured in a peripheral region on the outer side of the high breakdown voltage element formation regions on the semiconductor base 1.

As shown in FIGS. 34 and 35, the second main electrode region 12, pick-up region 13, and second main electrode region 13a are electrically connected to the second main electrode terminal 22. Further, the second main electrode terminal 22 is electrically connected to the GND terminal 56, as is clear from FIG. 31. Also, although not shown, the second main electrode region 12 is electrically connected to the semiconductor base 1. Consequently, the second main electrode region 12 and drift region 2A of the high breakdown voltage MOSFET 26, the second main electrode region 13a and drift region 2A of the high breakdown voltage diode 27, and the semiconductor base 1, are electrically connected to the GND terminal 56 to which the GND potential is applied.

As shown in FIGS. 34 and 35, each of the first main electrode region 11 and first main electrode region 11a is electrically connected to the first main electrode terminal 21A. Further, the first main electrode terminal 21A is electrically connected via the level shift resistor 44A to the VB terminal 54, as is clear from FIG. 31. Consequently, each of the first main electrode region 11 of the high breakdown voltage MOSFET 26 and the first main electrode region 11a of the high breakdown voltage diode 27 is electrically connected via the level shift resistor 44A to the VB terminal 54, acting as the first terminal, to which is applied the VB potential as the first potential differing from the GND potential.

Figure 37:
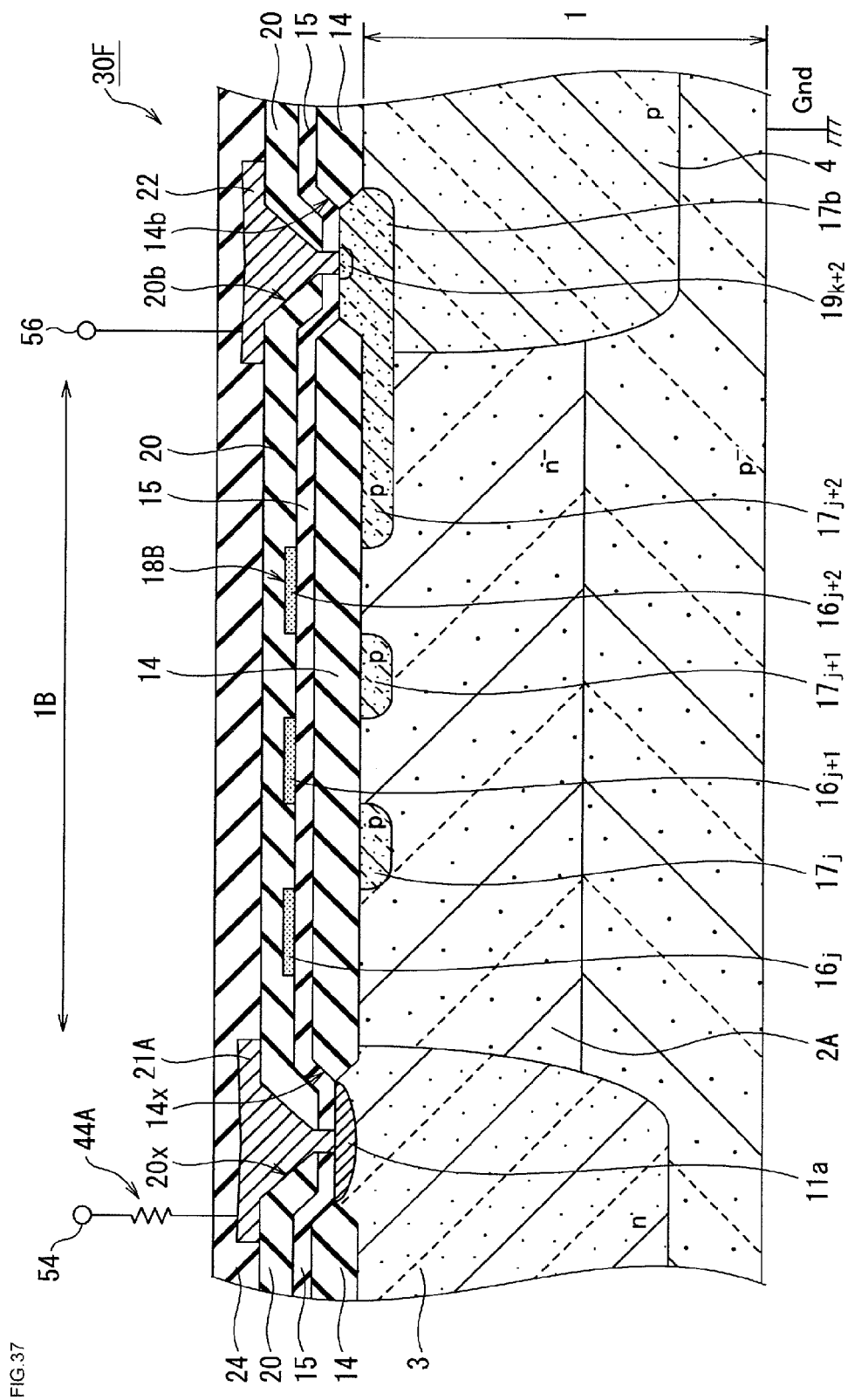
FIG. 37 is a main portion sectional view showing a sectional structure along a VIIh-VIIh line of FIG. 33.

As shown in FIG. 36, the wire 23A is electrically connected to the one end side of the resistive element 18B. Also, as shown in FIG. 37, the second main electrode terminal 22 is electrically connected to the other end side of the resistive element 18B. Consequently, the one end side of the resistive element 18B is electrically connected to the VS terminal 53, acting as the second terminal, to which is applied the VS potential as the second potential differing from the GND potential and VB potential. Also, the other end side of the resistive element 18B is electrically connected to the GND terminal 56.

As shown in FIGS. 31 through 35, the semiconductor device 30F according to the sixth embodiment includes the resistive element 18B wherein the diffusion resistance regions $17_j$, $17_{j+1}$, and $17_{j+2}$ provided in an upper portion of the semiconductor base 1, and the thin film resistance layers $16_j$, $16_{j+1}$, and $16_{j+2}$ isolated and distanced from the semiconductor base 1 and diffusion resistance regions $17_j$, $17_{j+1}$, and $17_{j+2}$ across the field insulating film 14 and interlayer dielectric 15 acting as insulating films, are alternately connected in series and alternately disposed in parallel. Consequently, the semiconductor device 30F according to the sixth embodiment too, in the same way as the semiconductor devices 30A, 30B, 30C, 30D, and 30E according to the first through fifth embodiments, is such that an increase in the resistance of the resistive element 18B can be achieved while restricting an increase in the size of the semiconductor device 30F itself.

The semiconductor device 30F according to the sixth embodiment is such that when a high potential is applied between the first main electrode terminal 21A and second main electrode terminal 22, leakage current flows into the resistive element 18B, which is a resistive field plate, even when on standby. However, the semiconductor device 30F according to the sixth embodiment too, in the same way as the semiconductor devices according to the first through fifth embodiments, is such that an increase in the resistance of the resistive element 18B can be achieved, because of which a reduction in power consumption when on standby can be achieved while restricting an increase in the size of the semiconductor device 30F itself.

Figure 38:
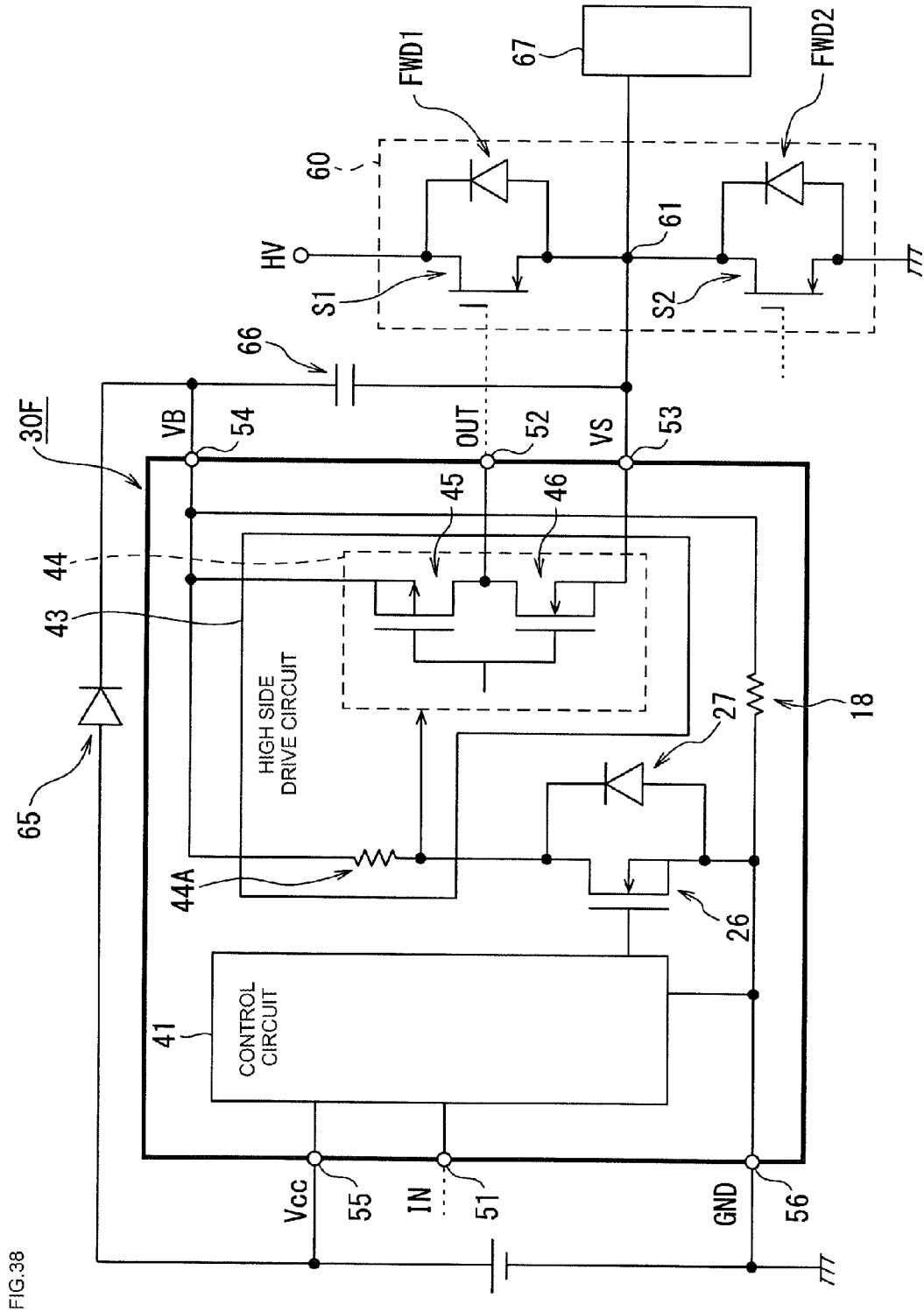
FIG. 38 is a circuit diagram showing a modification example of the semiconductor device according to the sixth embodiment of the disclosure.
Figure 39:
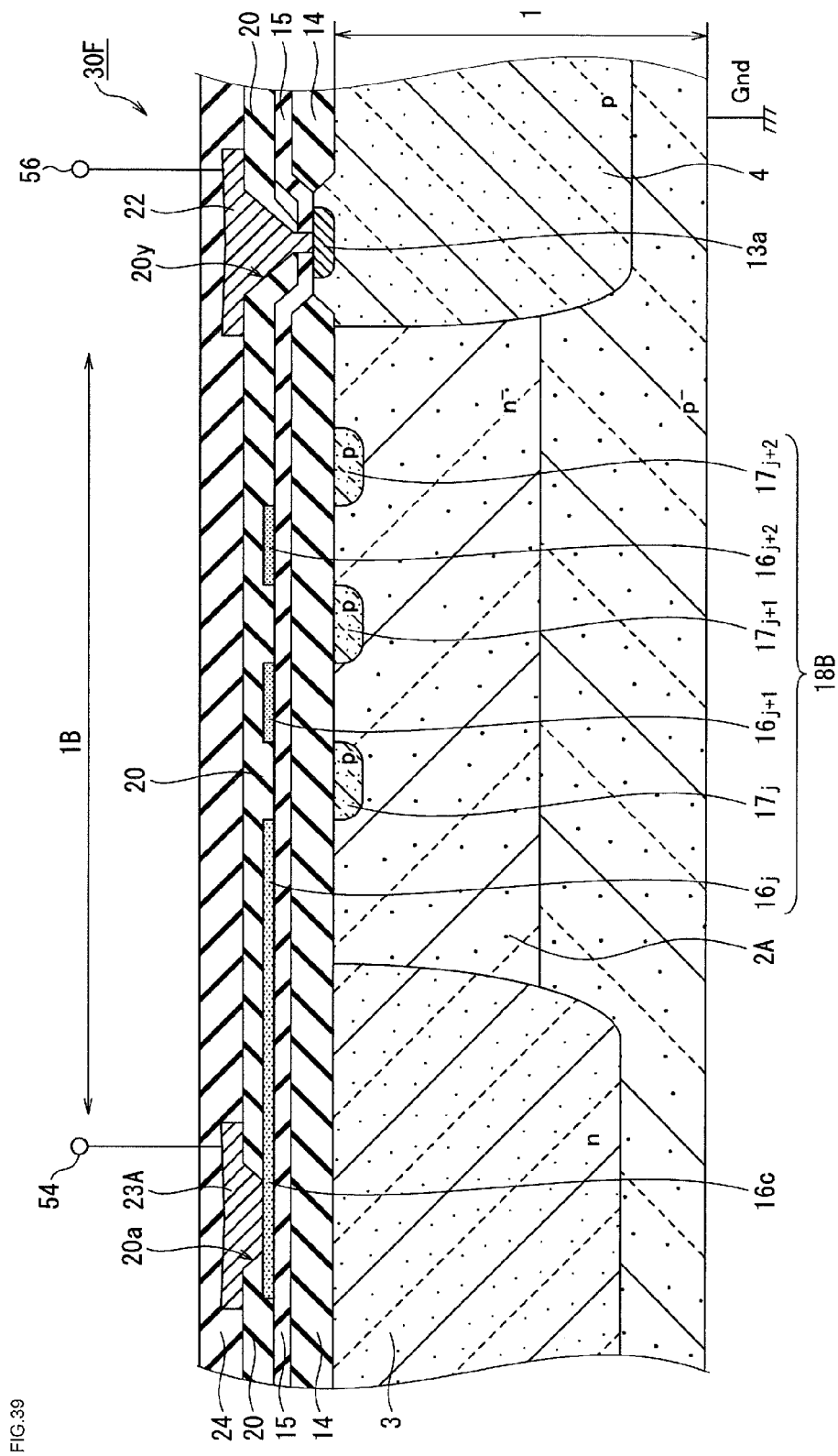
FIG. 39 is a main portion plan view showing a modification example of the semiconductor device according to the sixth embodiment of the disclosure.

For the semiconductor device 30F according to the sixth embodiment, a description has been given of a case in which the one end side of the resistive element 18B is electrically connected to the VS terminal 53, but the one end side of the resistive element 18B may be electrically connected to the VB terminal 54, as is clear from FIGS. 38 and 39. In this case too, the same advantages as with the semiconductor device 30F according to the sixth embodiment are obtained.

Heretofore, a specific description of the disclosure has been given based on the embodiments but, the disclosure not being limited to the embodiments, various changes are of course possible without departing from the scope of the invention.

For example, a description has been given of a case in which the semiconductor device 30F according to the sixth embodiment includes the resistive element 18B wherein the thin film resistance layers $16_j$, $16_{j+1}$, and $16_{j+2}$ are provided above the upper surface of the semiconductor base 1 but, the disclosure not being limited to this, the semiconductor device 30F may include the resistive element 18A wherein the thin film resistance layers $16_j$, $16_{j+1}$, and $16_{j+2}$ are provided in the interior of the groove 31 of the semiconductor base 1, as in the semiconductor devices according to the fourth and fifth embodiments.

Also, for the semiconductor devices according to the first through sixth embodiments, a description has been given of a case in which a semiconductor substrate formed of polycrystalline silicon is used as the semiconductor base 1 but, the disclosure not being limited to this, the disclosure is also applicable to a semiconductor device in which is used, for example, a semiconductor substrate of silicon carbide (SiC), gallium nitride (GaN), or the like, a semiconductor base wherein an epitaxial layer is provided on a semiconductor substrate, or a semiconductor base of a so-called SOI structure wherein a semiconductor layer is provided across an insulating layer on a semiconductor substrate.

Also, for the semiconductor devices according to the first through sixth embodiments, a description has been given of a case in which polycrystalline silicon is used as the thin film resistance layers $16_j$, $16_{j+1}$, and $16_{j+2}$ but, the disclosure not being limited to this, the disclosure is also applicable to a semiconductor device in which, for example, an amorphous film is used.

As heretofore described, the semiconductor device according to the disclosure is such that an increase in the resistance of the resistive element can be achieved while restricting an increase in the size of the semiconductor device, which is useful in a semiconductor device such as a high voltage integrated circuit that drives a switching element.

What is claimed is:

1. A semiconductor device comprising:
   a semiconductor base;
   an insulating film; and
   a resistive element having diffusion resistance regions and thin film resistance layers alternately electrically connected in series and alternately disposed in parallel,
   the thin film resistance layers being provided in an upper portion of the semiconductor base, isolated from both the semiconductor base and the diffusion resistance regions by the insulating film, and distanced from both the semiconductor base and the diffusion resistance regions across the insulating film, and
   the resistive element having a spiral plan-view shape.

2. The semiconductor device according to claim 1, wherein
   the resistive element comprises relay wires, and
   the thin film resistance layers and the diffusion resistance regions are electrically connected in series via the relay wires to form a connection path that spirals around a central region of the semiconductor device.

3. The semiconductor device according to claim 2, wherein
   the thin film resistance layers and the diffusion resistance regions are respectively formed as a plurality of respective loops,
   in a plan view of the semiconductor device, the plurality of respective loops are disposed around the central region and, along a direction outward from the central region, successively alternate between a loop of the thin resistance layers and a loop of the diffusion resistance regions, and
   the relay wires respectively electrically connect between successive loops of the plurality of respective loops to form the connection path so that the connection path successively passes through successive loops of the plurality of respective loops to thereby spiral around the central region.

4. The semiconductor device according to claim 3, wherein the insulating film is above an upper surface of the semiconductor base.

5. The semiconductor device according to claim 3, wherein the semiconductor base has a groove in the upper surface thereof, and the insulating film is disposed in an interior of the groove.

6. The semiconductor device according to claim 4, further comprising:
   a well region provided in the upper portion of the semiconductor base and having a conductivity type opposite to that of the diffusion resistance region,
   wherein the diffusion resistance region is provided in an interior of the well region.

7. The semiconductor device according to claim 5, further comprising:
   a well region provided in the upper portion of the semiconductor base and having a conductivity type opposite to that of the diffusion resistance region,
   wherein the diffusion resistance region is provided in an interior of the well region.

8. The semiconductor device according to claim 4, further comprising:
   an active element having
      a first main electrode region provided in an upper portion of the semiconductor base,
      a second main electrode region provided in an upper portion of the semiconductor base, and
      a drift region provided in an upper portion of the semiconductor base so as to oppose the resistive element, the drift region being of a conductivity type opposite to that of the diffusion resistance region,
   wherein the diffusion resistance region is provided in an interior of the drift region.

9. The semiconductor device according to claim 5, further comprising:
   an active element having
      a first main electrode region provided in an upper portion of the semiconductor base,
      a second main electrode region provided in an upper portion of the semiconductor base, and
      a drift region provided in an upper portion of the semiconductor base so as to oppose the resistive element, the drift region being of a conductivity type opposite to that of the diffusion resistance region,
   wherein the diffusion resistance region is provided in an interior of the drift region.

10. The semiconductor device according to claim 8, further comprising:
    a gate insulating film provided above the upper surface of the semiconductor base, on an outer side of the resistive element, and between the first main electrode region and the second main electrode region,
    wherein the active element further has a control electrode provided with the gate insulating film between the control electrode and the upper surface of the semiconductor base.

11. The semiconductor device according to claim 9, further comprising:
    a gate insulating film provided above the upper surface of the semiconductor base, on an outer side of the resistive element, and between the first main electrode region and the second main electrode region, wherein the active element further has a control electrode provided with the gate insulating film between the control electrode and the upper surface of the semiconductor base.

12. The semiconductor device according to claim 6, further comprising
    a first main electrode terminal provided above the upper surface of the semiconductor base; and
    a second main electrode terminal distanced from the first main electrode terminal and, in the plan view of the semiconductor device, enclosing around the first main electrode terminal above the upper surface, wherein
    in a plan view of the semiconductor device, the resistive element is enclosing around the first main electrode terminal.

13. The semiconductor device according to claim 7, further comprising
    a first main electrode terminal provided above the upper surface of the semiconductor base; and
    a second main electrode terminal distanced from the first main electrode terminal and, in the plan view of the semiconductor device, enclosing around the first main electrode terminal above the upper surface, wherein
    in the plan view of the semiconductor device, the resistive element is enclosing around the first main electrode terminal.

14. The semiconductor device according to claim 8, further comprising
    a first main electrode terminal provided above the upper surface of the semiconductor base; and
    a second main electrode terminal distanced from the first main electrode terminal and, in a plan view of the semiconductor device, enclosing around the first main electrode terminal above the upper surface, wherein
    in a plan view of the semiconductor device, the resistive element is enclosing around the first main electrode terminal.

15. The semiconductor device according to claim 9, further comprising
    a first main electrode terminal provided above the upper surface of the semiconductor base; and
    a second main electrode terminal distanced from the first main electrode terminal and, in a plan view of the semiconductor device, enclosing around the first main electrode terminal above the upper surface, wherein
    in a plan view of the semiconductor device, the resistive element is enclosing around the first main electrode terminal.

16. The semiconductor device according to claim 12, wherein
    a first end side of the resistive element is connected to the first main electrode terminal, and
    a second end side of the resistive element is connected to the second main electrode terminal.

17. The semiconductor device according to claim 8, further comprising:
    a ground terminal to receive a reference potential;
    a first terminal, connected across a level shift resistor to the first main electrode region, to receive a first potential differing from the reference potential; and
    a second terminal to receive a second potential differing from the reference potential and first potential, wherein
    a first end side of the resistive element is connected to the second terminal, and
    a second end side of the resistive element and the second main electrode region are connected to the ground terminal.

18. The semiconductor device according to claim 9, further comprising:
    a ground terminal to receive a reference potential;
    a first terminal, connected across a level shift resistor to the first main electrode region, to receive a first potential differing from the reference potential; and
    a second terminal to receive a second potential differing from the reference potential and first potential, wherein
    a first end side of the resistive element is connected to the second terminal, and
    a second end side of the resistive element and the second main electrode region are connected to the ground terminal.

19. The semiconductor device according to claim 8, further comprising:
    a ground terminal to receive a reference potential;
    a first terminal, connected across a level shift resistor to the first main electrode region, to receive a first potential differing from the reference potential; and
    a second terminal to receive a second potential differing from the reference potential and first potential, wherein
    a first end side of the resistive element is connected to the first terminal, and
    a second end side of the resistive element and the second main electrode region are connected to the ground terminal.

20. The semiconductor device according to claim 1, further comprising:
    a first main electrode terminal provided on an upper surface of the semiconductor base,
    wherein in a plan view of the semiconductor device, the resistive element is enclosing around the first main electrode terminal.

21. The semiconductor device according to claim 20, wherein
    the resistive element comprises relay wires, and
    the thin film resistance layers and the diffusion resistance regions are electrically connected in series via the relay wires to form a connection path that spirals around the first main electrode terminal.

* * * * *